United States Patent [19]

Russell et al.

[11] Patent Number: 5,519,628
[45] Date of Patent: May 21, 1996

[54] SYSTEM AND METHOD FOR FORMULATING SUBSETS OF A HIERARCHICAL CIRCUIT DESIGN

[75] Inventors: Philip J. Russell, Alresford, United Kingdom; Glenwood S. Weinert, San Jose, Calif.

[73] Assignee: International Business Machines Corporation, Armonk, N.Y.

[21] Appl. No.: 19,927

[22] Filed: Feb. 19, 1993

[51] Int. Cl.$^6$ .................................................. G06F 17/50
[52] U.S. Cl. .......................... 364/489; 364/490; 364/491; 364/488
[58] Field of Search ................................. 364/488, 489, 364/490, 491, 578; 395/600, 700; 371/22.1, 23, 29.1

[56] References Cited

U.S. PATENT DOCUMENTS

| | | | |
|---|---|---|---|
| 4,815,003 | 3/1989 | Putatunda et al. | 364/491 |
| 5,050,091 | 9/1991 | Rubin | 364/488 |
| 5,175,696 | 12/1992 | Hooper et al. | 364/489 |
| 5,247,666 | 9/1993 | Buckwold | 395/600 |
| 5,267,175 | 11/1993 | Hooper | 364/489 |
| 5,349,659 | 9/1994 | Do et al. | 395/700 |
| 5,357,440 | 10/1994 | Talbott et al. | 364/467 |

OTHER PUBLICATIONS

Sinhai et al., "A Data Model and Architecture for VLSI/CAD Databases", Computer–Aided Design, 1989 International Con., 1989, pp. 276–279.

Foo et al., "Databases and Cell–Selection Algorithms for VLSI Cell Libraries", Computer Magazine, vol. 23, issue 2, Feb. 1990, pp. 18–30.

Chowdhurry et al., "Hierarchical Layout Synthesis of Analogue VLSI Circuits Using an Intelligent Parsing Mechanism", Proceedings of the 34th Midwest Symposium on Circuits and Systems, vol. 2, 14–17 May 1991, pp. 835–888.

N. Hedenstierna et al., "The Use Of Inverse Layout Trees For Hierarchical Design Rule Checking", Design Automation Conference, 1989, Paper 32.2, pp. 508–512.

C. K. Nandy et al., "Linear Time Geometrical Design Rule Checker Based on Quadtree Representation Of VLSI Mask Layouts", Computer–Aided Design, vol. 18, No. 7, Sep. 1986, pp. 380–388.

C. Niessen, "Hierarchical Design Methodologies And Tools For VLSI Chips", Proceedings Of the IEEE, vol. 71, No. 1, Jan. 1983, pp. 66–75.

T. Whitney, "A Hierarchical Design–Rule Checking Algorithm", LAMBDA, First Quarter 1981, pp. 40–43.

Primary Examiner—Kevin J. Teska
Assistant Examiner—Stephen J. Walder, Jr.
Attorney, Agent, or Firm—Whitham, Curtis, Whitham & McGinn; Leslie G. Murray

[57] ABSTRACT

A computer-based system and method is provided for building subsets of a hierarchical circuit design. A VLSI circuit design component is stored in computer memory. The design component identifies a leaf design entity in the hierarchical circuit design. A set of placements is determined representing positions in the hierarchical circuit design where the VLSI circuit design component appears. The placements form a subset of instances of the leaf design entity. A set of links is created. The links are associated in memory with both the VLSI circuit design component and the placements, and connect various ones of the placements to one another to further denote placement of the VLSI circuit design component within the hierarchical circuit design. A subset list is appended to the VLSI circuit design component in computer memory. The subset list denotes the previously-determined subset and includes placements where the VLSI circuit design component is identified in the hierarchical circuit design. The identified placements may indicate exclusion of a particular instance of a design component from the hierarchical circuit design, or inclusion of a particular instance.

17 Claims, 56 Drawing Sheets c'———1B———2D <Intrudes> m'———3D

The following written convention is used to communicate this:

c'———1B———2D
          \
           m'———3D            401

Contact    is level("CA",text("Contact level"));

Metal1    is level("M1",text("Metal 1 level"));

Check DRa, print("string");

1410

DRa is ! Hits(W,Metal) suchthat C;

W is Contact suchthat B;

| Check | Base Level | LISA(Lev1, lev2, Region-of-interest) |
|---|---|---|
| DRa | Contact | LISA(Contact, Diffusion, 0) |
| | | LISA(Contact, Diffusion, 2) |
| DRb | Contact | LISA(Contact, Diffusion, 0) |
| | | LISA(Contact, Metal, 2) |
| DRc | Contact | LISA(Contact, Metal, 1) |

FIG. 28

| LISA Name | LISA(Lev1, lev2, Region-of-Interest) | Dispatched Checks |
|---|---|---|
| LISA1 | LISA(Contact, Diffusion, 0) | DRa, DRb |
| LISA2 | LISA(Contact, Diffusion, 2) | DRa |
| LISA3 | LISA(Contact, Metal, 1) | DRc |
| LISA4 | LISA(Contact, Metal, 2) | DRb |

FIG. 29

| Intrusion # | Level 1, Level 2, Range-of-Interest |
|---|---|
| 1 | (Contact, Diffusion, 2)  // The max of 0 and 2 |
| 2 | (Contact, Metal, 2)     // The max of 1 and 2 |

These intrusions would form LISA1

3320

```
< 8,10>  c'——1B——2C ← m'—3C  (0)
< 9, 6>  c'——1B——2C——1D ←—m"—6D  (0)         3510
<11, 8>  c'——1B——2C——3D ←—m"—6D
```

These intrusions would form the LISA3.

3520

```
< 3, 5>  c'———1B———1C  ←—d'''—4C (2)
< 2,11>  c'———1B  ←—d'—3B (0)
< 9, 6>  c'———1B———2C———1D  ←—d"—5D (0)
<10, 7>  c'———1B———2C———2D  ←—d"—5D (0)
```
3410

These intrusions would form LISA2.

3420

```
< 8,10>  c'-----1B-----2C  <-- m'---3C (0)
< 9, 6>  c'-----1B-----2C-----1D <--m"--6D (0)         3610
<11, 8>  c'-----1B-----2C-----3D <--m"--6D (0)
```

These intrusions would form the LISA4 which has the same structure as LISA3.

3620

```
< 3, 5>  c'-----1B-----1C  <-- d'''---4C (2)
< 2,11>  c'-----1B <--d'----3B (0)
< 9, 6>  c'-----1B-----2C-----1D <--d"--5D (0)
<10, 7>  c'-----1B-----2C-----2D <--d"--5D (0)       3710
< 8,10>  c'-----1B-----2C <-- m'---3C (0)
< 9, 6>  c'-----1B-----2C-----1D <--m"--6D (0)
<11, 8>  c'-----1B-----2C-----3D <--m"--6D (0)
```

These intrusion pairs define the humungous LISA for LISA1-4

|  | LISA1 | PO Box< 6> |
|---|---|---|
| ( 1, 1) | 1D | ← m''----6D |
| ( 0, 4) | 2C | |
| ( 0, 8) | 1B | |
| (15,16) | c' | |

| LISA1 PO Box<11> | | | | LISA2 PO Box< 5> | | | | LISA3 PO Box<23> | | | | LISA4 PO Box<23> | | | |
|---|---|---|---|---|---|---|---|---|---|---|---|---|---|---|---|
| (0, 0) | | | | (0, 0) | | | | (0, 0) | | | | | | | |
| (0, 0) | | | | (4, 4) | | 1C | ← d'''—4C | (0, 0) | | | | | | | |
| (8, 8) | | 1B | ← d'—3B | (4, 8) | | 1B | ← d''—3B | (0, 0) | | | | | | | |
| (8,16) | | c' | | (8,16) | | c' | | (16,16) | | c' | | (16,16) | | c' | |

FIG. 43

| LISA1 PO Box<11> | | | | LISA2 PO Box<11> | | | | LISA3 PO Box<23> | | | | LISA4 PO Box<23> | | | |
|---|---|---|---|---|---|---|---|---|---|---|---|---|---|---|---|
| (0, 0) | | | | (0, 0) | | | | (0, 0) | | | | | | | |
| (0, 0) | | | | (4, 4) | | | | (0, 0) | | | | | | | |
| (8, 8) | | 1B | ← d'—3B | (4, 8) | | 1B | ← d'—3B | (0, 0) | | | | | | | |
| (8,16) | | c' | | (8,16) | | c' | | (16,16) | | c' | | (16,16) | | c' | |

Shape-to-Net

```
shape        net
--------+--------
a'----1A    net1.A
c'----2A    net1.A
-----------------
```

Net-table

```
net number    contains
------------+------------
net1.A         a'---1A
               c'---2A
```

Nested representation of nets net1.A $^{(2,2)}$

*FIG. 66*

Shape c'----2A is already in net1.A and shape b'----3A is not in the table yet. Thus add shape b'----3A to net1.A.

Shape-to-Net

```
shape     net
------+--------
a'----1A  net1.A
b'----3A  net1.A
c'----2A  net1.A
---------------
```

Net-table

```
net number       contains
-------------+-------------
net1.A           a'---1A
                 b'---3A
                 c'---2A
```

Nested representation of nets net1.A $^{(2,2)}$

*FIG. 67*

Shape-to-Net

```
shape        net
---------+---------
a'——1A    net1.A
b'——3A    net1.A
c'——2A    net1.A
d'——3B    net2.B
-------------------
```

Net-table

```
net number        contains
-------------+---------------
net1.A            a'——1A
                  b'——3A
                  c'——2A
-------------+---------------
net2.B            d'——3B
                  net1.A ——1B
```

Nested representation of nets net1.A$^{(1,2)}$--------1B$^{(1,1)}$
                              net2 net2.B$^{(1,1)}$

*FIG. 68*

Shape-to-Net

```
shape         net
---------+---------
a'----1A    net1.A
b'----3A    net1.A
c'----2A    net1.A
d'----3B    net2.B
-----------------
```

Net-table

```
net number         contains
--------------+---------------
net1.A              a'----1A
                    b'----3A
                    c'----2A
--------------+---------------
net2.B              d'----3B
               net1.A----1B
               net1.A----2B
```

Nested representation of nets net1.A$^{(0,2)}$------1B$^{(1,1)}$
                      | net2

| $^{(1,1)}$
                2B
                   net2 net2.B$^{(1,1)}$

*FIG. 69* net2.B   contains   d'----3B
                    net1.A----1B
                    net2.A----2B Walking and expanding net2.B yields the following components:

(read "⟹" as "composed of")

d'----3B net1.A----1B   ⟹   a'----1A----1B
                   b'----3A----1B
                   c'----2A----1B net1.A----2B   ⟹   a'----1A----2B
                   b'----3A----2B
                   c'----2A----2B

Shape-to-Net

| shape | net |
|---|---|
| a'—1A | net1.A |
| c'—2A | net2.A(Br) |

Net-table

| net number | contains |
|---|---|
| net1.A | a'---1A |
|  | net2.A(Br) |

Bridge-Net-table

| net number | contains | connects |
|---|---|---|
| net2.A(Br) | c'---2A | net1.A |

Nested representation of nets net1.A $^{(2,2)}$

*FIG. 74*

Shape-to-Net

```
shape      net
--------+--------
a'——1A    net1.A
c'——2A    net2.A(Br)
b'——3A    net3.A
-----------------
```

Net-table

| net number | contains |
|---|---|
| net1.A | a'---1A <br> net2.A(Br) |
| net3.A | b'---3A <br> net2.A(Br) |

Bridge-Net-table

| net number | contains | connects |
|---|---|---|
| net2.A(Br) | c'---2A | net1.A <br> net3.A |

Nested representation of nets net1.A $^{(2,2)}$ net3.A $^{(2,2)}$

*FIG. 75*

Shape-to-Net

```
shape      net
--------+-----------
a'---1A    net1.A
c'---2A    net2.A(Br)
b'---3A    net3.A
d'---3B    net4.B
--------------------
```

Net-table

```
net number      contains
-------------|-------------
net1.A           a'---1A
                 net2.A(Br)
-------------|-------------
net3.A           b'---3A
                 net2.A(Br)
-------------|-------------
net4.B           d'---3B
                 net3.A---1B
```

Bridge-Net-table

```
net number      contains       connects
-------------|-------------|-------------
net2.A(Br)      c'---2A       net1.A
                              net3.A
```

Nested representation of nets net1.A $^{(2,2)}$ net3.A$^{(1,2)}$--------1B$^{(1,1)}$ net4.B $^{(1,1)}$

FIG. 76

Shape-to-Net

```
shape        net
--------+--------
a'---1A     net1.A
c'---2A     net2.A(Br)
b'---3A     net3.A
d'---3B     net4.B
------------------
```

Net-table

```
net number         contains
--------------|--------------
net1.A              a'---1A
                    net2.A(Br)
--------------|--------------
net3.A              b'---3A
                    net2.A(Br)
--------------|--------------
net4.B              d'---3B
                    net3.A---1B
                    net3.A---2B
```

Bridge-Net-table

```
net number       contains       connects
--------------|--------------|--------------
net2.A(Br)       c'---2A        net1.A
                                net3.A
```

Nested representation of nets net1.A $^{(2,2)}$ net3.A$^{(0,2)}$--------1B$^{(1,1)}$
　　　　　　　　　　　　 ┆ net4
　　　　　　　　　　　　 ┆
　　　　　　　　　　　　 ┆$^{(1,1)}$
　　　　　　　　　　　　2B
　　　　　　　　　　　　 net4 net4.B $^{(1,1)}$

FIG. 77 net4.B contains

```
            d.3B
   net3.A---1B
   net3.A---2B
```

Walking and expanding net 4.B yields the following components:

(read "⟹" as "composed of")

1. d'---3B 2. net3.A---1B ⟹

```
    b'---3A---1B
    net2.A(Br)---1B ⟹ c'---2A---1B
                        net1.A-----1B ⟹ a'---1A---1B
                                          net2.A(Br)---1B ◀— done
                        net3.A-----1B ◀--- done
```

3. net3.A---2B ⟹

```
    b'---3A---2B
    net2.A(Br)---2B  ◀--- deleted, done
```

Thus final shapes in net4.B are:

SYSTEM AND METHOD FOR FORMULATING SUBSETS OF A HIERARCHICAL CIRCUIT DESIGN

CROSS REFERENCE TO RELATED APPLICATIONS

The present application is related to the following co-pending patent applications:

1. Ser. No. 08/019,971 filed Feb. 19, 1993, by Philip J. Russell et al. for System and Method for Verifying a Hierarchical Circuit Design
2. Ser. No. 08/019,970 filed Feb. 19, 1993, by Young O. Kim et al. for System and Method for Building Interconnections in a Hierarchical Circuit Design
3. Ser. No. 08/019,924 filed Feb. 19, 1993, by Phillip J. Russell et al. for Application Generator for use in Verifying a Hierarchical Circuit Design These co-pending applications and the present application are owned by the same assignee, International Business Machines Corporation.

FIELD OF THE INVENTION

This invention relates in general to computer aided design and in particular to an integrated circuit design verification system which performs layout verification and mask data manipulation.

BACKGROUND OF THE INVENTION

All integrated circuits and their physical packaging are described by physical designs in the form of hierarchical 2-dimensional geometric models. The complexity of these designs quadruples approximately every 3 years. For example, a typical 16 Mega-bit memory physical design in 1989 was described by 150,000,000 geometric mask shapes on 71 design levels. A typical 64 Mega-bit memory physical design in 1992 is described by 600,000,000 geometric mask shapes on 127 levels. This increasing data volume is becoming a significant problem for engineering design automation, since it overstresses the software design tools which in turn impact the design cycle time, design cost and time to market.

Physical design data is analysed many times to verify that physical mask constraints are not exceeded, electrical performance is satisfactory, and the physical design implements the logical design intent. Such analysis is extremely detailed. For example, the checking of physical constraints requires that hundreds of specific physical ground rules are checked. Given the enormous number of geometric mask shapes, such analysis consumes thousands of mainframe CPU hours. Physical design verification is an important phase in the design cycle of an integrated circuit and is key to delivering first-pass working designs to a chip producer for fabrication. The high cost of integrated circuit fabrication plus the need to keep the design cycle time short for competitive reasons dictates the need for an efficient verification system that can be exercised many times throughout the physical design phase. It is therefore of importance to be able to analyse increasingly complex designs in a time efficient manner.

In the prior art, the standard approach to managing increasing design complexity has been to optimize the hierarchical design itself, but verify, or check the design in flattened form. According to this methodology, the design is sub-divided into arbitrary design partitions that can be analysed individually. However, each partition is ultimately analyzed as one monolithic circuit, that is as a flat design. This approach relies on the ability of the designer to generate a high level view of each design partition, which view can be used at the next higher level of the hierarchy to characterise the design partition without exposing its detailed internal data. For example, such hierarchical characterisation is typically used to define the wiring channels and connection ports that can be used to route wire over a design partition in the higher level cell.

The prior art design verification methodology surfers from several problems. The computation of the high level representation or the physical partitions can be a significant problem when the data volume in a partition is substantial. Unfortunately, the addition or these high level representation cells to the design increases the complexity still further. Moreover, any attempt to break the hierarchical design constraints using ad-hoc design fixes invalidates the integrity or the hierarchical partitioning and reduces the verification process to a completely flat analysis problem. Finally, the methodology constraints typically prevent the designer from fully exploiting the available density offered by the physical design technology.

Hierarchical design optimization helps to manage the problem of design complexity, but does nothing to correct the deficiencies in the shape manipulation algorithms of verification tools when these tools are subjected to increasing data volume. The primary reason for this is that mask data is ultimately analysed flat, i.e., all instances of mask shapes are transformed into the coordinate system of the root node of the design, whereas mask data is typically designed nested, i.e., the mask shapes are designed hierarchically and may be reused in the design many times. It is the flattening process that expands the data volume considerably and leads to over-stressing the tools.

Recent advances have been made in dealing with the problem of expanding data volume. These advances capitalize on the highly nested nature of hierarchical design data using a graphical technique known as an inverse layout tree (ILT). The inverse layout tree is a forest of trees each rooted at a leaf node of the layout tree. Thus, in a typical implementation a design mask shape would form the root of an inverse layout tree, while the leaves would represent flat layouts of the rooted mask shape. The use of the inverse layout tree has provided a means for manipulating instances of a mask shape at varying levels of nesting, from the most nested form to the most denested form. This enables the performance of design verification without any restriction on circuit overlap.

However, even with the advent of the inverse layout tree, several important problems remain unaddressed. One key problem involves efficient building of pruned inverse layout trees. The known techniques for building inverse layout trees use a Boolean variable at each node to indicate whether the node is to be included in the pruned tree. As a result, the full inverse layout tree must be built first in order to generate a pruned version. A second problem is pruning of inverse layout trees. The use of a Boolean variable at each node does not yield a maximally pruned inverse layout tree (ILT). As a result, the trees carry many unnecessary nodes. A third problem is reusabilty of pruned inverse layout trees. The Boolean variables at the ILT nodes do not retain the reason for the pruning. As a result, each ILT is specific to its particular check, and cannot be reused even in the event a subsequent check requires the exact same intrusion searches. A fourth problem is minimizing the number of checking computations. Existing algorithms do not provide a minimum computational model. Instead, nodes are simply re-checked multiple times and the required data is re-accumulated for each check, leading to a corresponding performance penalty. A fifth problem is expressing and handling new data applicable to only a portion of an existing circuit design. Using existing techniques, new data will typically cause flattening of the design, which in turn results in a significant, performance penalty during verification.

The present invention addresses these and other heretofore unresolved limitations in the field of circuit design verification.

SUMMARY OF THE INVENTION

In accordance with the invention, there is provided a computer-based system and method for building subsets of a hierarchical circuit design data. A very large scale integrated (VLSI) circuit design component is stored in computer memory. The design component identifies a leaf design entity in the hierarchical circuit design data. A set of placements is determined representing positions in the hierarchical circuit design data where the VLSI circuit design component appears. The placements form a subset of instances of the leaf design entity. A set of links is created. The links are associated in memory with both the VLSI circuit component and the placements, and connect various ones of the placements to one another to further denote placement of the VLSI circuit design component within the hierarchical circuit design data. A subset list is appended to the VLSI circuit design data component in computer memory. The subset list denotes the previously-determined subset and includes placements where the VLSI circuit design component is identified in the hierarchical circuit design. The identified placements may indicate exclusion of a particular instance of a design component from the hierarchical circuit design data, or inclusion of a particular instance.

In the preferred embodiment, the subset list itself is stored in the form of a pruned graph. The pruned graph includes leaf nodes and internal nodes. Each node has an instance count associated with it, generally indicating the positions in the pruned graph of design components like the one represented by the node. An separate instance count is computed to denote the number of instances of the VLSI circuit design component represented in the subset list. This instance count is appended to the subset list.

In cases where it is desirable to work with the complement of a subset list rather than the list itself, the complement is computed, thereby generating a second subset list which identifies instances not in the original subset list. If the original subset list was an inclusion list, the complement list is used as an exclusion list, and vice versa. In cases where it is desirable to restore part or all of a subset list (ie. include excluded components or exclude included components) a second subset list is appended to the first subset list. The second subset list identifies instances of the leaf design entity to be restored (re-included or re-excluded).

The invention also provides a computer-based system and method for adding new leaf design entities to a VLSI circuit design subset. The addition function is invoked in response to an externally initiated request. A previously constructed subset list is searched to determine whether the instance is already in the list. If the instance is not in the list, it is determined whether the instance represents an internal node of the pruned graph. If the instance does represent an internal node, the internal node is converted to a leaf node by deleting the subtree of the internal node. Then the instance counts or the leaf node are set. If the instance does not represent an internal node, an ancestor node common to the instance and the pruned graph is identified. The subgraph of the common ancestor is appended to the common ancestor of the pruned graph. The leaf node of the appended subgraph is identified, and the instance counts for each node in the appended subgraph are set. Next, for all instances (internal and external nodes), the ancestor path is traversed from the leaf of the appended subgraph to determine for each node whether the first instance count equals the second instance count. If this is the case, the subgraph of the node under consideration is deleted. Then the traversal continues with the next noble. If the first and second instance counts are not equal, the traversal is terminated.

BRIEF DESCRIPTION OF THE DRAWINGS

FIG. 28 is a table showing the LISAs required for design rule checks DRa, DRb, and DRc.

FIG. 29 is a table showing a checking cluster For the base level "contact".

FIG. 30 is a table showing the intrusion searchs required to build the LISAs in FIG. 12.

FIG. 38 is a schematic representation of a transform path spine.

FIG. 39 is a representation of all the intrusion pairs of interest found in the design of FIG. 31.

FIG. 40–53 are schematic representations of the transform path spines for LISAs 1–4 at each node in the humungous LISA as they are visited in pre-order sequence.

FIG. 65 is a table of the 4 intrusions that exist between shapes, a', b', c' and d'.

FIGS. 66–69 are representations of the process of nested net synthesis without deleted shapes present.

FIG. 70 is a flow chart of building interconnections using bridge component.

FIG. 73 is a table of the 4 intrusions that exist between shapes, a', b', c' and d'.

FIGS. 74–77 are representations of the process of nested net synthesis with deleted shapes present.

FIG. 78 is a representation of the result of walking and flattening net4 in cell B.

DETAILED DESCRIPTION OF INVENTION

I. Overview of Shape Instance Method of Nested Design Verification

The present invention generally involves a system and process For VLSI circuit design checking, known as "shape instance nested design verification", which uses nesting rather than hierarehical boundaries to solve the compute time problem of design verification. Its implementation results in design checks being performed at their most nested levels, and hence the minimum number of computations being performed for a given hierarehical design. It does not compromise the design methodology, but instead allows the designer to focus on exploiting the available technology without regard to how it is going to be physically verified.

The starting point for VLSI circuit design verification is the subject physical design. A physical design is a set of mask shapes that denote the design of an integrated circuit. Within the physical design, a shape is a planar set of points and the bounding edges they define. The physical design of an integrated circuit is expressed in the form of a hierarehical layout, which consists of duplicate instances of basic design components connected together to form a complex design. The hierarehical layout characterizes the design as nested data, that is as design components retained embedded as much as possible in the design. In contrast to nested data, flat (or flattened) design data has all of its shapes transformed to the highest level of the design, and thus expressed in a non-hierarchical (flat) form.

Design verification is the process by which the correctness of the physical design for a VLSI integrated circuit is determined. It includes: checking that the geometrical designs of the mask shapes to be fabricated do not violate the rules defined for the integrated circuit fabrication process; checking that the electrical design of the integrated circuit lies within permitted tolerances; and checking that the layout of the physical design matches or is electrically equivalent to the design intent. The design rules that are checked for compliance consist of specifications that restrict or constrain the geometric or electrical use of design components. The geometry-based checks are intended to search for intrusions between shapes on a first (base) level and shapes on a second (ancillary) level, where an intrusion occurs when two or more shapes are within some defined region of interest from one another.

Figure 1:
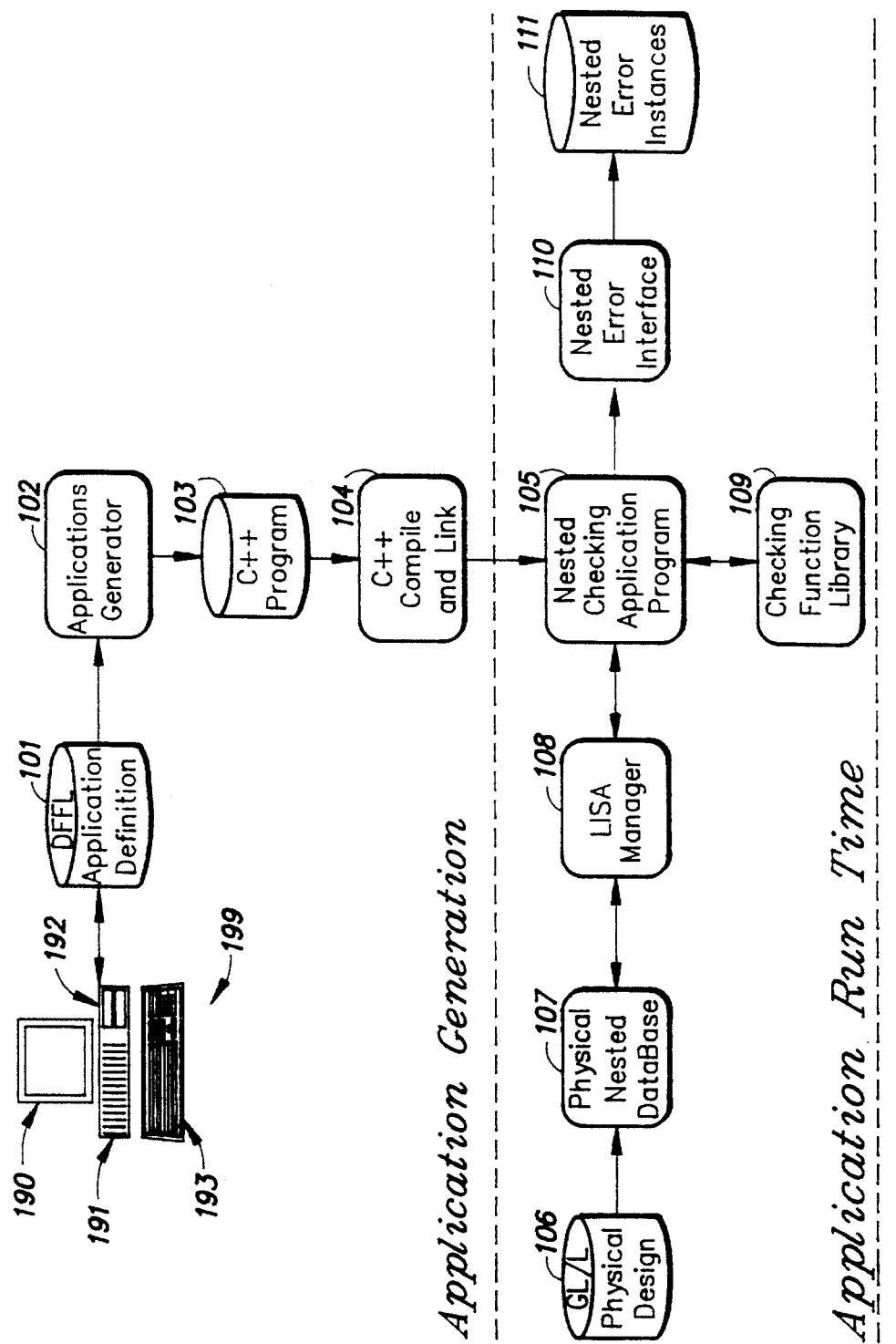
FIG. 1 is a high level representation of the design verification system of the present invention.

A high level view of the nested design verification system of the present invention is shown in FIG. 1. A computer system, shown generally at 199, is provided to control the operation and function of the invention. Computer system 199 includes display 190, processor 191, disk drive 192, and keyboard 193. Processor 191 further includes memory (RAM) into which portions of the design verification system are loaded during execution, although execution from other storage media (e.g. ROM, bubble, EPROM, WORM, disk) is also feasible. In operation, a user interacts with the system via keyboard 193. System responses and information are communicated via display 190. Data such as physical designs, application definitions, C++ program constructs, etc. is generally stored in disk drive 192 or a larger, remotely attached disk storage subsystem (not shown), and then loaded into RAM when accessed by processor 191. However, any read/write permanent memory could be used in addition or in substitution for disk drive 192. Processor 191 executes instructions provided by the design verification system using data from its RAM and from disk drive 192. Results may be reported to the user via display 190 and/or may be accumulated in a disk file for subsequent user-evaluation.

The design verification system itself includes two basic components, application generation and application runtime. The application generation component includes application definition at 101 and application generation at 102. The resultant application is a C++ program, at 103, which is coded to perform the design verification required by the application definition. This program is compiled and linked at 104. The application runtime component includes the nested checking application program, at 105, which results from C++ compile and link step 104. The application program draws on a checking function library, shown at 109, and a separate, pre-compiled function called a LISA manager, at 108. The LISA manager has access to physical design 106 through a physical nested database, shown at 107. Finally, results of the nested design verification are reported at 110.

Turning in particular to the individual components shown in FIG. 1, the first step of the design verification process in accordance with the present invention is application definition, shown at 101. This involves the definition of design rule checks and mask analysis operations using a syntactical language known as a data now functional language (DFFL). Those operations to be computed in performing the design verification are defined using check directive statements written in DFFL.

Given an application definition expressed in DFFL, the next step in the design verification process is application generation, shown at 102. At this point the DFFL is analyzed by an application generator which performs two important functions contributing to the development of a minimum number of highly nested design checks. The first is clustering, which groups together design rule checks and mask analysis operations that use the same base shape level. The effect of clustering is to allow data computations to be shared by the various checks in the cluster. The second function of the application generator is a process called "LISA definition", which establishes within each cluster a set of LISAs (lists of shape instances, or VLSI circuit design components) required to perform the design checks. The LISA is a central aspect of the present invention. In graphical terms, it is a maximally pruned inverse layout tree which defines a subset of VLSI circuit design components of interest in the context of a particular design check. It forms a basic data structure which enables the checking of design data in its most nested form and with a minimum number of operations. In the context of the present invention, a maximally pruned inverse layout tree (graph) is a pruned graph in which sub-trees have been reduced, i.e. pruned, to leaf nodes, and in which identified internal nodes have been reduced to place-holders in the graph. These identified internal nodes are not considered as ancestor nodes of sub-graphs.

The output of the application generator is a C++ program, shown at 103, which embodies the steps of clustering the checks and building the LISAs for each cluster, as well as processing the LISAs to perform the checks they define. The C++ compile and link step, shown at 104, compiles the C++ program written by the application generator and links it with the run-time libraries to produce the executable program shown at 105.

Having generated the VLSI circuit design checking application program, the next step in the design verification process is to run the application. First, intrusions are generated by querying the nested data base, shown at 107, which was previously built for the design data. The actual process of detecting intrusions is well known in the art, and will not be described in detail here. Generally, the process centers around an intrusion search iterator which locates shapes within the VLSI circuit design that come within a region of interest from one another and returns them to a calling program. Based on the intrusions found, LISAs are built and processed, or "walked", for each checking cluster, and the appropriate checks dispatched. This function is controlled by a LISA manager, shown at 108. LISA walking involves traversing the LISA in pre-order sequence and pushing the intrusions found onto Transform Path Spines (TPSs). Checking involves performing the design checks based on the LISAs using the run time checking function library shown at 109. The checks for a LISA are triggered at a node in the TPS called the check node when the state of the TPS indicates that all of the intruding data for that check node is available in the TPS. Checks are actually computed only if they have not already been computed and cached in the TPS and if the check node indicates that there are still unchecked instances to be handled. Finally, the results of the checking activities, which may include errors, compiled statistics, etc., are collected at 110.

II. The LISA

Figures 2, 3:
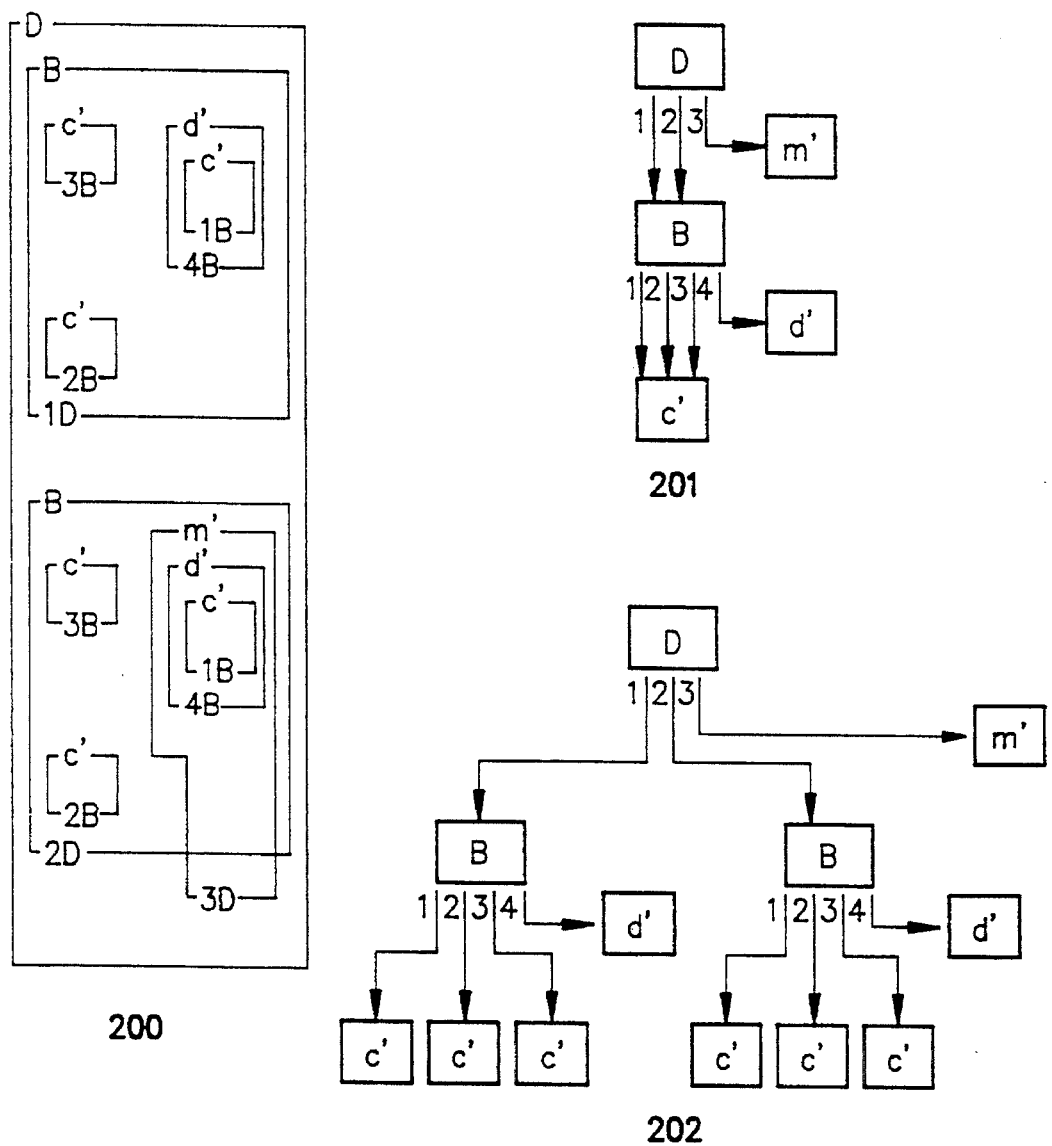
FIG. 2 is a schematic representation of an exemplary hierarchical layout together with a block diagram representation of the equivalent layout graph.
FIG. 3 is a enumeration of the 6 instances of c' shown in FIG. 1.

It is known that the hierarehical data of a physical design is representable by a directed acyclic graph (or layout tree). In graphical terms, a layout tree is an arrangement of nodes (leaves) and connecting links (branches) which may fork in the direction of travel but may not loop back on themselves. In representing a hierarehical design, a component (shape) forms a leaf in the layout tree, while a reference to a shape is represented by a branch of the tree, which itself is a graph. At the top of the layout tree is the prime cell, or the root of the design. An example of a layout tree is shown in FIG. 2. The design forming the basis for the tree is shown at 200. The design is divided into cells, such as D and B, which contain other cells, such as c' and d'. In general, a cell represents a node in the layout tree containing transforms to lower level cells and mask shapes that are defined natively to the cell. The layout tree for this design is shown at 201 and the expanded tree is shown at 202, where it can be seen that cell D contains two occurrences (instances) of B, denoted 1D and 2D, and one instance of m', denoted 3D. Cell B contains three instances of c', denoted 1B, 2B, and 3B, and one instance of cell d', denoted 4B. Cells m', d', and c' each consist of a single shape, which is shown as the bounding box of the cell.

For brevity and ease of explanation the examples to follow will not use cells that contain both transforms to lower level cells and native shapes. Instead, a notation is adopted wherein leaf cells are represented by lower case letters and contain a single shape of the type indicated by the letter. For example, c' indicates a leaf cell containing a shape c'. Similarly, m' indicates a leaf cell containing a shape m'.

Figures 4, 5:
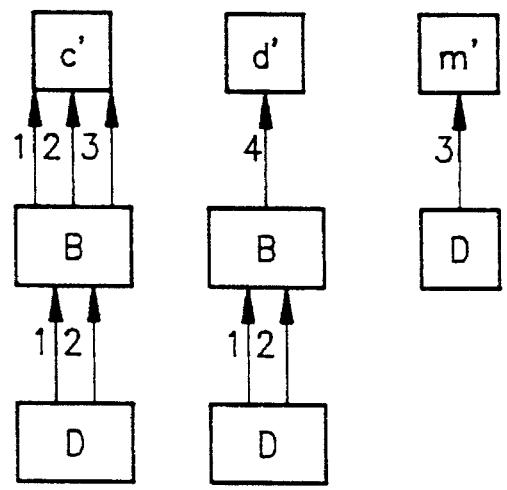
FIG. 4 is a representation of the c' to m' intrusion shown in FIG. 1.
FIG. 5 is a representation of the forest of inverse layout trees for FIG. 1.

A specific instance of a shape within a layout tree is described by enumerating the transform path of the shape, which as mentioned, is a graph. Graphs have internal nodes and leaf nodes. When the root node of a graph is not a leaf node, it is generally treated as an internal node. Processing of graph data occurs at the leaf nodes of the graph; when an internal node is significant, it is treated as a leaf node of a sub-graph. When a set of leaf nodes can be processed at a common internal node, the graph is defined to have been pruned to the internal node. An example is shown in FIG. 3, which illustrates the six instances of c' in cell D. The first instance path, c'---1B---1D, enumerates the path from c' to D via 1B (the first transform in B) and 1D (the first transform in D). Thus, the representation of a shape instance as an enumerated transform path provides a handle to a nested shape, permitting its unique identification. This is illustrated in FIG. 4 by the intrusion between the m' shape in cell D and the c' shape in the 2D instance of cell B. Further, with the added feature of a diagonal line between transform paths, an intrusion between shape instances can be graphically communicated as shown at 401.

Figure 6:
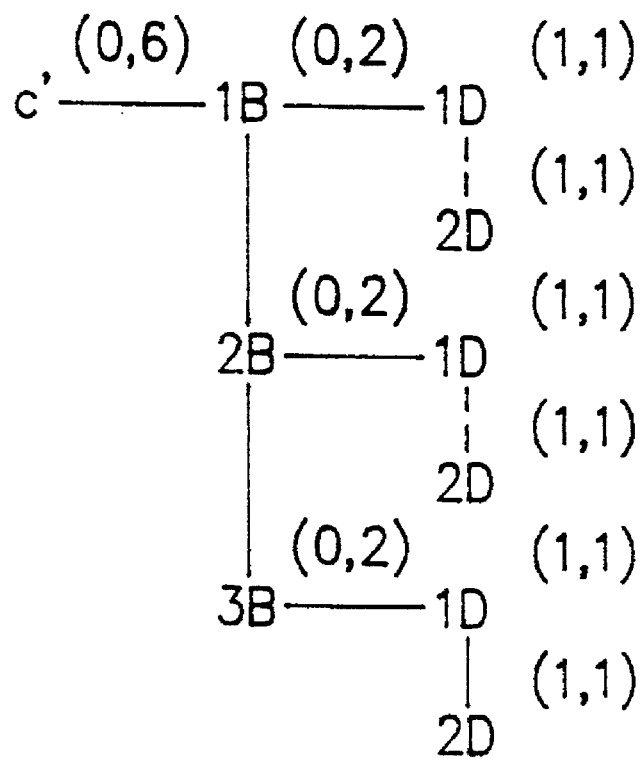
FIG. 6 is an expanded representation of the forest of inverse layout trees for FIG. 1 with instance counts added at each node.
Figure 6:
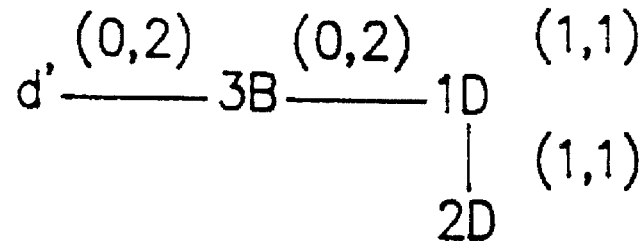
Figure 6:
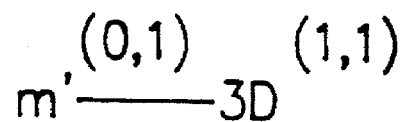
Figure 7:
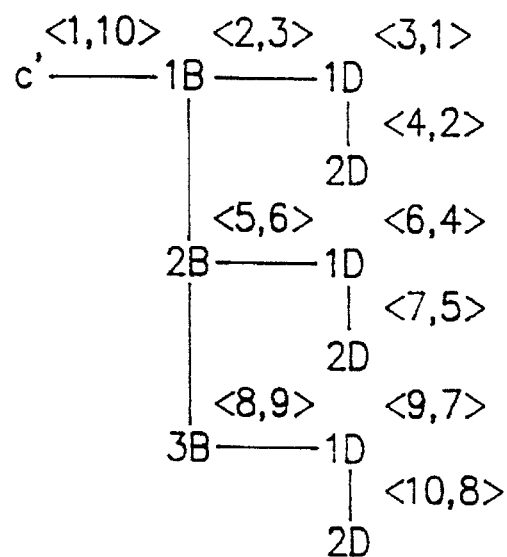
FIG. 7 is a representation of three inverse layout trees with pre- and post-order sort node numbers.
Figure 7:
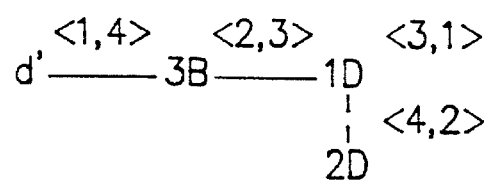
Figure 7:
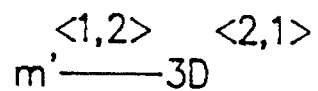

The enumeration of the transform path as a means to identify a particular shape instance has led to the use of an inverse layout tree (ILT) rooted at each leaf shape to manipulate shape instances. In general, the inverse of the layout tree is a forest of trees each rooted at a leaf shape in the layout tree. Examples are shown in FIG. 5. The inverse layout tree may be used to define all possible instances of a leaf shape. Each node in the ILT is associated with a pair of numbers as shown in FIG. 6. The second number represents the total possible number of instances that can be represented at a node. The first number represents the number of instances that are actually represented at this node. Two procedures are defined for walking the ILT. These are the pre-order and post-order node sequences as shown in FIG. 7, where the format used is <pre-order, post-order>. The pre-order sequence is a recursive graph linearization in which a node is processed before the sub-graphs which are rooted at the children of the node. This causes the processing of each node, starting at the root of the tree, in the order in which the node is encountered. The post-order sequence is a recursive graph linearization in which a node is processed after the sub-graphs which are rooted at the children of the node.

Building on the inverse layout tree, the present invention uses a novel concept of a maximally pruned inverse layout tree (or a forest of pruned ILTs), known as a LISA, which defines a sub-set of entity instances of interest in the context of a particular intrusion search. To form a LISA, the intrusions corresponding to a given design check are sorted by base shape and then by the pre-order sequence defined by the inverse layout tree rooted at each base shape. For example, to check that level "B" covers level "A" by 1 micron, level "A" is considered the base level, level "B" the intruding level, and the LISA ("A", "B",1) computed, where the region of interest for the intrusion search is set to 1. The "region of interest" is a region surrounding the base shape; it is derived from the design rule implemented by the check.

All shapes on the intruding level that touch the region of interest must be available to complete the check. The result of the check is a list of intrusions ordered by the shapes in level "A", and within this ordering a second ordering by the pre-order sequence of the inverse layout tree rooted at the base shape in question.

To create a LISA for a particular base shape (design component), all intruding shapes must be identified for each instance of the design component in the inverse layout tree. In order to identify all of the intruding shapes for each instance, the shape-to-shape intrusions for the entire design are identified and stored in memory. Because the intrusion pairs will be processed in a pre-order sequence, a sort must be performed on the intrusion pairs. The sort destroys the sequence in which the intrusions were found. As a result, the intrusion searching can be performed in any hierarehical order (or in parallel), so long as all cells in the design are scanned for in intrusions. In effect, then, the storing of intrusion pairs separates the intrusion searching from the actual checking. Once the data in a LISA is sorted and stored, it can be processed (by walking the LISA graph) at any later time.

Figure 8:
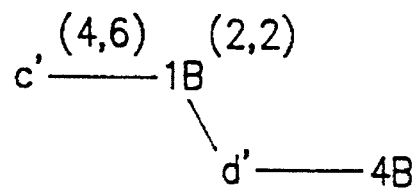
FIG. 8 is a representation of a LISA showing an instance of a c' shape being intruded upon by an instance of a d' shape.
Figure 9:
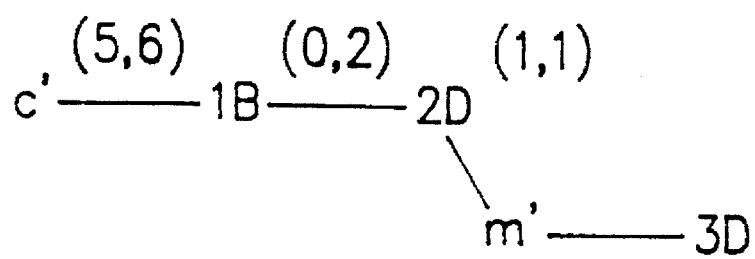
FIG. 9 is a representation of a LISA showing an instance of a c' shape being intruded upon by an instance of an m' shape.
Figure 10:
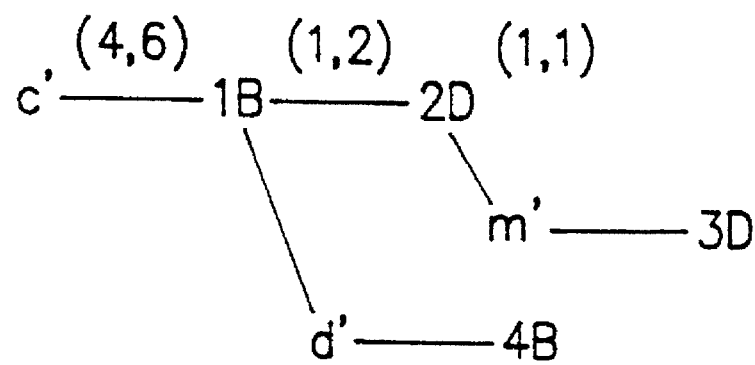
FIG. 10 is a representation of a LISA which combines the intrusions shown in FIG. 8 and FIG. 9.

As a more detailed example of LISA construction, consider the possible subsets of the ILT of FIG. 6, which was discussed previously. FIG. 8 depicts one of these subsets in the form of a LISA. What is shown is an ILT for c' which has been pruned to the c'---1B instance of c', which is where the d'---4B instance of d' intrudes. Note that the intrusion occurs in cell B's coordinate system which is shown by the final "B" in the instance. The instance counts at the 1B node show that this node accounts for both instances of c' intruding on d'. Thus, of the total number of 6 instances of c', the remaining 4 are represented at the root. Note also that the d'---4B intrusion affects 2 instances of c'; thus, any check performed at this node would cover 2 instances of c'. FIG. 9 illustrates another LISA example, in which the m' intrusion occurs in the top level cell and affects only one instance of c'. Since there are no intrusions into 1B, the first instance count is zero. As the intrusion itself accounts for only one instance of c', the remaining 5 instances are represented at the root node. FIG. 10 illustrates the effect of combining instance counts. As shown, one of the two instances of c' at 1B is used at the 2D node, leaving just one instance denoted at the 1B node.

In general, a LISA will contain a forest of ILTs. Thus, a LISA which is built to represent shapes on a "contact level" that intrude upon a "diffusion level" (where contact and diffusion are commonly used VLSI circuit design levels well known in the art) will contain a forest of pruned ILTs each rooted at a particular contact shape and each showing the diffusion-to-contact interaction in a fashion similar to that described above.

As discussed previously, each LISA has a base shape design level, an intruding design level, and a region of interest around the base shape that is to form a search window for intruding shapes. In cases where two LISAs are needed, both having the same base and intruding levels but different search regions of interest, all the intrusion pairs in the LISA with the smaller region of interest will also exist in the other LISA. To optimize performance, only one intrusion search is performed, that with the largest region of interest. Then, the intruding pairs are separated into the respective LISAs when the LISAs are processed. A LISA so-constructed to contain intruding pairs of several LISAs is referred to as a "Big LISA". To process a Big LISA, each pair of intruding shapes is examined to determine which individual LISA the pair belongs to. However, further expansion is possible, as it is frequently necessary to represent multiple LISAs having different intruding levels and different regions of interest. A set of Big LISAs may be formed to express this, in which the intruding shapes from many levels and regions of interest are included. Such a LISA is referred to as a "Humungous LISA," and will be described in more detail in subsequent sections.

The LISA forms a basic data structure which enables the checking of design data in its most nested form with a minimum number of operations by using a process called nested checking. A nested check can be either symmetrical or asymmetrical, depending on the type of intrusion search involved. A symmetrical check will compute intrusions only one way. Thus, if shape A intrudes on shape B, the converse search will not be performed to locate any shapes that intrude on shape B but do not intrude on shape A. The nested check itself is performed by walking the LISA, i.e., visiting the nodes in the LISA, in the pre-ordered sequence as computed, pushing the intrusions onto a transform path stack (TPS), and performing a check when the post-ordered sequence indicates that all of the intruding data for a sub-tree is available in the stack. By exploiting the inherent nested structure of the design cells, nested checking achieves efficient verification without imposing restrictions on design. The designer remains free to exploit the limits of the physical design technology without regard to how the design will be verified.

III. Manipulating Large Shapes In Nested Form

Large VLSI circuit designs, or mask shapes, are often designed in small segments which, when mathematically unioned together, form one shape. For example, a ground net, if stretched out, may form a wire half a meter long, while actually being composed of tens of thousands of individual polygons. Such a large shape comprising many small segments is referred to as a "fragmented shape." One generalized objective of the present invention is to derive information about fragmented shapes from the small pieces that form them, and then to handle these pieces in their most nested framework. Several shape manipulation methods have been developed to facilitate this objective.

Figure 11:
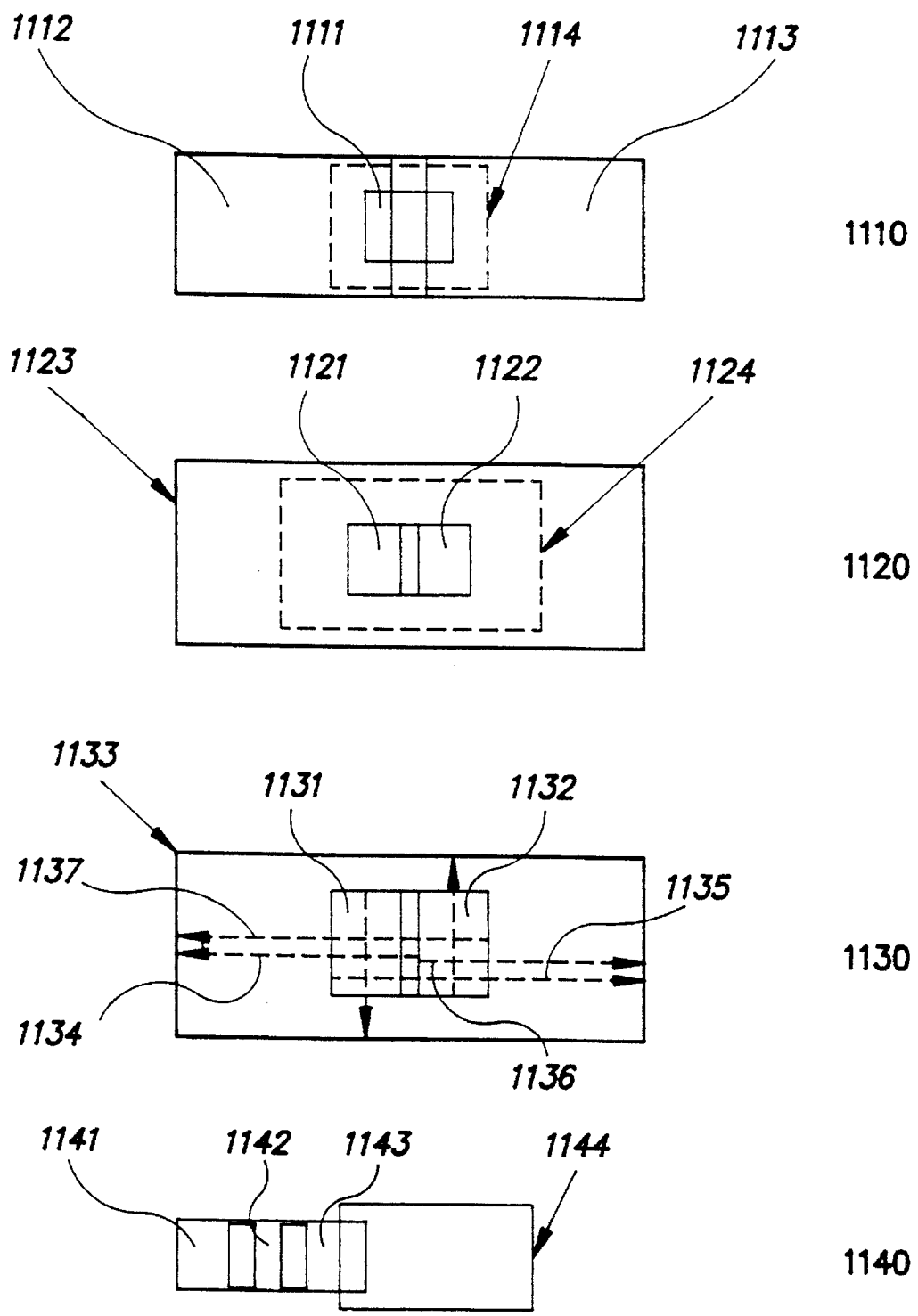
FIG. 11 is a representation of different types of shape fragmentation.

In the design verification context, fragmentation becomes an important issue which must be dealt with when it occurs in one or more shapes in an intrusion pair. The problem created by fragmentation is that it may cause a checking function to produce extraneous results, for example by failing to derive a property of a large fragmented shape based on a single fragment. Fragmentation of an intruding shape is handled by collecting all fragments of the intruding shape in the specified region of interest around the base shape and unioning these shape fragments before performing the desired check against the base shape. An example is shown in FIG. 11, where the exemplary shape layout shown at 1110 depicts a single contact shape 1111 covered by a fragmented metal shape comprising two parts 1112 and 1113. The function to be performed is to check that the contact shape is properly enclosed by a metal shape within the specified region of interest 1114. If the checking function were to perform this check pairwise, two error diagnostics would be returned, because neither intruding metal shape itself encloses the contact shape. However, by unioning the two metal shapes prior to measurement, a single continuous shape is created which does enclose the contact shape. This eliminates the otherwise extraneous errors.

Fragmentation of a base shape can be considerably more difficult to handle since each fragment must be processed as the root of its own LISA, while at the same time the entire unioned base shape must be considered as the root of one LISA. Three general techniques are defined to enable operations on a fragmented base shape. The first is called "piece-wise," and involves deriving the properties of a unioned base shape by operating on the individual fragments independently of one another. This technique uses a "point-set" representation of the base shape. In a point-set representation, the shape is defined by all points in its interior region and on its boundary. The second technique is called "partial locality," and involves the use of additional shapes from the base shape's level to eliminate extraneous information. This technique uses a "bounding-edge" representation of the base shape. In a bounding-edge representation, the shape is defined exclusively by its outside bounding edges. The third technique is called "nested global union," and involves defining a method to obtain a nested representation of the entire base shape. The appropriate technique is implemented by each shape checking function to ensure correctly computed results. If a "true" or "false" property of a large fragmented shape can be derived by a logical "AND" of the results of a function performed on each fragment of the large shape, the function can be implemented either piece-wise or using partial locality. In this case, an error found in one fragment indicates an error for the entire large shape. Since a logical AND of the individual function values is commutative, the fragments can be handled in any order; as will become apparent in subsequent sections, this greatly suits the needs of the invention.

If a function can derive a desired property using the point-set representation of a base shape then the function can be implemented using the Piece-Wise technique. An exemplary application of piece-wise analysis on partial base shapes is shown in FIG. 11 at 1120. The desired function is to measure that the contact, which was designed as a fragmented shape (1121 and 1122), is properly covered by metal 1123 within the region of interest specified at 1124. In accordance with the piece-wise approach, it is sufficient to show that all of the points are properly covered. Thus, each piece is measured and the results are ANDed together to determine that the large fragmented contact is properly covered.

The Partial Locality technique is used when it is desired for a checking function to derive a property using the bounding edges of a shape. All edges of a fragment of a large shape may not be bounding edges. To find the bounding edges, an intrusion search is performed. The intrusion search locates adjacent fragments of the large shape to determine which are bounding edges (and thus participate in the check) and which are internal edges (and thus must be ignored). A LISA of the intruding base fragments is built to perform the intrusion search. This LISA is called an ancillary LISA. An exemplary application of partial-locality analysis is illustrated in FIG. 11 at 1130. Two contact fragments 1131 and 1132 are shown covered by a metal shape 1133. The desired function is to determine the inside overlap distance from the edges of the contact to the edges of the covering metal. Unless the internal edges of the fragmented base shape 1131 and 1132 are eliminated, extraneous errors will be computed, as shown at 1134 and 1135, due to non-bounding edges that are not bounding edges of the unioned base shape. By collecting all shapes at the base level as ancillary shapes, the bounding edges of the unioned base shape can be determined. Thus, considering shape 1131 as the base shape, shape 1132, the ancillary shape, is used to determine that edge 1136 is an internal edge and should be ignored, eliminating extraneous error 1134. A similar approach with respect to shape 1132 will eliminate extraneous error 1135.

The nested global union technique is used when the function to be performed requires a property of a large fragmented shape to be computed, which property can be determined if any fragment of the large shape can be shown to have the property. Such a property is then the result of a logical "OR" over the results of a function operating on fragments of a large shape. An exemplary application of nested global union is shown in FIG. 11 at 1140. Three contact fragments 1141, 1142 and 1143 are shown. One of the contacts is partially covered by metal shape 1144. Since a fragment of the contact hits the metal level, the entire unioned contact shape hits the metal, in the electrical sense. In order to implement a function to determine this property, it is necessary to form a nested union of a shape and store properties of the unioned shape with the nested unioned representation. It is also necessary to define functions that operate on pieces of the shape, which functions will identify the property.

Given the ability to perform a global union as described above, it is somewhat more complex to determine properties of the union of a shape and still keep the data nested. In practice, this problem frequently arises in the context of "nested net building," an application which will be described in detail in section VII. As a brief introduction for purposes of the present discussion, a net is a collection of components of a design formed by interconnecting conductive shapes. In a similar sense, a representation of a net can be used to denote a set of fragments of a large shape that touch each other and when unioned will form a single shape. Now, a nested union representation will be defined using nested net building such that a large fragmented shape can be processed while maintaining its data in its most nested form.

A net may be formed from instances of nested components. A net representing the union of the fragments of a large shape may be formed from instances of nested fragments and is stored in the form of a nested net. Each nested fragment may belong to more than one unioned shape and each unioned shape may consist of a set of fragments. Each instance of a unioned shape may have its own properties; thus, different instances of a single fragment may have different properties due to membership in different nets and/or instances of different nets. A property of an instance of a shape fragment is determined from the properties of the instances of the net representation of the unioned shape in which the fragment resides. This property may be represented as an intruding property on an instance of the fragment, thus forming a LISA of the property of the instance of the fragment. In order to determine such a property, a "look-up" mechanism is needed to walk the graph representing the nested net. Such an operation is called a "join" of instances of data. The actual execution of a design check involves walking (i.e., linearizing) a LISA of information. Walking a net may not linearize in the same sequence as walking a LISA. Thus, the "look-up" function must be executed in a separate pass through the data, and its output must appear as instances of intruding data and instances of the base shape. These intruding instances are then sorted with the other instances of intrusions when forming the Humungous LISA.

In summary, when a function is implemented requiring information to be accumulated into the union of a large shape, a nested net build is needed to identify the unioned shapes. Then a second function is performed to determine the desired property of the unioned shapes and store the associated data with the unioned shapes. Then a "look-up" function is performed to merge the instances of base shapes as intrusion pairs. Finally, the information is made available for the check to be performed in the linearization or walking of the humungous LISA. In order to shield the user from this complexity, a definitional input language and an application generator are provided in accordance with the present invention. These components will be described in the following section.

IV. Design Checking Using Shape Instance Processing

Many design rule checks on the same design shape share common computations. The circuit design verification system of the present invention organizes design checks using the mechanism of a dynamically generated application program which is coded to run all of the required design checks so that computations performed for one check can be re-used, without re-computation in other checks. The application program is generated based on a functional description of the checks communicated in the form of a DFFL (data flow functional language). It is coded to organize the checks by grouping intruding shape instance pairs into LISAs using the representational concepts described above. The program is then executed to perform the design checks in the most efficient manner possible. The DFFL, the application generator, and the runtime execution of the application are described in detail below. In the next section, a complementary example is presented which involves forming four LISAs. The example shows the effect of storing all the data in one LISA, as well as a method for processing the LISA to achieve the interleaved walking of the individual constituent LISAs, and hence efficient execution of the design checks.

A. DFFL Description of Design Rule Checks

The purpose of the DFFL statements that form the input to the application generator is to succinctly describe the checks to be performed against the hardware design. As such, any type of DFFL may be used in combination with the present invention. Various DFFLs are well known in the art and accordingly will not be discussed in detail here. In the preferred embodiment, the DFFL statements are divided into two categories: definitional statements and directive statements. Definitional statements are written in the form of a term followed by the verb "is" followed by a definition for the term. Directive statements begin with the word "check" and describe design checks to be performed based on the definitional statements. When a symbol is referenced, the expression defined for the symbol is substituted for the symbol. Thus, in the check directive "Check DRa, . . . ", the symbol DRa is replaced with the expression found in the definition for DRa. Similarly, if the DRa definition contains a reference to "DiffusionContact", this term also is replaced with the expression found in the definition for Diffusion-Contact, and so on until one graph is formed representing the entire check directive.

The set of shapes to be processed by a directly is called the "domain" of a check. Subsets of shapes are specified in DFFL using the "suchthat" operator. The left operand of the "suchthat" operator is the expression or definition being qualified, while the right operand is a Boolean expression that must be satisfied for a particular shape to be in a given domain. In evaluating the "suchthat" operator, the value of the Boolean expression is the left operand if the expression returns a "TRUE" result. Anything other than "TRUE" in the right operand causes the value of the Boolean expression to be "VOID". "VOID" indicates that the shape instance is not in the domain to be checked, and an expression defined for that domain cannot have a value. It is permissible to specify the subset of a domain using additional "suchthat" operators. For instance, in the example to follow a domain of contacts is defined as a "DiffusionContact". A subset of Diffusion-Contacts that are large can be defined using the DFFL: LargeDiffusionContact is DiffusionContact suchthat area(DiffusionContact)>4.

Examples of both definitional statements and directive statements are presented below.

Contact is DesignLevel('CA');

Metal is DesignLevel('M1');

Diffusion is DesignLevel('DF'); These first three statements define required input levels to the compiler.

DiffusionContact is Contact suchthat Meet(Contact, Diffusion); A diffusion contact is a contact that intersects with a diffusion shape.

DRa is Indist(DiffusionContact, Diffusion)>=2; DRa is defined to check that a diffusion contact is inside diffusion by at least 2 microns.

DRb is Indist(DiffusionContact, Metal)>=2;

DRb is defined to check that a diffusion contact is inside metal by at least 2 microns.

DRc is Indist(Contact, Metal)>=1;

DRc is defined to check that all contacts are inside metal by 1 micron. Note that this check will be duplicating a diffusion contact to metal check.

Check DRa, print( . . . );

Check DRb, print( . . . );

Check DRc, print( . . . ); These last three statements are DFFL directives to perform the defined checks.

B. Application Generation

The Functional description of an application program is provided to the application generator in the Form of DFFL, as described above. The application generator performs compilation and data flow optimization on the DFFL, and then generates a design verification source program that contains the entire application. This is compiled, linked and executed against the user's design. In the preferred embodiment the application generator generates a C++ source program that can be run on any compatible computer platform.

Figure 12:
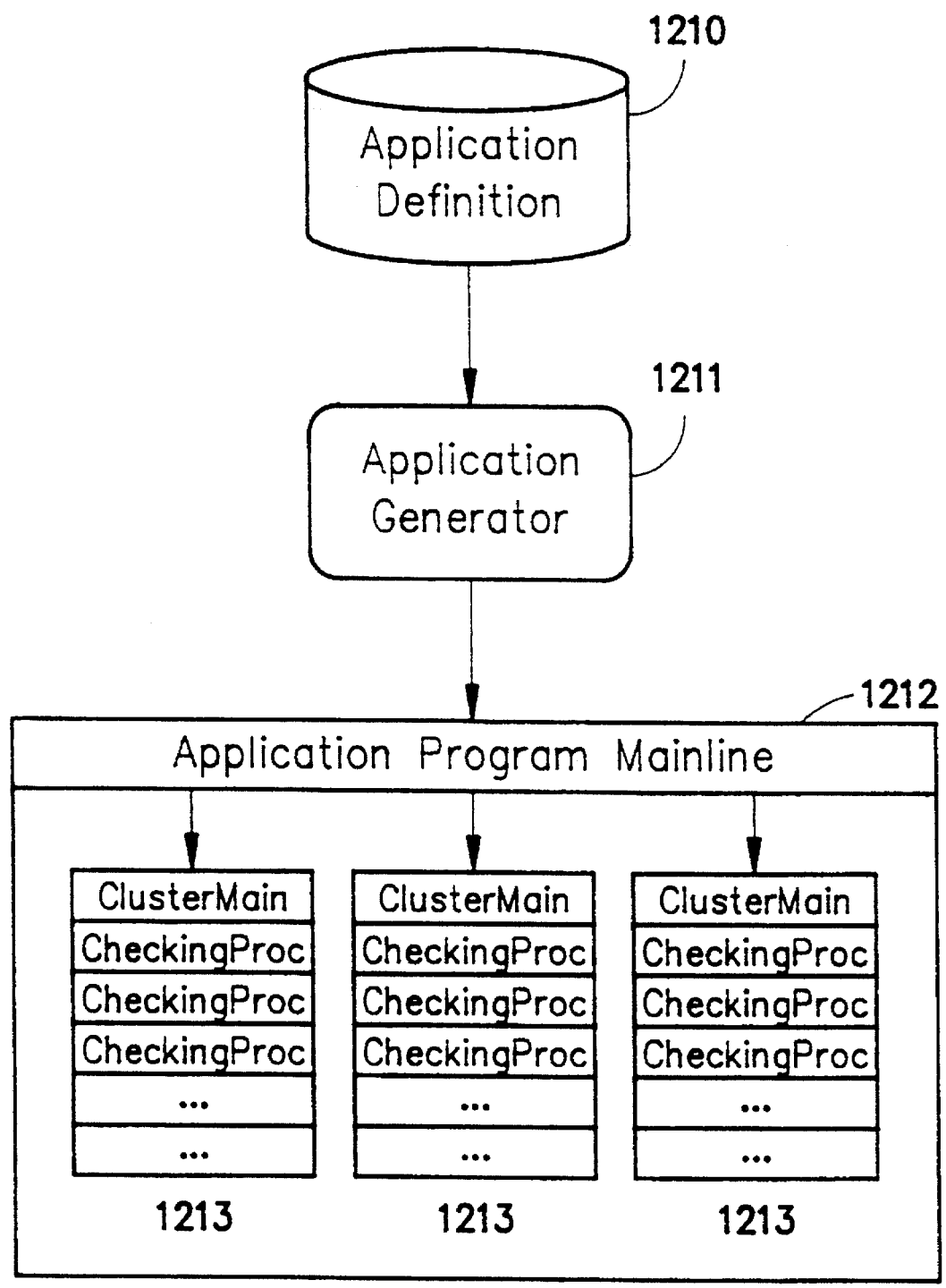
FIG. 12 is a representation of the generated application program showing the generation of checking clusters.

An important aspect of the data flow architecture is the collection of checks that have the same base, i.e., those which involve checking the same design level, into a group of checks called a cluster. By clustering related checks, these checks can share common intrusion searches, LISAs and intermediate results from functions. FIG. 12 illustrates the clustering process where the DFFL description of the application 1210 is processed by the Application Generator 1211 which creates the Application Program 1212 which is seen to contain several checking clusters shown at 1213. Each cluster is supervised by a block of code called a Cluster-Main. Within each cluster, each check is compiled into a block of code called a CheckingProc.

A second important aspect of the application generator is LISA definition, which establishes within each cluster the set of LISAs required to perform the design checks. One LISA is defined for each check. Since they all have the same base level, these LISAs can be considered as part of a humungous LISA composed of the common base level with all the intruding shapes required to perform the checks for the cluster.

A portion of the processing performed by the application generator is an optimization step which involves algebraically combining the assorted DFFL "suchthat" operators into one Boolean expression that can be evaluated (using a known technique called "lazy evaluation") to determine if a specific instance of a design component belongs to a domain to be checked. If the specific instance does not belong to the domain to be checked, a "domain failure" condition exists and no data need be derived for that instance. If the above optimization is not performed, then the application generator must handle the individual "suchthat" operators in the execution call sequence it will construct. In some cases this optimization cannot be performed, as with functions which do not propagate "suchthat" expressions. An example of such a function is the "OR", as used in the expression: A suchthat ((B suchthat C) OR (D suchthat E)). In these cases, the "suchthat" is transformed into a "run-time" function, an additional value "VOID" is defined as a returned value, and subsequent functions handle this value as an empty input, or a "domain failure". A "suchthat" may also appear in the right operand of another "suchthat" (e.g., . . . A suchthat (B suchthat C)). in this case, if C does not return a "TRUE" value, then B is not in a domain, and it returns a value of "VOID". In accordance with the definition of "suchthat", the right operand will not receive a value of "TRUE"; hence, the value of A will also be "VOID".

Figure 13:
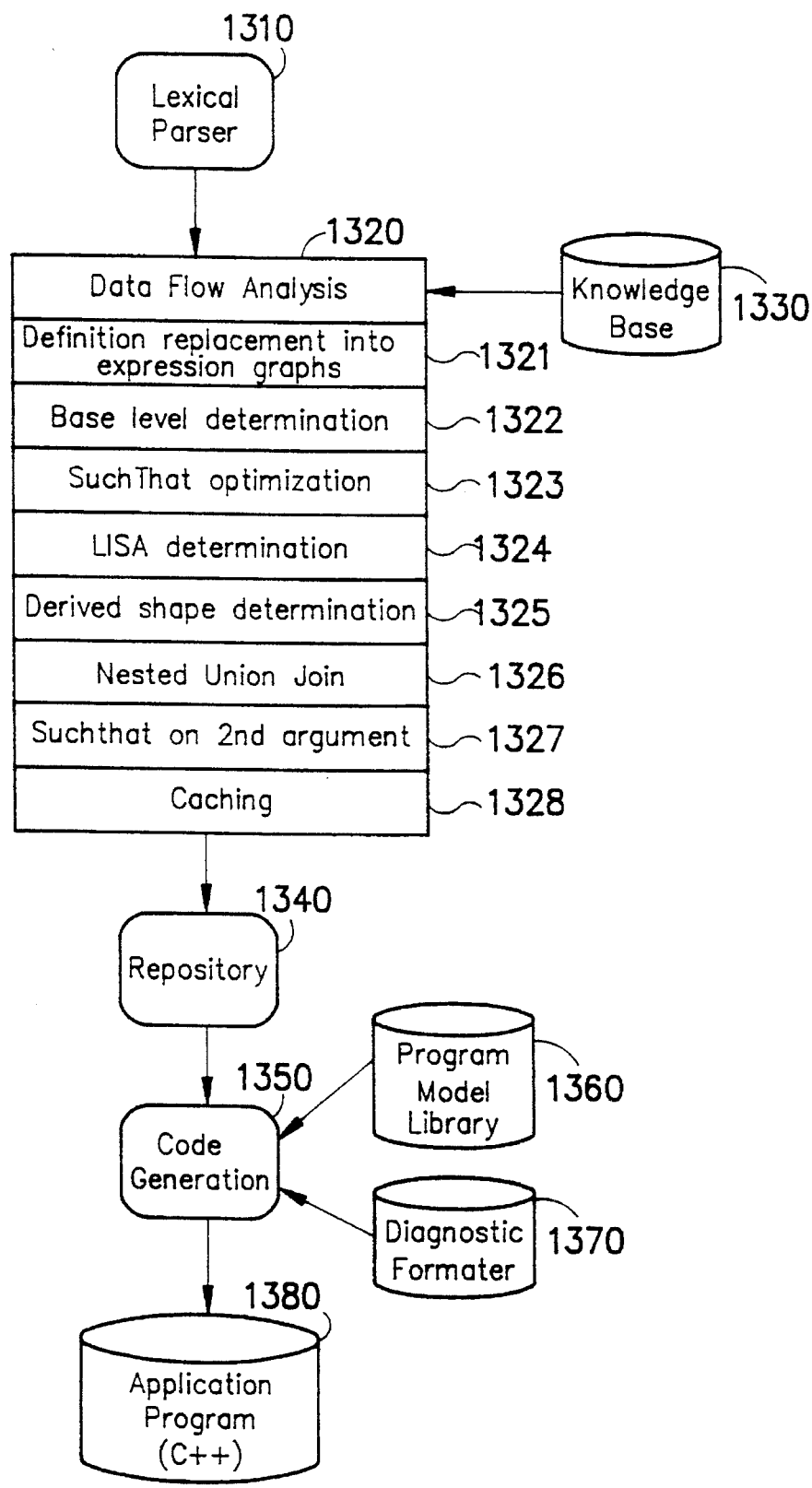
FIG. 13 is a representation of the application generator architecture for the present invention.

The application generator is structured into the following components, as shown in FIG. 13:

1. Lexical analyzer and parser (1310) forms the input stream (DFFL source) into tokens. Extraneous white space (blanks and new lines) and comments are removed. Each statement then consists of a stream of tokens, which is processed into parse trees. The output of the lexical analyzer/parser is a set of graph structures representing the DFFL statements.

2. Data flow analyzer (1320) walks the parsed trees several times, each time adding runtime methods obtained from a knowledge base 1330 to the parse graphs until the graphs represent optimized run time specifications. optimization includes recognition of commonly used expressions and clustering of checking directives.

3. Repository (1340) receives output of the data flow analyzer, including the final statement graphs, the LISAs needed for the program, a list of variables needed for the program, a definition of the clusters to be run, a list of directives to be included for each cluster, and a list of all cached function storage needed.

4. Code generator (1350) reads program models from a library 1360 and inserts information from the repository into the code strings in the models to personalize the models for the specific application being generated. The modified code is in C++ programming language and is written to an output file. A program model may reference nested program models, in which case the code generator reads the model for the main-line and references the nested models that generate the specific components. This commonly occurs in the generation of directives within clusters. The code generator determines from the repository the number of clusters and invokes the program model once for each cluster. Within each cluster the model determines which directives are needed and causes invocation of the directive model to generate the code for each directive. The result is a set of directive models nested within a program model.

5. Diagnostic formatter (1370) collects diagnostics resulting from the execution of the application generator.

The Lexical Analyzer and Parser

Figure 14:
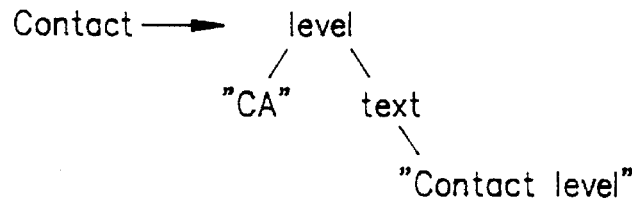
FIG. 14 is a representation of the parsed graphs for the exemplary DFFL statements.
Figure 14:
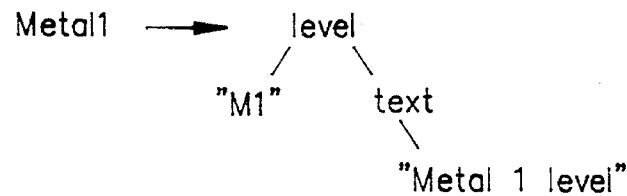
Figure 14:
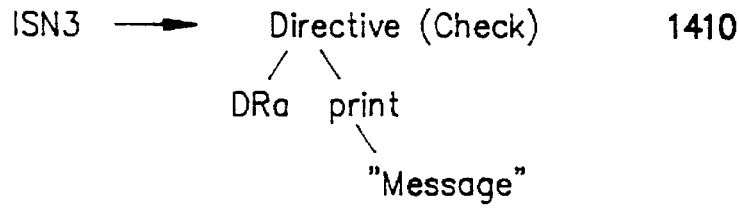
Figure 14:
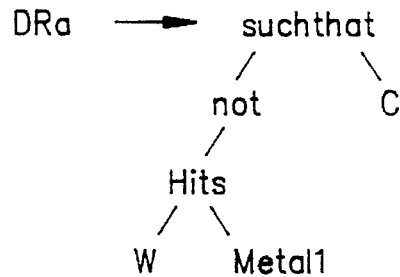
Figure 14:
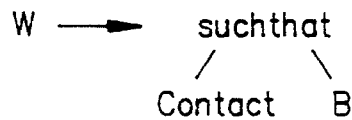

The lexical analyzer and the parser shown at 1310 use programming techniques well known in the art of compiler design and accordingly will not be described in detail. Their output, and the input to the data flow analyzer, is a set of parsed graphs formed from the DFFL input to the application generator. FIG. 14 shows an exemplary set of parsed graphs; these graphs will be used to illustrate the functional details of the data flow analyzer. The graphs are formed from the following DFFL statements which implement a single DFFL directive.

Contact is design_level("CA", text("Contact level"));

Metal1 is level("M1", text("Metal 1 level"));

Check DRa, print("Message");

DRa is! Hits(W, Metal1) suchthat C;

W is Contact suchthat B;

B is . . . //used in this example as a dummy Boolean expression

C is . . . //ditto

Data Flow Analyzer

The data flow analyzer, shown at 1320, performs the following functions.

Figure 15:
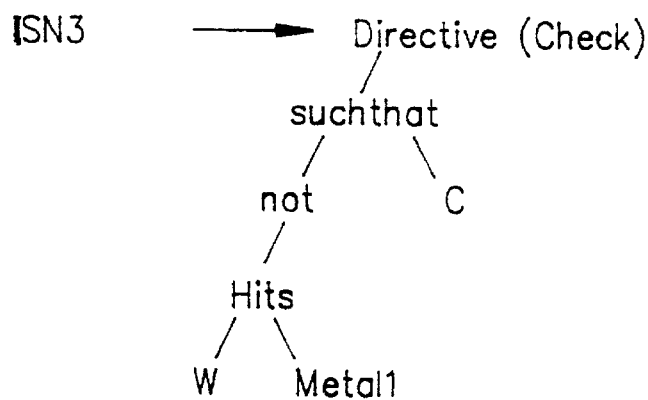
FIG. 15 is a representation of the intermediate parsed graph for ISN 3.
Figure 16:
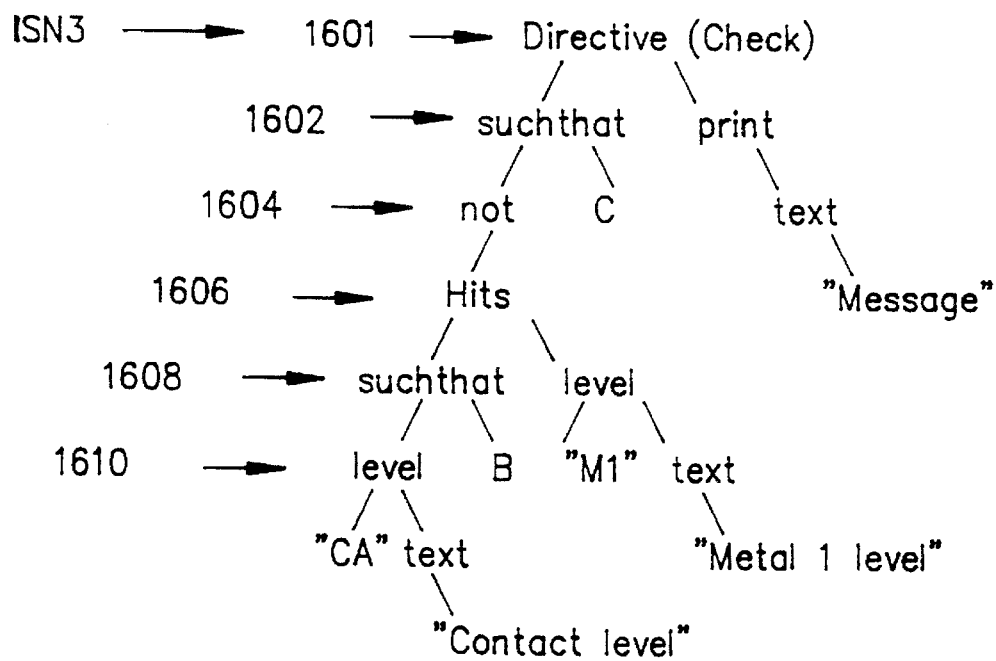
FIG. 16 is a representation of the final parse graph for ISN 3.

Definition Replacement into Expression Graphs—(1321): The first function performed by the analyzer is to substitute the graph of the definition for any leaf node that is not of a known leaf type into the parse tree graph. This process continues until all leaf nodes in the graph are valid leaves. FIG. 14 shows an example in the parse graph of internal statement number (ISN) 3 shown at 1410, wherein the analyzer encounters a "directive" node having two child nodes. The process descends into each node, performing substitutions until all the child nodes have been processed. As shown, the first child node of the directive is a leaf having the symbol "DRa". "DRa" is not a known terminal node, since it is not an arithmetic value, a Boolean value or a character string value. Therefore, the list of definitions is scanned to determine whether a definition is available. If a definition is available, the analyzer replaces the symbol with the graph representing the definition, and continues to walk the substituted graph. Thus, "DRa" is replaced with the root node of its definition, a "suchthat" node, which becomes the first child node of ISN 3. The result is shown in FIG. 15. As the graph-walk proceeds, the symbol "W" is encountered. Since "W" is not a known terminal, the list of definitions is scanned again to determine whether a definition is available. Using the same procedure as described above, the analyzer substitutes the graph of the definition for "W". The process continues until the entire graph has been walked. When all the definitions have been replaced, the leaf nodes of the graph are all of a known type. The final graph for ISN3 is shown in FIG. 16.

Base Level Determination—(1322): The next function performed by the data flow analyzer is to determine the base level (the level to be checked). The base level is found by performing a recursive walk of the first child nodes in the directive graph to determine the leaf level of each subgraph. For the directive graph shown in FIG. 16, the first child node is "suchthat" 1602. The base of a "suchthat" is the base of its first child node, because it is the base shape that is being qualified. In this case, the base of the "suchthat" is the base of "not" operator 1604. The base of the "not" operator in turn is the base of "hits" function 1606. For the "hits" function (or any other function), the base is stored in the knowledge repository associated with the application generator. In this case, the base of the "hits" function is the base of its first child node, which is "suchthat" 1608. The first child node of this "suchthat" is level function 1610, which returns the character string name from its first child node. When the recursion completes, it will have determined that the base level for the directive of FIG. 16 is the level "CA". This base level information is stored as a property of the directive.

SuchThat Optimization—(1323): Having determined the base level, the data flow analyzer proceeds to its next function, optimizing the "suchthat" expressions. The "suchthat" operators determine which subsets of the base level are to be checked. Optimization involves attempting to perform all qualification functions (second child expressions) For the "suchthats" before executing any of the functions associated with the actual checks.

A preliminary step in the optimization process is transformation of certain functions and operators into forms that can be handled more conveniently. For instance, many functions (and most operators) have the property that they "propagate" a "suchthat". This propagation rule means that a function with a "suchthat" qualifying the first child node is equivalent to that function with the "suchthat" moved outside the function. Algebraically, this can be expressed as:

Fcn(A suchthat B,C)→Fcn(A,C) suchthat B.

Figure 17:
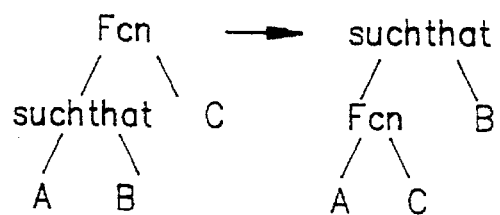
FIG. 17 is a representation of a "suchthat" transformation.

The graph of this transformation is shown in FIG. 17. The result is that expression "B" determines whether the function is evaluated. Another useful transformation stems from the fact that most binary operators can combine a "suchthat" expression with a simple definition, for example:

(A suchthat B)+(C suchthat D)→(A+C)suchthat(B & D).

Figure 18:
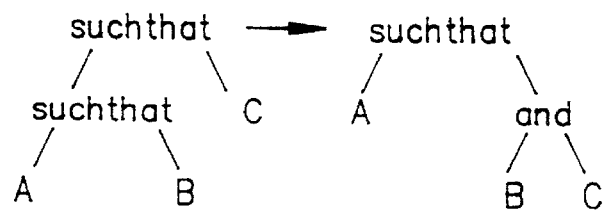
FIG. 18 is a representation of a "suchthat" transformation.

When transformed into this structure, the Boolean expression "B & D" may be evaluated before adding the outputs of expressions A and C. A third useful transformation involves the merging of "suchthat" operators. A graph of this transformation is shown in FIG. 18. Using this transformation, multiple "suchthat" expressions for a "suchthat" located as the first child node of an outer "suchthat" can be transformed into a single expression containing one "suchthat".

Figure 19:
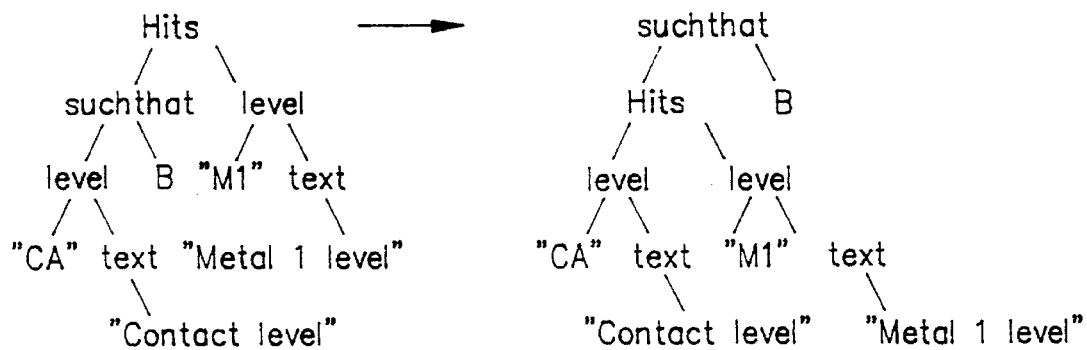
FIG. 19 is a representation of the intermediate optimization of ISN 3.
Figure 20:
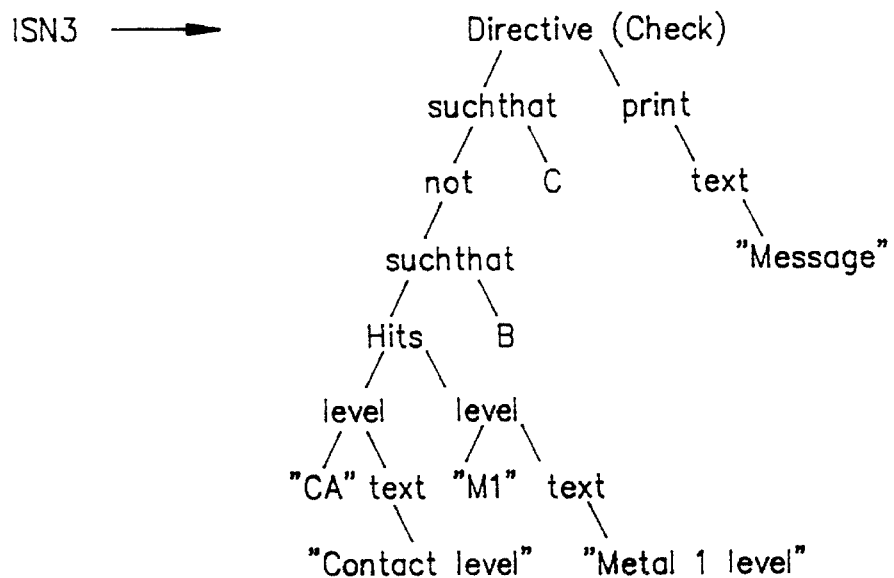
FIG. 20 is a representation of the intermediate optimization of ISN 3.

Returning now to FIG. 16, it will be shown how the application of "suchthat" transformation rules described above can be used to optimize the directive ISN3. "Suchthat" optimization is achieved using a recursive method which modifies the parse graph according to the individual transformations. For each node in the parse graph, the method invokes itself to optimize each of the child nodes in the graph. After all child nodes have been processed, the method examines the root of the subgraph to determine if it is a "suchthat" operator. If it is, and the node is a type that can "move" the "suchthat", the active node (currently being processed) is modified according to the transformation rules and the subgraph is returned as the optimized subgraph. In FIG. 16, the method starts at directive 1601. The directive invokes optimization for the first child subgraph. The first child node is "suchthat" 1602. The "suchthat" invokes optimization for its first child node, which is "not" 1604. This process continues through "hits" function 1606, which finds another "suchthat" at 1608. Its first child node will be returned as "level" 1610, with no modification. When "suchthat" expression 1608 is returned to "hits" 1606 as "optimized", "hits" 1606 refers to the knowledge repository to determine the appropriate handling for the "suchthat". The result returned from the knowledge repository is "propagate". Accordingly, the graph transformation shown in FIG. 19 is performed. The resulting graph is shown in FIG. 20.

"Hits" 1606 then returns its expression to "not" operator 1604, which repeats the processing performed at "hits"

Figure 21:
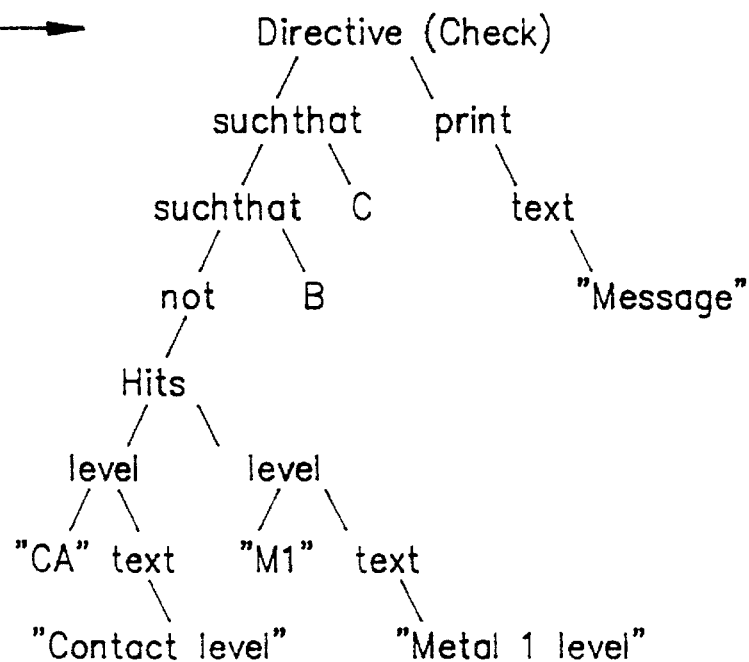
FIG. 21 is a representation of the intermediate optimization of ISN 3.
Figure 22:
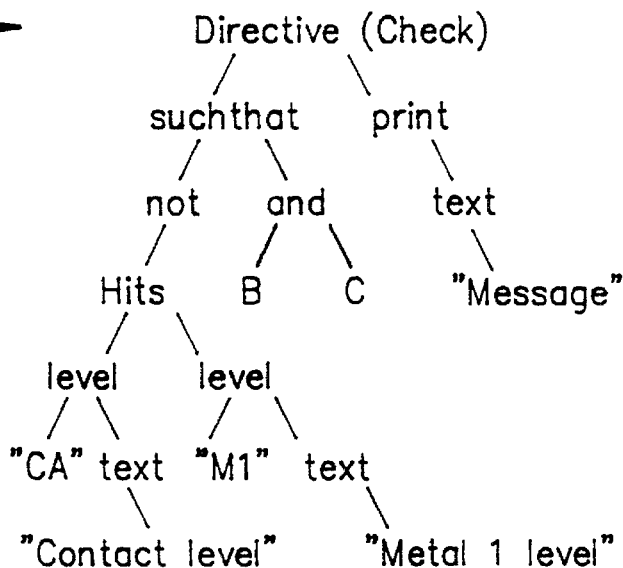
FIG. 22 is a representation of the final optimized graph for ISN3.

1606; this produces the modified parse graph shown in FIG. 21. With its new subgraph, "not" 1604 returns to "suchthat" 1602 with a "suchthat" at the first child node. Applying the above rules for combining "suchthat" expressions, the graph becomes that shown in FIG. 22. This completes "suchthat" optimization for ISN3.

Figure 23:
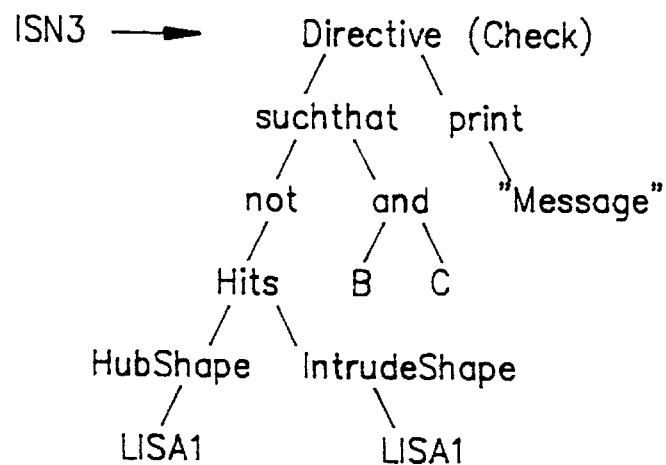
FIG. 23 is a representation of the ISN3 graph modified to include the required LISAs.

LISA Determination—(1324): Following "suchthat" optimization, the data flow analyzer proceeds to determine the LISAs that will be required to process each directive. This is a form of data coercion, since it converts ("coerces") the form of the data types of the inputs as received into the form required for the inputs. Four parameters are needed to define each LISA: a base level; an intruding level; a region of interest; and a LISA type. A recursive walk is conducted over the parse graph in search of function g that require LISA inputs. A function requires a LISA if it operates on instances of design components. In the present example, the only function requiring a LISA is the "hits" function. When the "hits" node is encountered, the knowledge repository is queried for rules establishing what LISA(s) are needed. In the present example, it is assumed the rule indicates that the base of the LISA is the level name of the first child subgraph; the intruding level is the level name of the second child subgraph; the region of interest is zero; and the type is "symmetrical". The LISA for the "hits" function is added to the output repository; subsequently a function that lists all the LISAs will return the name of the LISA, removing duplicate LISAs in the process. The parse graph of the "hits" node is modified by replacing the level name with the LISA name, as shown in FIG. 23. Subsequent code generation will fill in the call sequence using this information.

Some functions will require a LISA having a region of interest that varies with design rule values. An example is: Indist(Contact, Metal1)>=2.0. In this expression, to determine if the contact shape is properly covered by at least 2.0 microns of Metal1, the region of interest for the LISA must be 2.0 microns. The data flow analyzer determines the region of interest using a set of rules that can examine parts of the parse graphs. If the analyzer cannot determine a region of interest for a specific LISA, a diagnostic is produced requiring the DFFL programmer to specify the region of interest in the DFFL.

Derived Shape Determination—(1325): In order for a design component, or shape to be processed it must appear in a LISA which is generally derived from an intrusion search. However, some functions, such as the shape Boolean operators including intersection and complement, create new shapes. In order to use these shapes in intrusion searches the newly created shapes must be added to the shape repository. They are known as "derived shapes", and identify an output type of that same name for use by functions producing such new shapes. When the analyzer discovers that the input to a function is a "derived shape", it must build a directive to create the shape and replace the reference to the function with the name of the newly created level. The analyzer must also ensure that the new directive is executed in a cluster of checks before the cluster that will execute the current directive. Thus, the new directive must be added to he set of directives maintained for the program, and the data flow graph must be modified to indicate the data flow dependency of the new directive. Derived shape determination is another form of data coercion, since it converts the form of the data types of the inputs as received into the form required for the inputs.

Nested Union Join Determination—(1326): It has already been described that sometimes a function must be applied to the union of instances of nested shapes in order to derive a property of one large fragmented shape. When a function has the property of causing a unioned shape to be formed, the application generator must create several directives to cause the union or the level to be formed; a directive to derive the desired property of the unioned shape; a directive to walk the unioned shape and create instances of the base pieces that are added to the current humungous LISA (an operation that has been called a "join" of instances); and, finally, a directive to query data about the unioned shape from a LISA that was created by the join. The directives created by the application generator may be clustered with other directives, so long as they are all sequentially processed in data flow sequence. The data flow graph of directive dependencies and the clustering of directives is accumulated in the repository build interface at 1340. Nested union join determination is a third form of data coercion, since it also converts the form of the data types of the inputs as received into the form required for the inputs.

SuchThat on the Second Argument processing—(1327): There is one complex transformation that must be simplified in order to generate LISAs for it. It is known as "suchthat on the second argument". The analysis of a directive with a suchthat on the second argument will cause additional directives to be added to the list of directives being maintained. The new directive must be analyzed by each step in the data flow analyzer. In particular, if one of the generated directives contains an additional suchthat on the second argument, this process will continue recursively. The following DFFL specification provides an example: Hits(Via, Contact suchthat Hits(Contact, Diffusion)). Here a LISA of (Via, Contact, . . . ) will be formed from an intrusion search, and then walked. Since the walking of a LISA occurs in a linearization order as specified by the graph of instances in the LISA, the walking sequence will be based on instances of Via shapes. A second LISA is required, based on (Contact, Diffusion, . . . ), for evaluation of the "hits" function, because all shape-to-shape functions must operate only on data contained in a single LISA. If this second LISA is linearized, it will be in an order based on instances of the contact shapes. The resultant linearization sequences of the two LISAs cannot be merged, because instances of via shapes are independent of instances of contact shapes. Thus, another technique must be invoked to allow the simple linearization of this LISA. This technique involves forming two additional LISAs, one of (Contact, Diffusion, . . . ) and one of (Contact, Via, . . . ). These two LISAs are walked in linearized order to produce instances of (DiffusionContact, Via, . . . ). By reversing the order of the instances, pairs of instances of (Via, DiffusionContact, . . . ) are defined. These pairs form a LISA of (Via, DiffusionContact, . . . ) which is simple enough to be walked for the directive.

In summary, when the analyzer detects an expression of the type "suchthat on the second argument" it must create a new directly called a complex intrusion search. The analyzer then adds the directive to the list of directives and modifies the data flow dependency graph for the program. All expressions can thus be decomposed into one of four basic types of inputs: level specifications, derived shapes, complex intrusions, and computed shapes. These inputs are then reduced to a set of simple LISAs.

Caching—(1328): The last processing step for the data flow analyzer is caching. Caching is an optimization feature which saves results whose computation is time consuming. At creation, each function is given a property of "expensive" if it is anticipated that computing the function will require greater than some threshold amount of processor resource. In the preferred embodiment, this threshold is set at 10,000 computer instructions. Then, during dataflow analysis, for each function having the property "expensive" the analyzer defines storage to cache its output. At execution time, when a directive computes a cached value it is stored, so that subsequent directives can use the cached result during their execution.

Code Generator/Diagnostic Formatter

The remaining two components of the application generator, the code generator shown at 1350 (including a program model library at 1360) and the diagnostic formatter shown at 1370, use programming techniques well known in the computer programming art, and accordingly will not be described in detail.

Application C++ Program

The output of the code generator is the C++ encoding of the design verification program that implements the application. This is shown at 1380. In summary this embodies the steps of clustering the checks, building the humungous LISA for each cluster, walking the humungous LISA in pro-order sequence, determining for each node visited in the humungous LISA the relevant LISA to be updated, and performing the checks defined in this LISA when the post-order state of the LISA indicates that all data for a sub-tree is present in the LISA.

The structure of the design verification program, previously outlined in part in FIG. 12, is as follows:

1. Top level mainline
   a. Allocates temporary memory that is global to the entire program, including data shared between clusters
   b. Invokes a physical design data base build program to load the required design levels from the user's design
   c. Invokes each of the ClusterMains in the application program
   d. Performs housekeeping and exits
2. ClusterMain for each cluster
   a. Allocates temporary memory that is global to the cluster, including data for transform path spines (TPSs) for each LISA and storage for intermediate results from functions
   b. Invokes the physical design data base build program to perform intrusion searches
   c. Sorts the intrusion pairs by the pro-order ILT node sequence number into one large LISA, a humungous LISA
   d. Performs a walk of the humungous LISA which generates updates in the TPSs of the individual LISAs. At each step of the walk, the next state in the humungous LISA is examined to see if updating a constituent LISA would cause a state change of the post-order node sequence of that LISA. A post-order state change it deemed to occur if the post-order number for the next intrusion pair in pre-order sequence lies in a different sub-tree from the one rooted at the current post-order state. If the update would cause a state change, the checks for the current state are performed. After the checks have been performed the update continues.
   e. Performs housekeeping and exits
3. CheckingProc for each check
   a. Performs a "done state" check to avoid recomputing the same check where there are several LISAs supplying input to the check.
   b. Executes a "domain check" to establish whether the present check is to be performed on the present instance of the shape. This may arise, for example, where it is desired to perform a check on a contact only if it is additionally covered by a via level. If the domain check fails, the check quits.
   c. Performs the check and returns the results to the ClusterMain C. Application Runtime Having generated the design checking application program, the next step in the design verification process is to run the application. For each checking cluster, this involves building the humungous LISA in planarized list form by sorting into pre-order sequence the intrusions found for each constituent LISA. Intrusions are generated by querying the nested data base which has been previously built for the design data.

The process of finding intrusions in a design data base is known in the art, and hence will not be described in detail. One important consequence of the way LISAs are built from an intrusion list sorted by pre-order node number is that they can be detected in the design data base in any order. This provides great latitude in the way the intrusion search is conducted. For example, the search can run top-down, bottom-up, cell rank or cell alphabetical order. In addition, different cells can be handled on different processors arranged into a parallel distributed computing environment. The intrusion search iterator will find shapes that come within a region of interest defined by the calling program. When a pair of shapes is found they are returned to the calling program with their shape instance paths denoted.

The control of LISA building and subsequent walking is provided by the LISA manager. LISA walking involves traversing the humungous LISA in pre-order sequence and pushing the intrusions found onto TPSs associated with the constituent LISAs. Checking/Analysis involves performing the design checks based on the LISAs. The checks for a LISA are triggered when the post-order state of its TPS indicates that all intruding data for a sub-tree is available in the stack. Checks are computed at the TPS check node, which is the root of the sub tree in the LISA spine, provided they have not already been computed and saved in the LISA spine, and provided the instance count at the check node is non-zero (that is, there are still unchecked instances at the check node).

Figure 24:
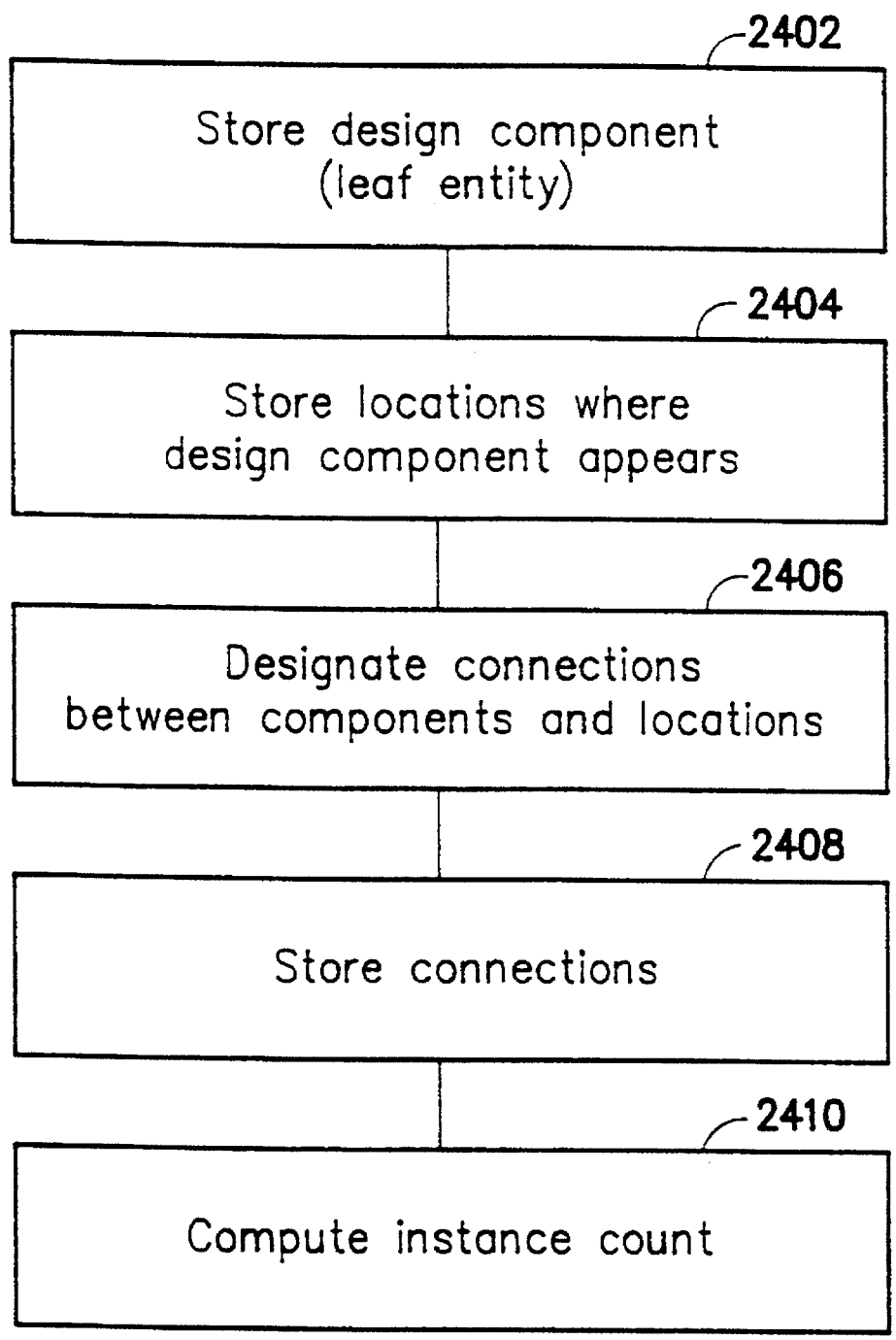
FIG. 24 shows a flow chart of the LISA process.

Shown in FIG. 24 is a flow chart illustrating the process used in accordance with the present invention to create a computer memory representation of a hierarehical circuit design, or a LISA circuit. At 2402, a VLSI design component representing a leaf design entity from the hierarehical circuit design is stored in computer memory. The design component may be an electronic device, a net, a microprocessor, a capacitance value, or a resistance value. At 2404, a set of locations in the design where the VLSI circuit design component appears is also stored in computer memory. This set represents instances of the leaf design entity. Next, at 2406, a set of links is associated with the VLSI circuit design component. The links connect various ones of the locations to one another to denote placement of the VLSI circuit design component within the hierarehical circuit design. The placement of a component may include placement within a higher level component in the design. At 2408, the set of links is stored in computer memory. Finally, at 2410, an instance count is computed denoting the number of instances of the VLSI circuit design component represented at the location the instance count is associated with. The instance count is represented by a pair of numbers, of which the first indicates the number of instances of the VLSI circuit design component actually represented at the location, while the second indicates the number of instances that could be represented at the location. An instance count of zero indicates that the associated location is omitted from the hierarehical circuit design. The instance counts thus provide a mechanism for maximally pruning the inverse layout graph so that every node has an exact corresponding location and placement in the hierarehical circuit design.

Figure 25:
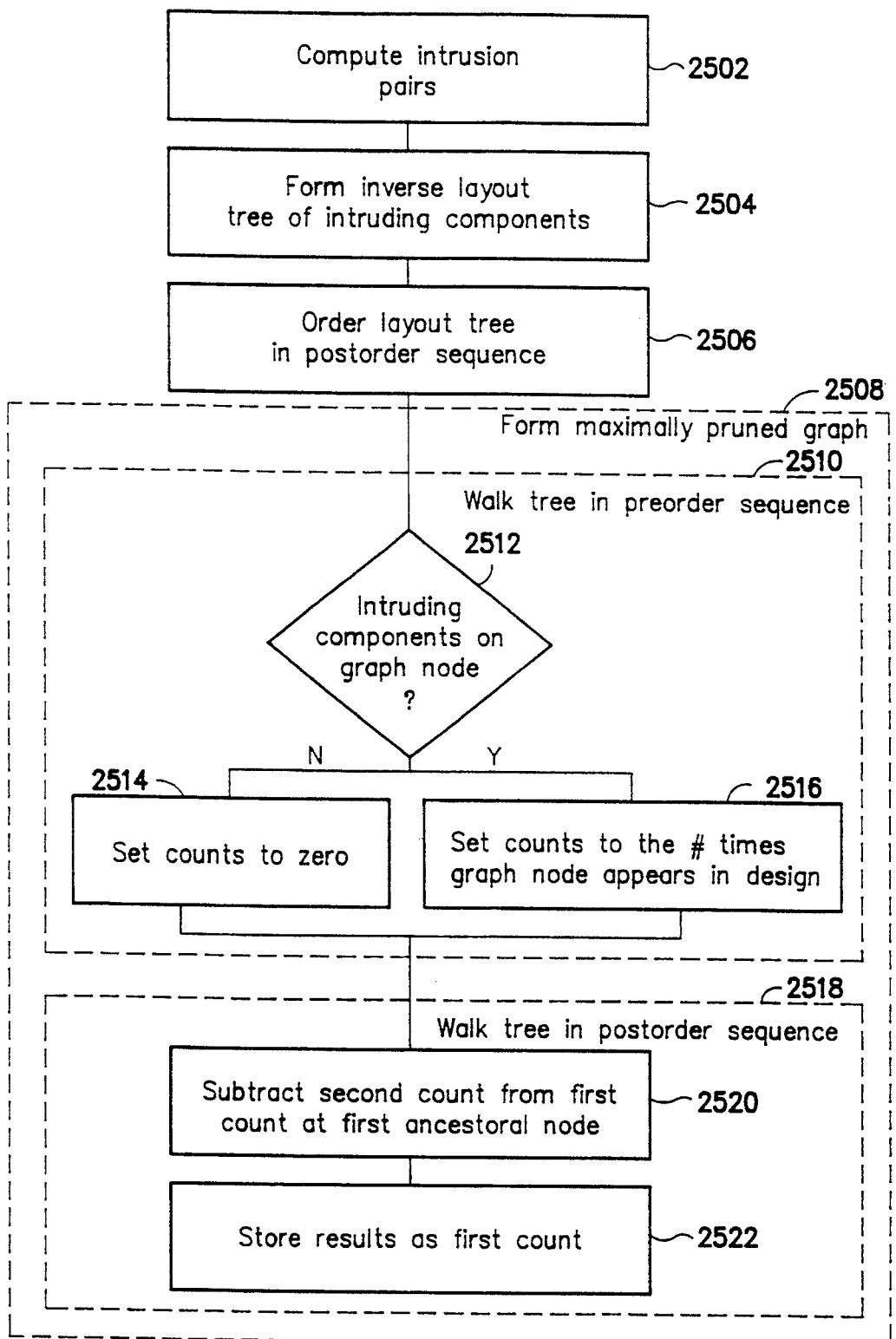
FIG. 25 shows a flow chart of the method for building a LISA.

Shown in FIG. 25 is a flow chart representing the process used in accordance with the present invention to build a representation of VLSI circuit component placements for components in a hierarehical circuit design using a LISA. At 2502, a set of pairs is computed representing VLSI circuit design component instances where intrusions of other VLSI circuit design component instances occur. In general, an "intruding" component is a VLSI circuit design component instance positioned within some predefined measure (distance, etc.) from another VLSI circuit design component instance. At 2504, a graph is formed of VLSI circuit design component instances where intrusions of other VLSI circuit design component instances occur. The intruding components are stored in computer memory in the form of an inverse layout tree representing component placements. The intruding components are themselves represented by intruding pairs, wherein the first portion is an instance of a root component while the second is an instance of an intruding component. At 2506, the intruded VLSI circuit design component instances are ordered in post order sequence. At 2508, a maximally pruned graph is formed of VLSI circuit component instances where intrusions actually occur by way of two walks through the inverse layout tree. The first walk occurs in preorder sequence as shown at 2510 generally. As each graph node is visited, if there are no intruding components on the graph node (2512) a pair of counts for the graph node is set to zero (2514). If there are intruding components, the pair is set to the number of times the graph node appears in the hierarehical circuit. design (2516). The pair of counts is stored in computer memory in association with the graph node. The second walk occurs in post-order sequence as shown at 2518 generally. As each graph node is visited, the second count is subtracted from the first count accumulated at the first ancestral node having a non-zero first count (2520). The first ancestral node for each graph node is the first intermediate node between the graph node and the design component represented by the graph node. The result is stored in computer memory in association with the graph node as the first count (2522). Thus, the first count identifies the number of instances of the VLSI circuit design component represented at the associated graph node.

Once a VLSI circuit design representation is built using the LISA concept, it is walked under control of the LISA manager. As described previously, the LISA walk involves examining intrusion pairs to determine whether adding them to the TPS stack would cause the post-order state of the TPS stack to change. In particular, if the post-order number of an intrusion pair under consideration is smaller than the current state of the TPS stack, the data is added to the TPS stack, and stack's post-order state updated to reflect the new state. Instance counts are updated to reflect the addition of the new nodes to the TPS stack. If the post-order number of the intrusion pair is the same as the current state, the new data is added as an additional shape intruding into the current state (node) of the TPS stack. However, if inserting the new data into the TPS stack will cause the post-order number to increase, then the data currently in the TPS stack includes all the data that contributes to a design check to be processed. Thus, the check may be dispatched. After the check is completed, data for the node at the post-order state (representing the check that has just been processed) is removed from the stack, and the state of the TPS stack is updated to the post-order state of the data still in the stack. The intrusion pair's post-order number is then examined again to determine whether an event must be dispatched in the current state of the TPS, or whether the new data is to be added to the stack. The result achieved by this walking procedure is to process the design checks in post-order sequence with respect to the various instances of each root shape. For any given shape, the sequence of design instance processing causes the checks to examine design data closest to the prime cell, thus allowing significant nested instances to be identified and checked in the most nested form possible.

Figure 26:
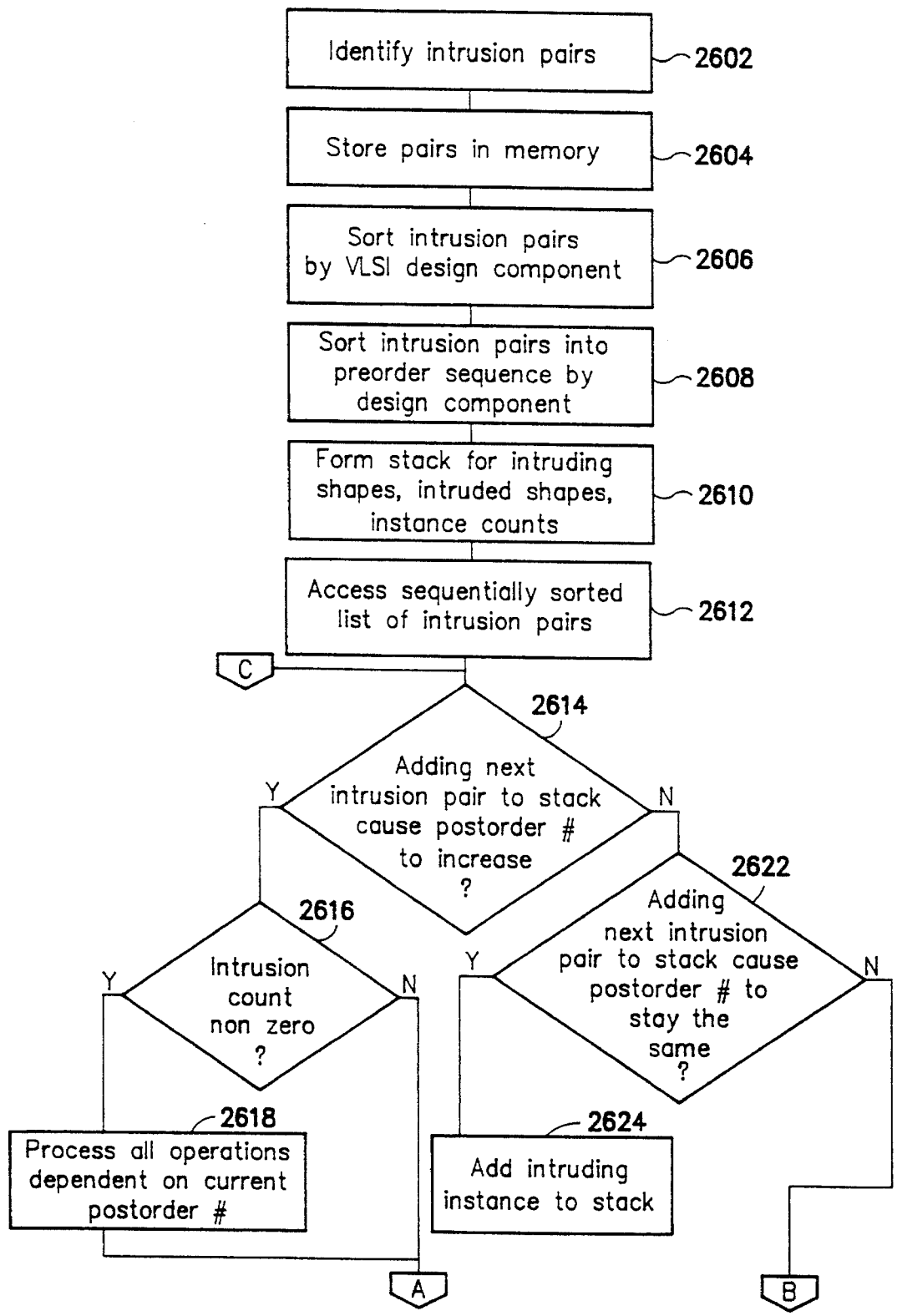
FIG. 26 shows a flow chart of the method for building and walking a LISA.

Shown in FIG. 26 is a flow chart illustrating the particulars of the process used in accordance with the present invention to simultaneously build and walk a LISA representative of design component intrusions (that is, to verify a hierarehical circuit design). At 2602, intrusion pairs are identified between two selected VLSI circuit design levels and within a region of interest. Each intrusion pair includes an intruded VLSI circuit design component instance and an intruding VLSI design component instance. At 2604, the intrusion pairs are stored in computer memory. At 2606, the intrusion pairs are sorted by VLSI circuit design component. Each VLSI circuit design component instance represented by each intrusion pair is denoted as its preordered node number as derived from an inverse graph representing the portion of the hierarehical circuit design rooted at the VLSI circuit design component instance. At 2608, all intrusion pairs for each VLSI circuit design component are sorted into preordered sequence. At 2610, a stack is formed in computer memory for each VLSI circuit design component. The stack contains the VLSI circuit design component instances for which intrusions have been detected, as well as the intruding VLSI circuit design component instance that creates the intrusion and the instance counts for the VLSI circuit design component instances. At 2612, the sequentially sorted list of intrusion pairs is accessed from computer memory.

At 2614, it is tested whether adding the next intrusion pair to the stack will cause the post order number to increase. If so, at 2616 it is tested whether the intrusion count is non-zero. If this is true, all operations dependent on the current post order number are processed at 2618. Then, whether or not the intrusion count is non-zero, the VLSI circuit design component instance associated with the current post-order number is removed from the stack. This operation has the effect of updating the state of the stack. At this point, steps 2614–2620 are repeated until adding the next intrusion pair to the stack floes not cause the post-order number to increase.

If adding the next intrusion pair to the stack will cause the post order number to stay the same (2622), the intruding VLSI circuit design component instance is added to the stack at 2624.

Figure 27:
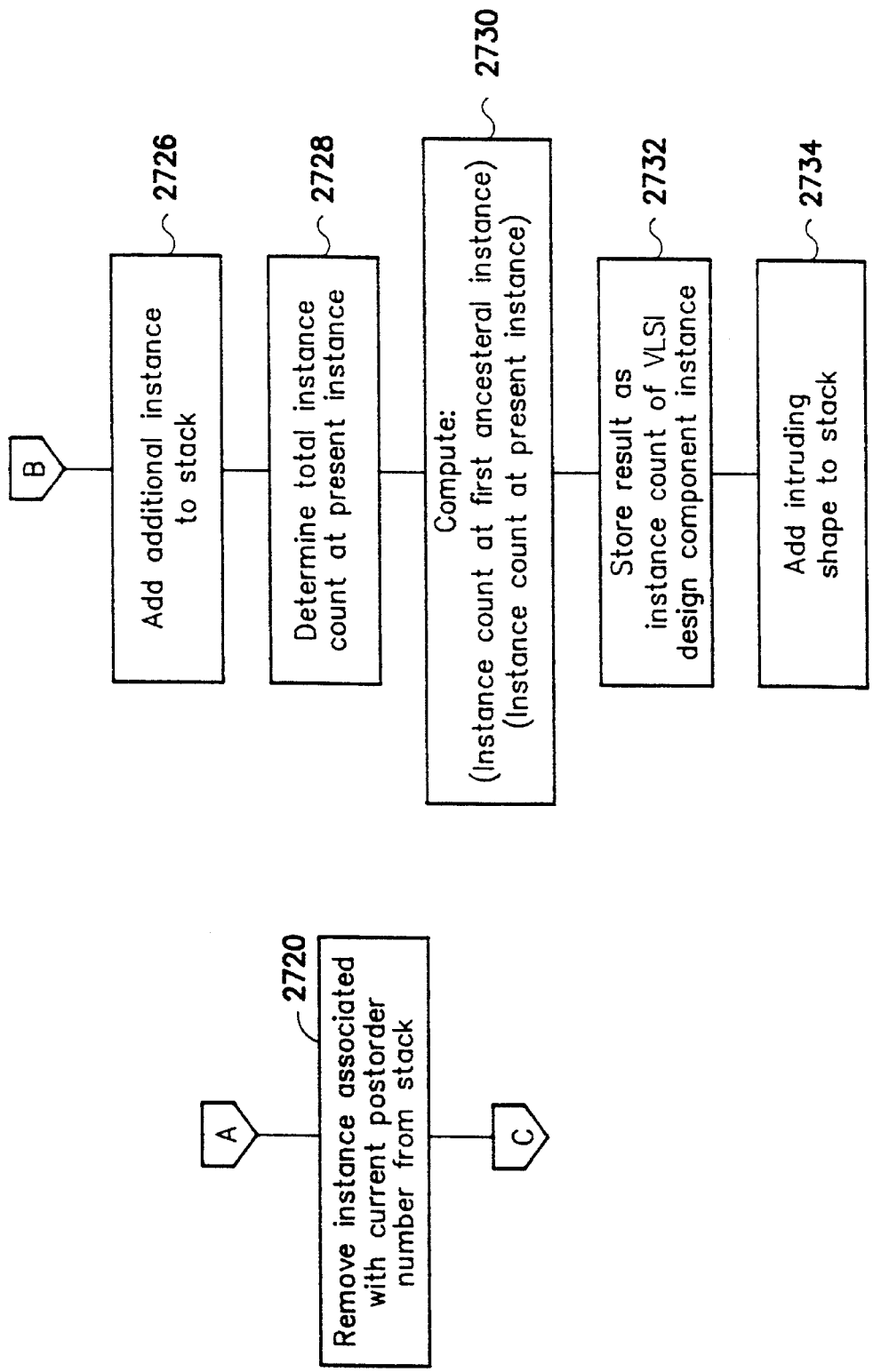
FIG. 27 is a continuation of FIG. 26.

Processing then continues in FIG. 27. If adding the next intrusion pair to the stack will cause the post order number to decrease, steps 2726–2734 are executed. At 2726, the additional VLSI circuit design component instance is added to the stack. At 2728, the total instance count is determined for the present VLSI circuit design component instance. At 2730, the system computes the difference between the total instance count at the present VLSI circuit design component instance and the total instance count accumulated at the first ancestral VLSI circuit design component instance having a non-zero instance count. If a VLSI circuit design component instance contributes no instance count to the total, the instance count for that VLSI circuit design component instance is set to zero. At 2732, the result of the subtraction step is stored as the instance count of the VLSI circuit design component instance. Finally, at 2734, the intruding shape is added to the stack.

V. Nested Checking Example

Shown in FIG. 28 is a group of exemplary checks which have been specified to run against a logic design. These checks share the same base design level, and accordingly are grouped into one run-time checking cluster. Shown in FIG. 29 are the LISAs required for this cluster; the checks that will have to be dispatched as shape instances in each LISA will be found subsequently by the intrusion search. Shown in FIG. 30 is the minimum number of intrusion searches required to build these LISAs at run-time. All of the above is assumed for purposes of this example to have been determined previously by the application generator.

Figure 31A:
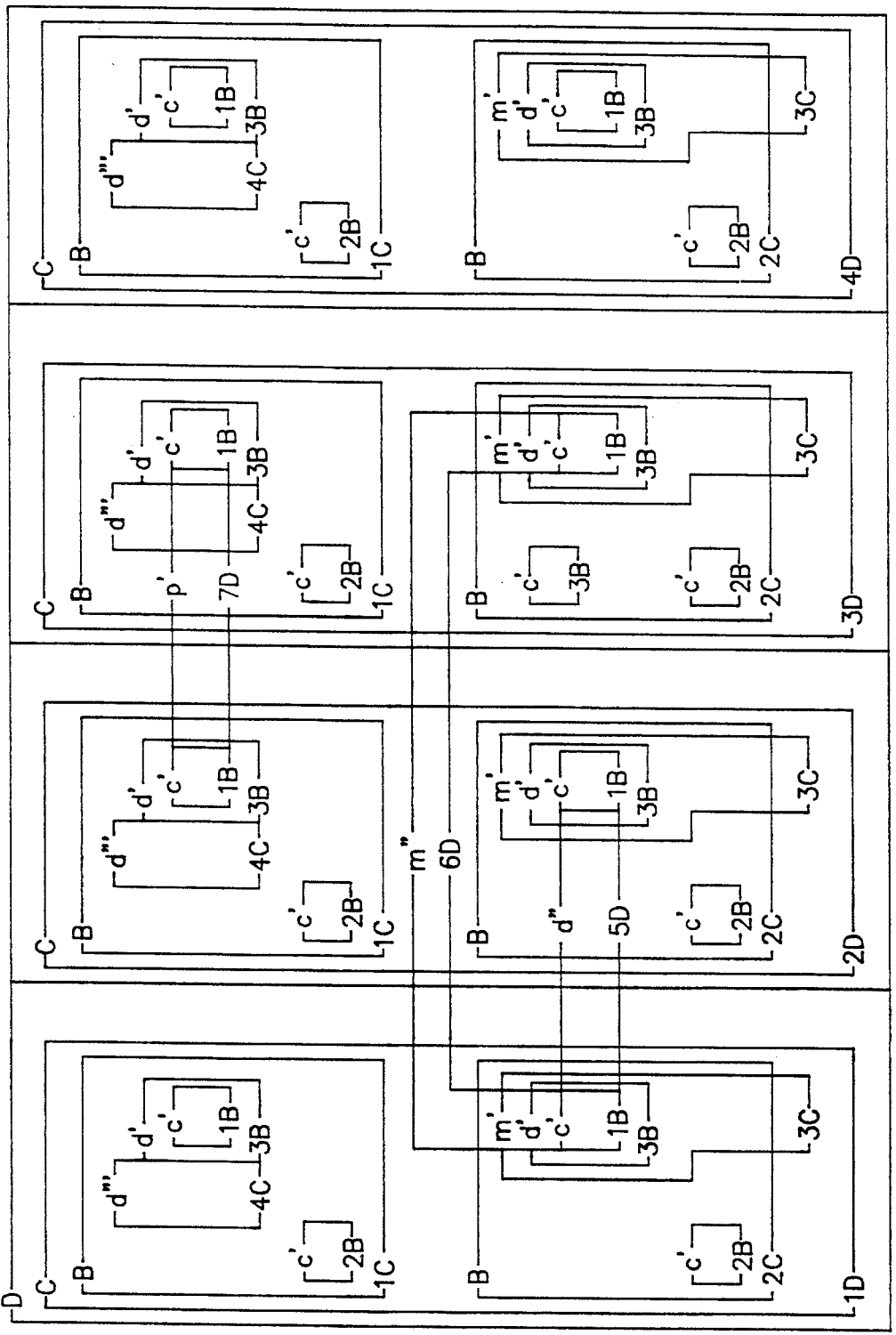
FIGS. 31A and 31B are schematic diagrams respectively showing an examplary hierarchical layout and the resulting cell transform list and inverse layout tree.
Figure 31B:
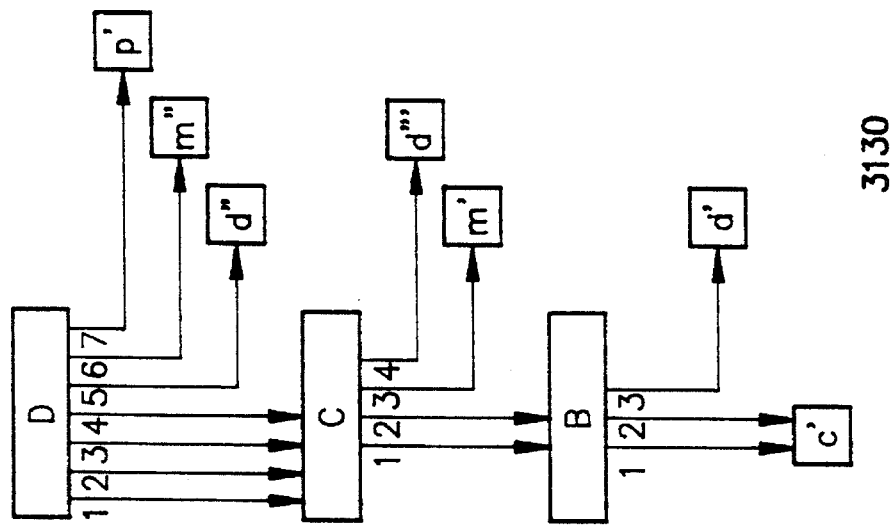

In addition to the above checks and the resulting LISAs and intrusion searches, there is provided for purposes of this example a hierarehical circuit design, shown in FIG. 31A at 3110. In FIG. 31B, 3120 shows the cell transform list for this hierarehical layout. 3130 shows the same information presented in the form of a layout tree. This design will be used to demonstrate various aspects of the present invention described above, including construction of the ILT, use of the ILT to generate intrusion pairs, use of intrusion pairs to form LISAs, and the LISA walk to perform the checks identified for a cluster.

Figure 32:
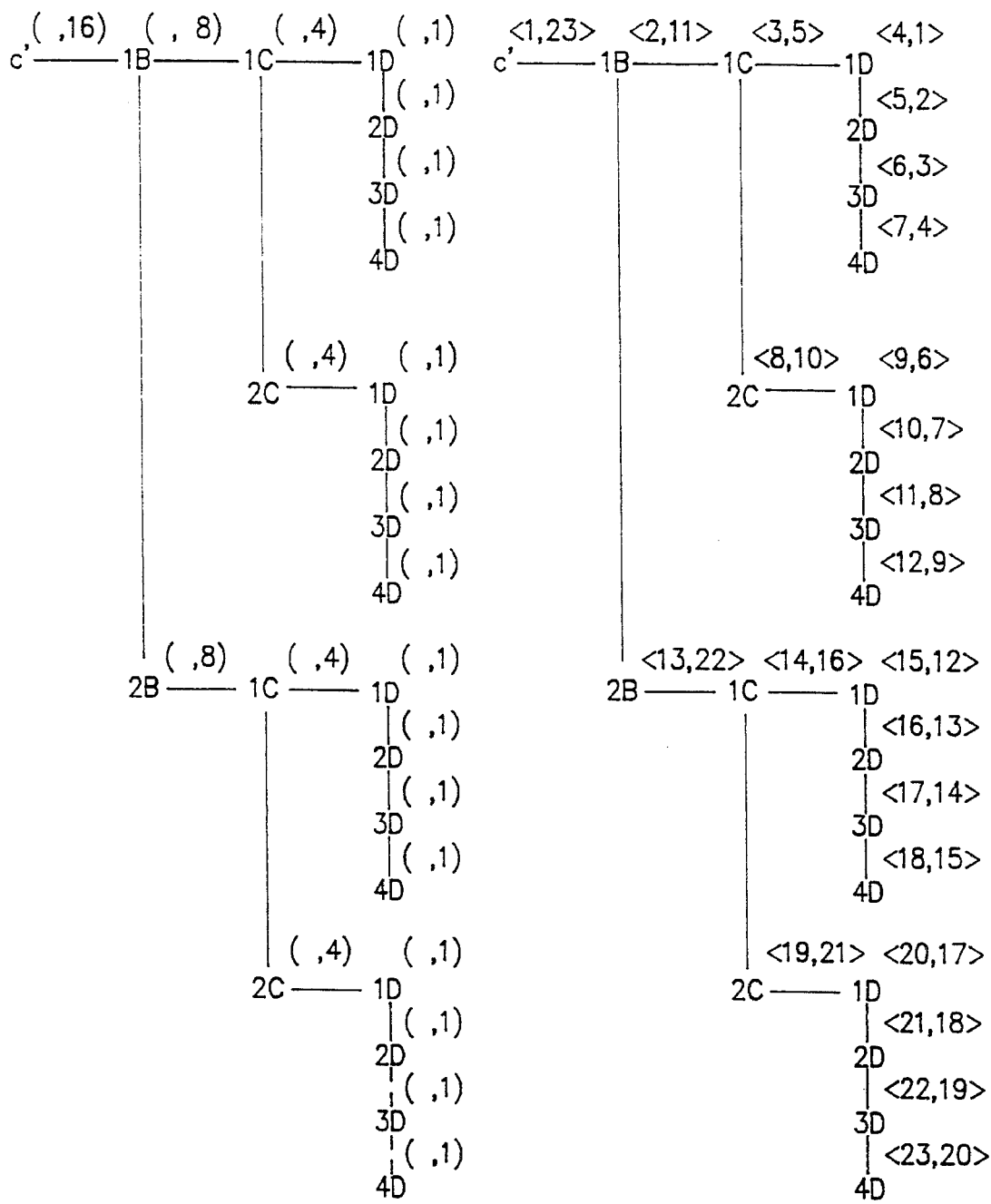
FIG. 32 is a representation of the inverse layout tree for the leaf shape c' in FIG. 14, showing instance counts and pre and post order numbers at each node.

FIG. 32 shows two expressions of the ILT. More particularly, at 3210 the ILT is shown with instance counts denoted in parenthesis adjacent each cell. They illustrate that, for example, of the 16 instances of the c' cell, 8 occur at the 1B level and the other 8 at the 2B level. At 3220 the same ILT is shown, but with pre and post-order node numbers denoted in braces adjacent each cell. They illustrate the order in which the nodes would be visited in a pro-order and a post-order walk of the ILT.

Next, the intrusion pairs are generated and the four LISAs from FIG. 29 are walked by making a single pass through the sorted list of nested intrusion pairs. This has the same effect as a linearization of the tree walk of a LISA, and thus avoids actually building the LISAs. The process is described as follows.

LISA1—LISA(Contact, Diffusion, 0)

Figure 33:
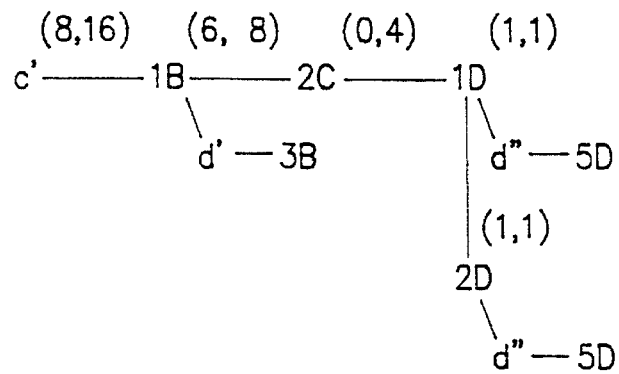
FIG. 33 is a representation of a LISA identified as LISA1(Contact, Diffusion, 0).

The intrusion search (Contact, Diffusion, 0) generates the intrusion pairs shown in FIG. 33 at 3310. The value following the intruding shape is the actual distance found between the shapes. By storing the actual intrusion distance in the intrusion pairs it is possible to establish which intrusion pairs belong to which LISAs based upon the region of interest. These intrusions Form LISA1, as shown at 3320.

LISA2—LISA(Contact, Diffusion, 2)

Figure 34:
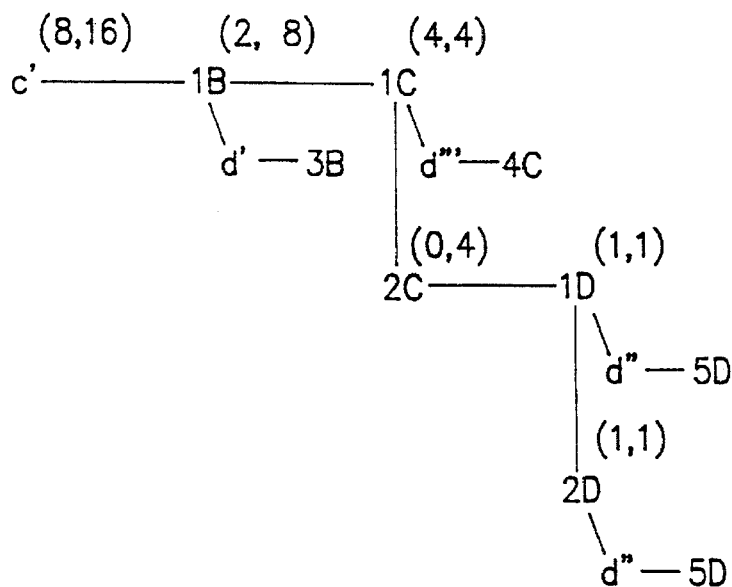
FIG. 34 is a representation of a LISA identified as LSA2(Contact, Diffusion, 2).

The intrusion search (Contact, Diffusion, 2) generates the intrusion pairs shown in FIG. 34 at 3410. Note the additional intrusion due to the increased region of interest. These intrusions form LISA2 as shown at 3420.

LISA3—LISA(Contact, Metal 1)

Figure 35:
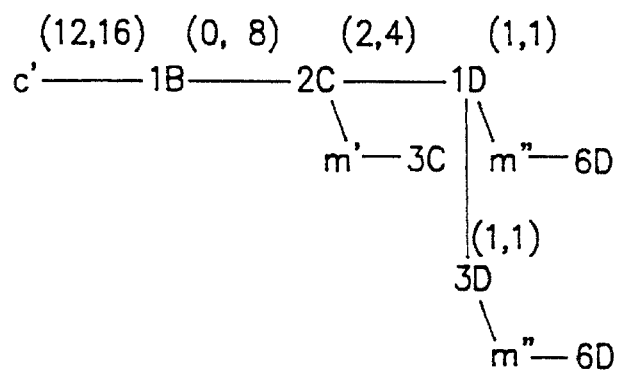
FIG. 35 is a representation of a LISA identified as LISA3(Contact, Metal, 1).

The intrusion search (Contact, Metal, 1) generates the intrusion pairs shown in FIG. 35 at 3510. The region of interest is 2. These intrusions form LISA3 as shown at 3520.

LISA4—LISA(Contact, Metal, 2)

Figure 36:
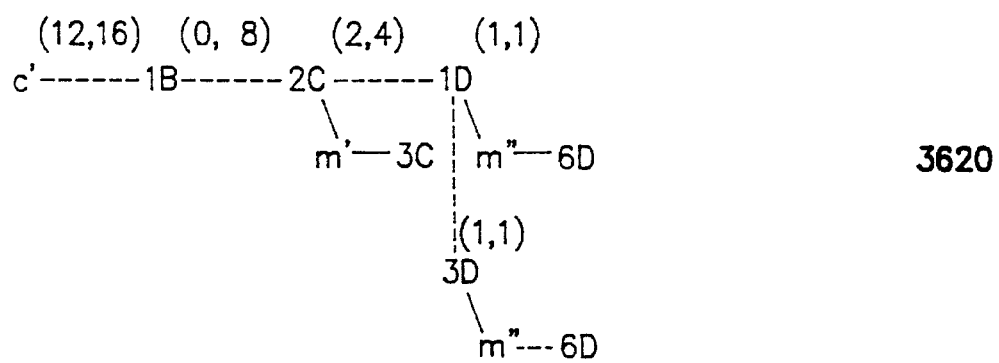
FIG. 36 is a representation of a LISA identified as LISA4(Contact, Metal, 2).

The intrusion search (Contact, Metal, 2) generates the intrusion pairs shown in FIG. 36 at 3610. The region of interest is 2. These intrusions form LISA4 as shown at 3620.

The Humungous Lisa combining LISA1–4

Figure 37:
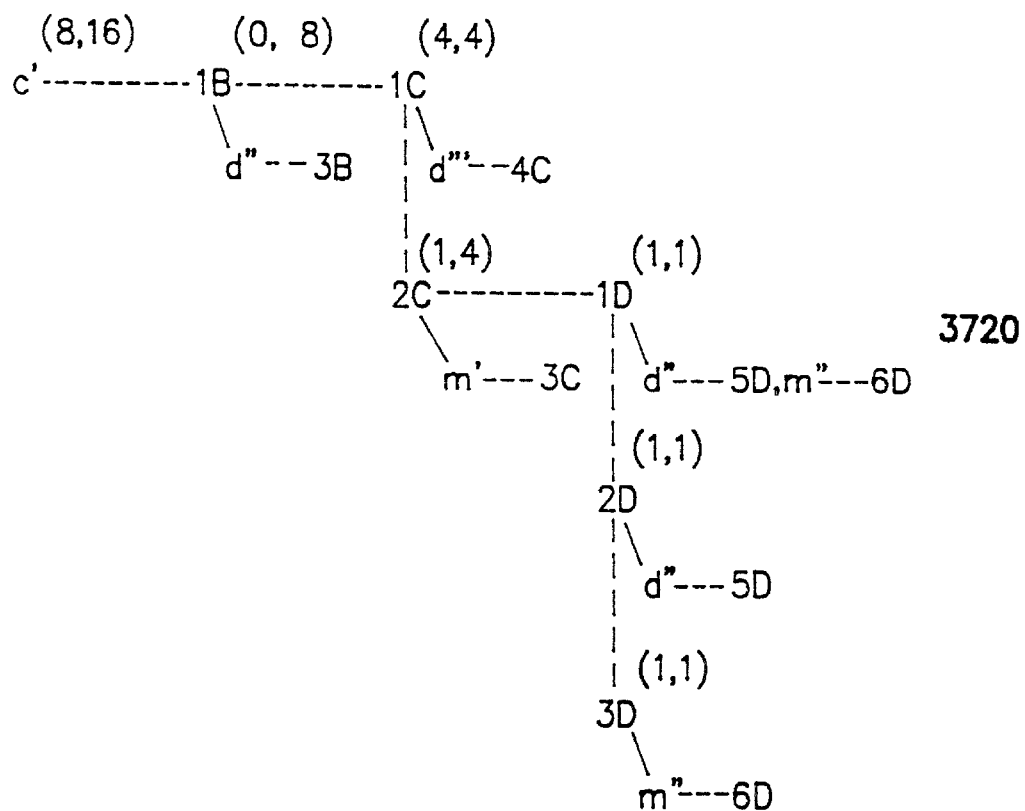
FIG. 37 is a representation of the humungous LISA formed from LISAs 1–4.

FIG. 37 at 3710 shows all the intrusion pairs that have been found for LISAs 1–4. These intrusion pairs define the humungous LISA shown in FIG. 37 at 3720.

Walking the Humungous LISA effectively

Figures 38, 39:
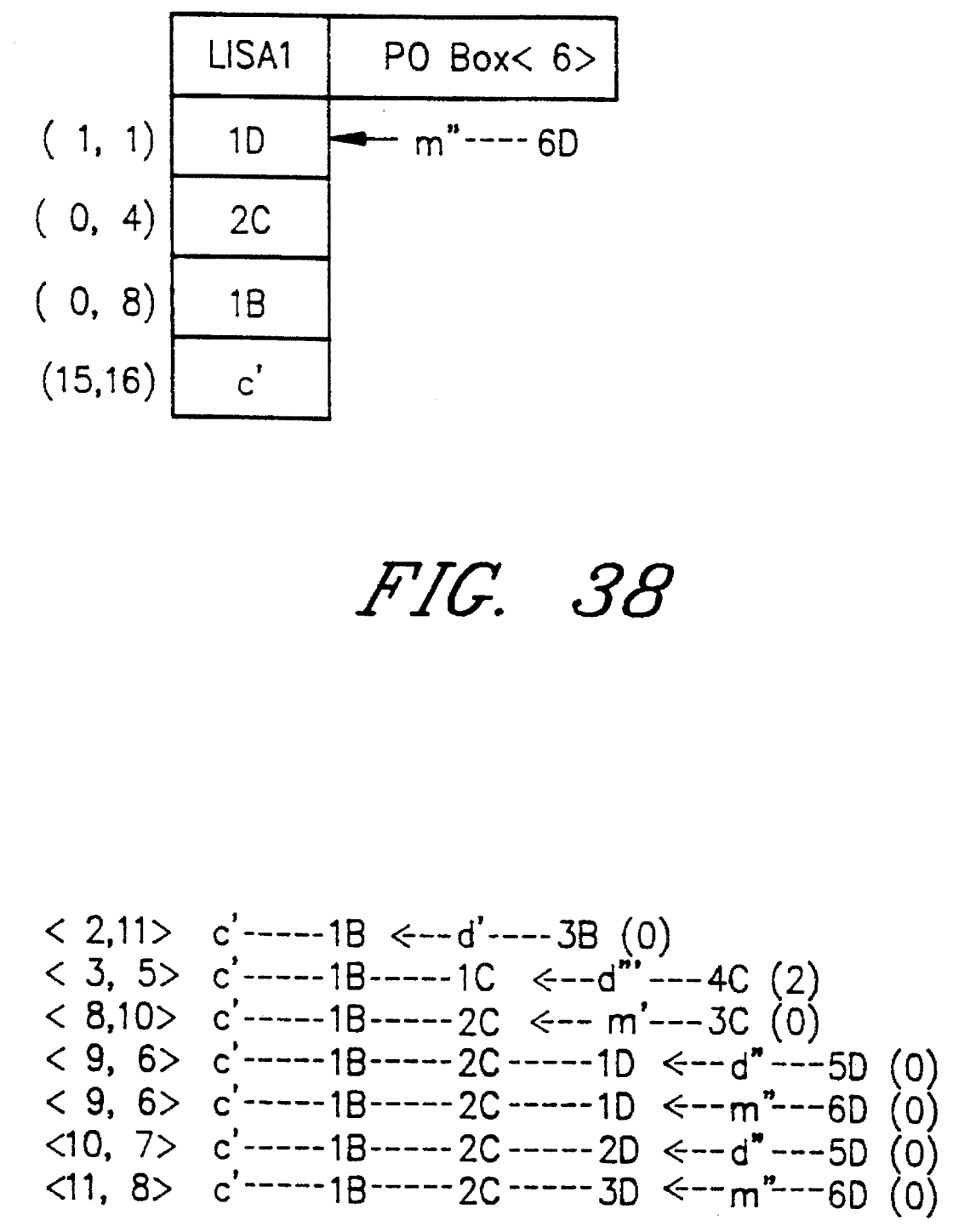

Next, the sorted list of intrusions is processed in a manner that effectively walks the humungous LISA without actually building it in memory. The walking of a LISA results in transform paths and intruding shape information. A transform path spine (TPS) is used to hold the transform path or the instance of the shape being checked. The intruding data is attached to the TPS. For example, the intrusion pair (<9,6> c'---1B---2C---1D <--m"--6D) produces a TPS as illustrated in FIG. 38. This TPS shows the list of transforms For the shape instance, the intruding shape, the instance counts at each node, and the post-order ILT node sequence number (shown in the PO box). Each LISA has its own TPS. The "state" of the walk of a LISA is reflected in the "state" of the contents of the transform path in the TPS. The TPS is a stack. Data is pushed onto the stack in the pro-order node sequence. Data is checked and removed from the stack in the post-order node sequence. By sorting the intrusion pairs by the pre-order node sequence, all of the data needed for a check will have been pushed onto the stack before the check is performed.

Figures 40, 41:
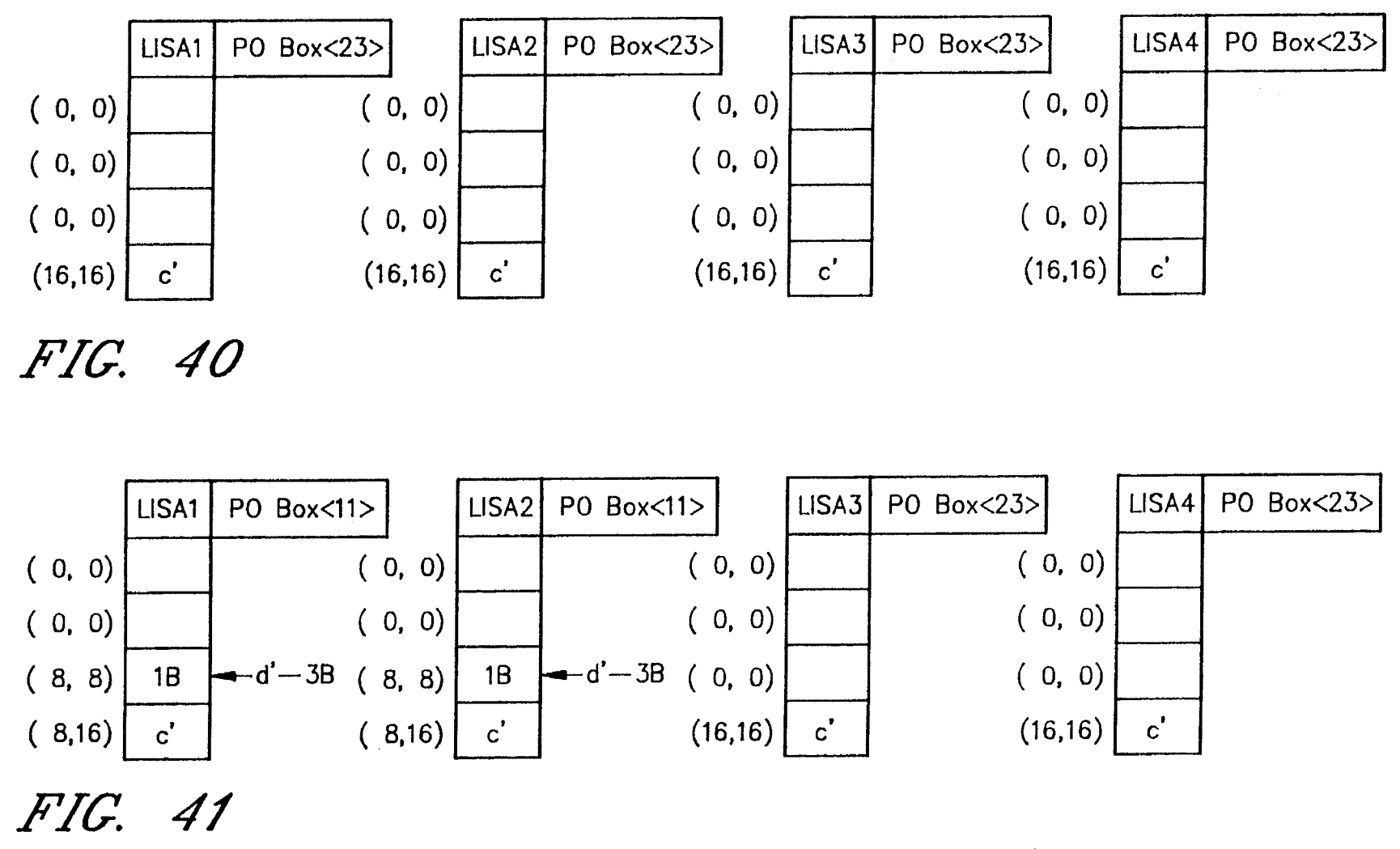

FIG. 39 shows all of the intrusion pairs included in the humungous LISA, sorted by root shape and then into the pre-order ILT node sequence. Processing the sorted intrusions shown in FIG. 39 effectively walks the humungous LISA and generates events in each of the constituent LISAs. Each event in each LISA may cause instance counts to be updated. Each LISA has its post-order state in the PO Box. There is one post-order state which is the smallest post-order state for all the LISAs. In the example, the TPSs are initialized with the root of the first sorted intrusion pair, which will show the state of a LISA before any data has been added to it. This is illustrated in FIG. 40. The first intrusion (<2,11> c'---1B <--d'--3B (0)) updates LISA1 and LISA2, as shown in FIG. 41. The next intrusion (<3,5> c'---1B---1C <--d'"--4C (2)) updates LISA2 as shown in FIG. 42. The next intrusion (<8,10> c'-----1B------2C <--m'--3C (0)) updates LISA3 and LISA4, but also causes the post order states for these LISAs to become 10, which is greater than 5. Therefore, the checks for all LISAs having post-order states of 5 must be dispatched. Since LISA2 has a post-order state of 5, it is dispatched. This causes the check of DRa to be performed at node c'---1B---1C. In order to perform check DRa, a MEETS function which determines whether two shapes touch or overlap is performed against LISA2 at node c'--1B. The particulars of the MEETS function are not the subject of the present invention; numerous techniques are known in the art for determining this function, any of which may be used in conjunction with the present invention. The result of the MEETS function is stored at the applicable node in the TPS of LISA2. Subsequent checks that use the information in LISA2 at node c'--1B will not have to recompute that data. Once the check has been performed on LISA2, data is removed from the LISA2 TPS. FIG. 43 shows the LISAs after removal of the data.

Figures 44, 45:
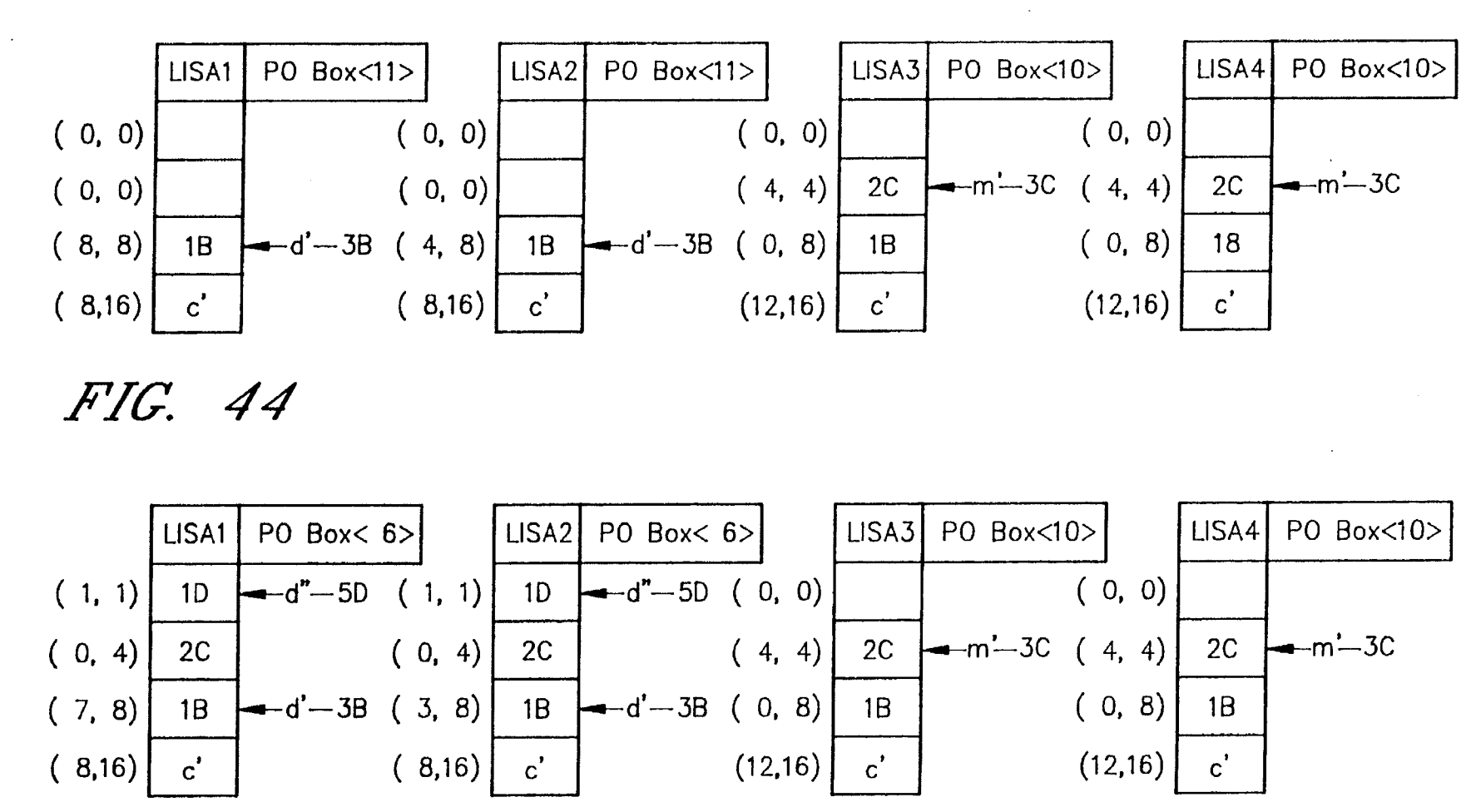
Figures 46, 47:
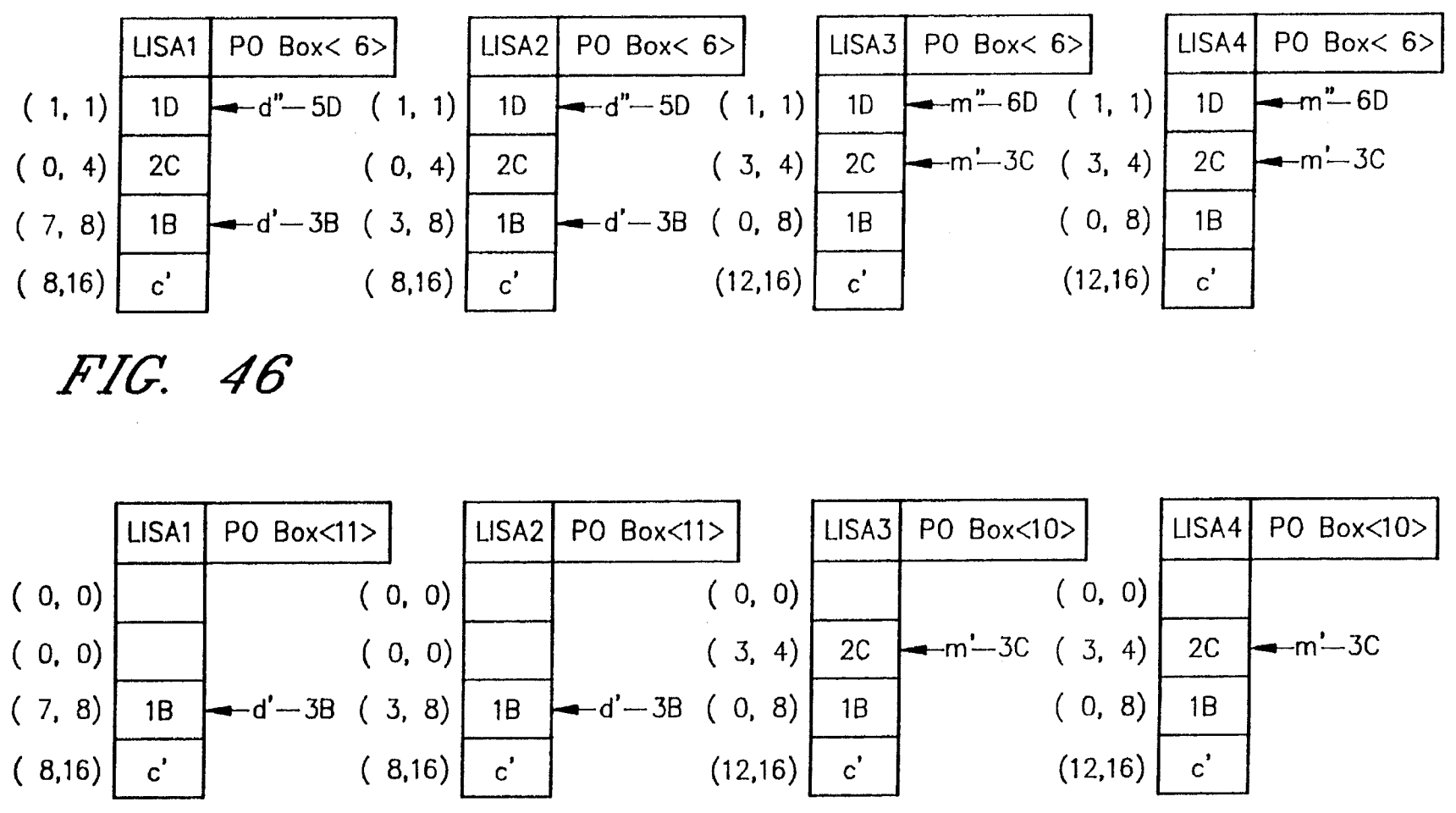

The next intrusion (<8,10> c'---1B---2C <--m'--3C (0)) updates LISA3 and LISA4 with the current global post-order state being 10 as shown in FIG. 44. The next intrusion (<9,6> c'-----1B-----2C-----1D <--d"--5D (0)) updates LISA1 and LISA2 as shown in FIG. 45. The next intrusion (<9,6> c'-----1B-----2C-----1D <--m"--6D (0)) updates LISA3 and LISA4 as shown in FIG. 46. The next intrusion (<10,7> c'-----1B-----2C-----2D <--d"--5D (0)) will update LISA1 and LISA2 and cause the post-order state of LISA1 and LISA2 to change from 6 to 7. Therefore, the checks for all LISAs with a post-order state of 6 must be dispatched, namely DRa, DRb, and DRc. Prior to the insertion of the next intrusion pair the states of all the LISAs must be updated by removing intrusions from the stack until the post-order state is changed. FIG. 47 shows the updated LISAs after the data has been removed from the stack.

Figures 48, 49:
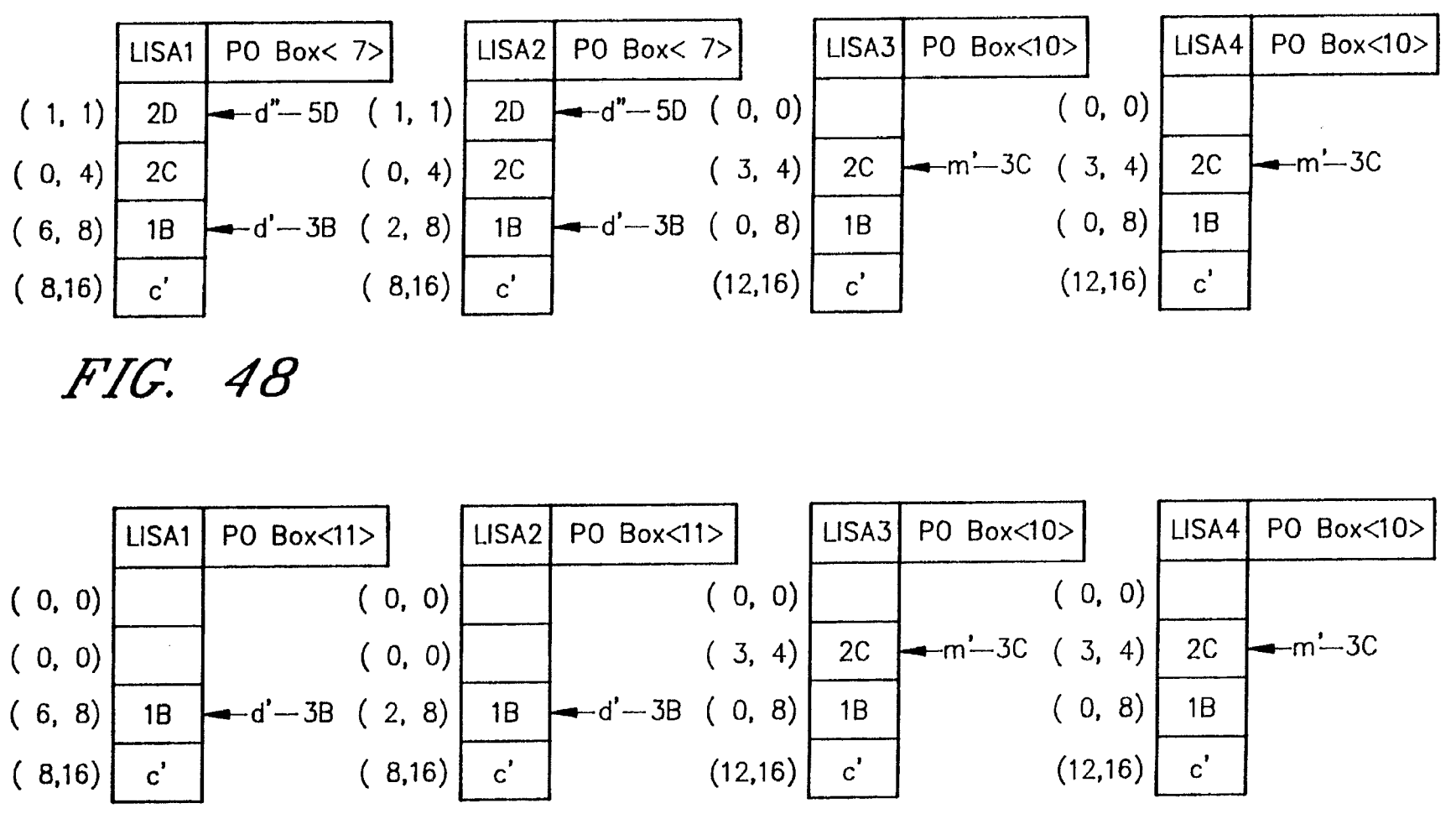

The next intrusion (<10,7> c'-----1B-----2C-----2D <--d"--5D (0)) updates LISA1 and LISA2 as shown in FIG. 48. The next intrusion (<11,8> c'-----1B-----2C-----3D <--m"--6D (0)) will update LISA3 and LISA4 and cause a post order state change from 7 to 8, requiring the checks for post order state 7 to be dispatched. The relevant checks involve DRa and DRb from LISA1 and DRa from LISA2. Note that because the check maintains a state, it will not execute twice even though it was dispatched from the state change of two different LISAs. FIG. 49 shows the updated LISAs after the data has been removed from the stack.

Figures 50, 51:
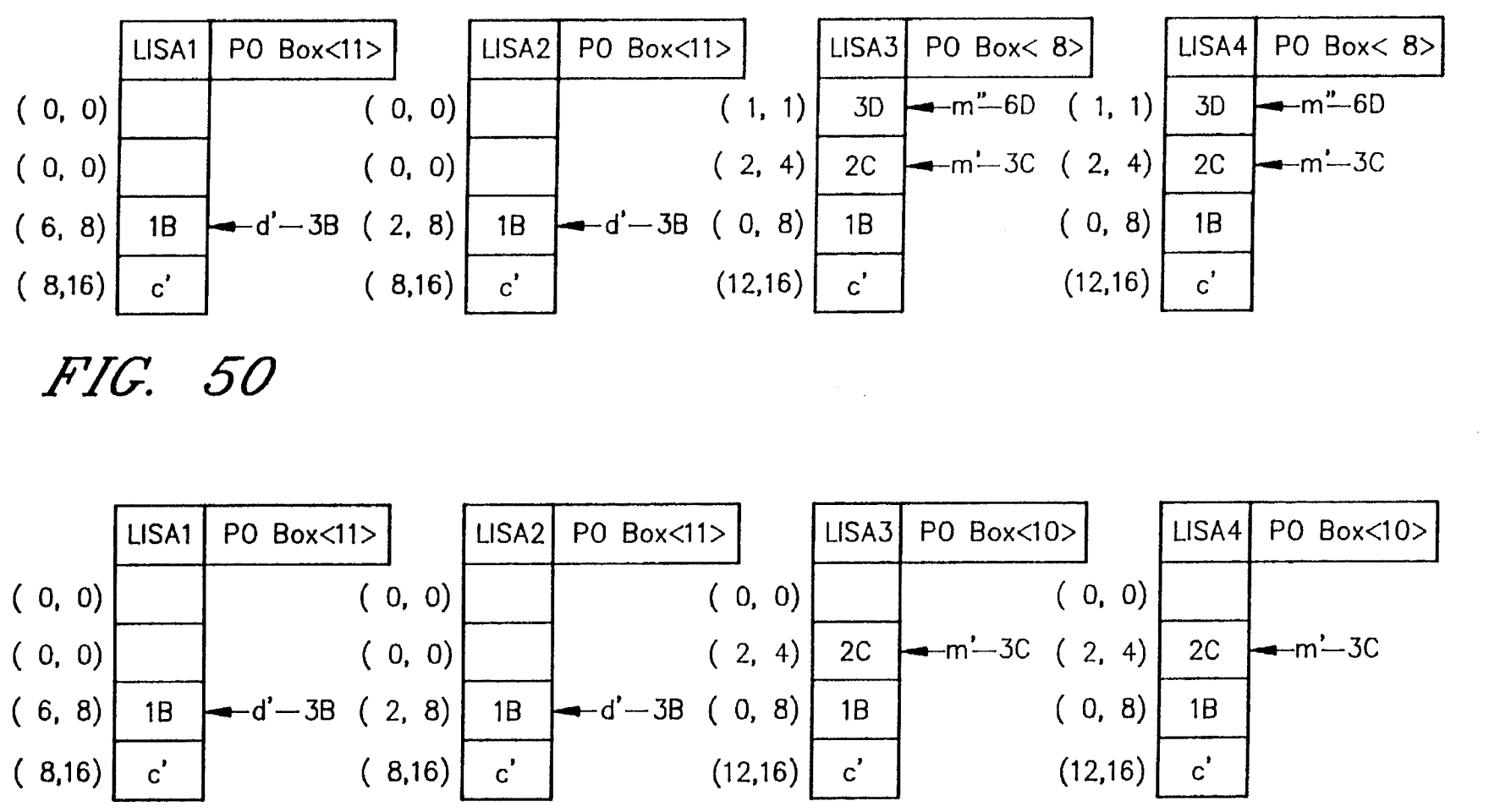
Figures 52, 53:
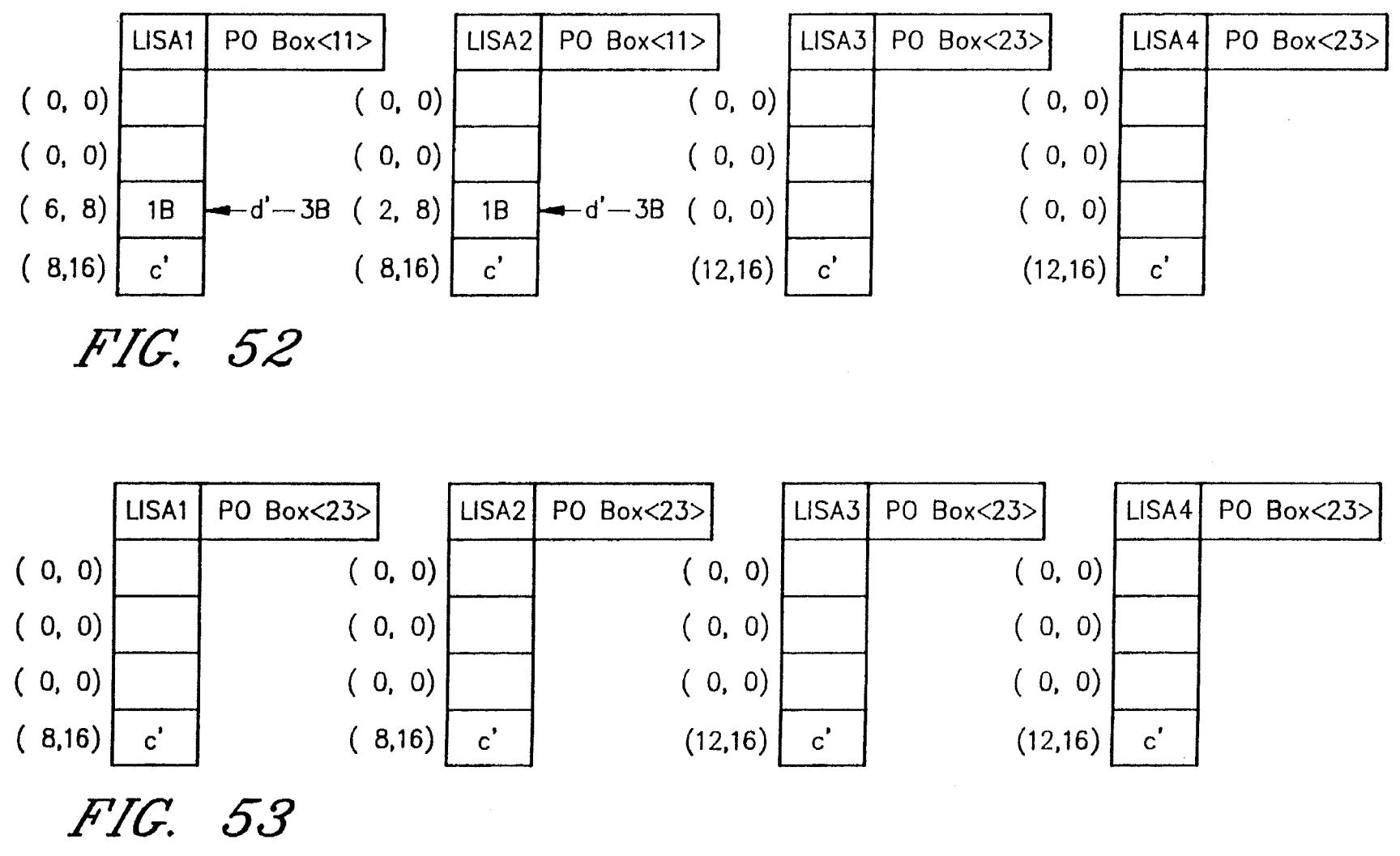

The next intrusion (<11,8> c'-----1B-----2C-----3D <--m"--6D (0)) updates LISA3 and LISA4 as shown in FIG. 50. It is also the last intrusion. Thus, all checks contained in the LISA stacks are performed by flushing the LISA stacks. First, the checks at post-order state 8 are performed including the check of DRc from LISA3 and DRb from LISA4. Then LISA3 and LISA4 are updated as shown in FIG. 51. Next, post-order state 10 is processed, including the check of DRc from LISA3 and DRb from LISA4. FIG. 51 shows the updated LISAs. Next, post-order state 11 is processed, including the check of DRa and DRb from LISA1 and DRa from LISA2. FIG. 52 shows the updated LISAs. Finally, post-order state 23 is processed, including the check of DRa and DRb from LISA1, DRa from LISA2, DRc from LISA3 and DRb from LISA4. The resultant, empty LISAs are shown in FIG. 53.

The empty LISAs show that there are instances of contact shape c' which have not been examined. This arises from the fact that there are 8 contact shapes that do not have any diffusion and 12 contact shapes that do not have any metal, all of which are shown in the layout of 3110. Since check DRc required all contacts to be covered by metal, these 12 instances are in error. These instances may be accumulated during the LISA walk by noting from the post-order state of the LISA when instances in the ILT are passed over. They are subsequently reported to the designer for corrective action.

VI. The Virtual LISA

As described previously, the present invention includes a batch intrusion search which is performed to find intrusion pairs of interest. These are then sorted into the pre-order sequence determined by the inverse layout tree rooted at the base shape of each intrusion pair. To process data from the sorted list, data is pushed onto a TPS in pre-order node sequence, processed, and popped off the TPS in post-order sequence. However, when design data is analyzed in which there are a significant number of flat intrusions at or near the root cell of the design, as for example is typically found when analyzing designs created from automatic placement and wiring programs, the list of intrusions becomes very large, and can require significant time to sort as well as considerable storage space to store. In accordance with the present invention, a construct called a virtual LISA is provided to allow flat intrusion pairs to be determined dynamically in pre-ordered sequence as if they had been determined and stored prior to the sort. This eliminates the storing and sorting of intrusion pairs from flat data.

Instead of performing a batch intrusion search on the shapes in flat cells, nested intrusion searches are performed for all cells except those identified as having large numbers of shapes (that is, "flat" cells). During the LISA walk, the TPS is processed as usual, but with a post-order "monitor" which detects both pre-order nodes and post-order nodes that would be skipped because the nested intrusions have not yet been determined. When such nodes are identified, an intrusion search is initiated on the flat cell. The output of the intrusion search is either null, in which case the post-order state is skipped, or not null, indicating that intruding shapes are identified. When intruding shapes are present, the event is dispatched at the appropriate state of the TPS and the instance counts are updated. As with the normal LISA walk, when the event is completed, the intruding shapes are removed from the TPS, and the process continues. Using this approach, data is processed in the same sequence as if the intruding shapes had been found, stored, and sorted in the list of intruding pairs, but without storing and sorting the intruding shapes from flat data. The results appear as if they were generated in LISA walking sequence, and the nested results are the same as for LISA walking in post-order node sequence. The effect is therefore one of processing a "virtual LISA".

The design shown in FIG. 31 illustrates the sequence of operations involved in processing Virtual LISAs. It is assumed that the metal data in cell D is flat; thus, none of the metal/1 shape intrusions of cell D are included in a LISA. LISA3 will have only an intrusion on c' at node c'---1B---2C. This node is at pre-order, post-order location <8,10> (from FIG. 32), and will be the first intruding shape found by the LISA walker. The state of the TPS is initialized to pre-order, post-order <1,23>. The first node in the Virtual LISA is the node at C'---1B---1C---1D, which is pre-order, post-order <4,1>. The LISA walker must initialize the TPS to process this node, since it has a post-order smaller than the post-order (10, shown at FIG. 3510) of the intruding shape. Because the pre-order of this state (4) is smaller than the pre-order of the intruding shape, the event will be dispatched without the intrusion (at node c'---1B---2C). Thus, a state of c'---1B---1C---1D is constructed in the TPS, and an intrusion search of this instance of c' is performed in cell D. In the present example, no intrusions are discovered, so the next post-order state is examined at node c'---1B---1C---2D. Again, nothing is discovered. The same occurs at ---3D and ---4D. The next node is c'---1B---2C---1D, with pre and post-order <9,6> (see FIG. 3510). The LISA walker inserts the metal intrusion into the TPS at node c'---1B---2C; the Virtual LISA iterator constructs a node at c'---1B---2C---1D and causes an intrusion search. The intrusion search detects an intrusion of m"--6D at this node, so the event is dispatched, and the instance counts are updated. After the event is completed, the Virtual LISA walker continues the process. The flat data in cell D is checked, and with the resulting instance counts, the nested portion of the LISA is processed as before.

In order to process virtual LISAs, the LISA walk iteration is modified as described above to identify the flat nodes for which a flat intrusion search must be performed. However, in cases where there are a large number of flat shapes to be processed, the intrusion searches may result in random searching of shapes that cause virtual memory faults. This typically occurs when the flat data exceeds the average available real storage. As the flat data becomes larger, the page faults can begin to dominate the performance of the computer system. This problem is addressed by a further modification to the LISA walk iteration. The LISA walk iterator is not required to process nodes in the exact post-order sequence of the ILT. Accordingly, data may be clustered by locality of reference, and the iterator directed to perform the walking sequence to process all data within a cluster. The result is a logical subdivision of the flat processing which enables each set of searches to complete before the available real storage becomes overloaded.

VII. The Subset Attribute

Nested operations on highly repeated data are most efficient if the results of these operations can be kept in their most nested form. Any data in a nested cell appears in all instances of that nested cell. If new data is created, applicable only to some instances of a nested cell, the resulting subset may disturb the nesting structure of the represented circuit design. Moreover, attempting to fully integrate the new data into the existing design will cause flattening to occur, with concomitant loss of efficiency. In accordance with the present invention, a solution is provided by denoting the subset formed from new data. In the preferred embodiment this subset may be represented either as a list of the instances of interest to be included or as a list of the instances to be excluded. Such a list of exceptions is maintained in a construct called a "subset attribute" on the rooted entity.

In general, the subset attribute provides a means for denoting subsets of a circuit design. One of the most common forms of subsetting that is useful in VLSI logic design is deletion/addition of small numbers of shapes. To represent this, a subset attribute is appended to the shape instance(s) it acts on and placed in the design description stored in the data repository. When the design verification program created by the application generator is executed the subset attribute is accessed along with the design description. All references to the shape(s) check to determine whether the instance is registered in a subset attribute. The subset attribute directs the runtime program to omit the affected design component instance(s). Any LISAs generated for the shape instance(s) receive instance counts indicating that fewer than expected instances actually exist in the design. To communicate this, instance counts are assigned to subset attributes using the notation (X,Y) to indicate that of Y possible instances at the present node, X have been deleted. Also, the prefix characters "D@" are used to identify the subset attribute in graphical depictions.

A practical and common use for the subset attribute arises where an engineering change is made to a design which alters several neighboring instances of a highly repetitive nested shape. To represent the change using the subset attribute technique, a subset attribute is appended to the hierarehical design to delete the shape at the lowest design level common to all the instances to which the change applies. Then the new shape is added at the same level. Finally, if additional instances of the original shape still exist in the design at the level to which the change was applied, a subset attribute is appended to the new shape to delete corresponding instances of the new shape.

A subset attribute may be stored by simply appending the attribute to instances of the root entity that have been deleted; it may also be stored as a pruned inverse graph, the approach adopted in the preferred embodiment. Using the inverse graph approach, each node in the graph is assigned an associated instance count denoted by a pair of numbers. As with the LISA-based designation of instance counts, the second number represents the potential quantity of instances that could be represented at its associated node. However, in contrast to the LISA-based designation, the first number represents the total quantity of instances added/deleted by the instances of the sub-graph rooted at the node. Thus, the total number of instances added/deleted is shown by the instance count at the root of the pruned graph.

All instances added/deleted to or from the design are represented at the leaf nodes of the pruned graph. The intermediate nodes are simply place holders which identify the transform paths to those instances. When a subset attribute is initially formed it consists of a single root node with the first number of the instance count pair set to zero and the second number set to the total number of instances of the root entity. When a subset attribute undergoes modification (i.e. addition or deletion of instances of the root), the instance(s) to be added/deleted are added as leaves to the graph with additional intermediate nodes if necessary. For each leaf node, the first number of all nodes in the path back to the root is incremented by the number of instances at the leaf node. When the number of deleted instances at a node is equal to the number of instances that could appear at that node, this indicates that all instances in that sub-graph have been deleted; accordingly, all information regarding the sub-graph is deleted from computer memory, making the then-current node a leaf node of the subset attribute.

Figure 54:
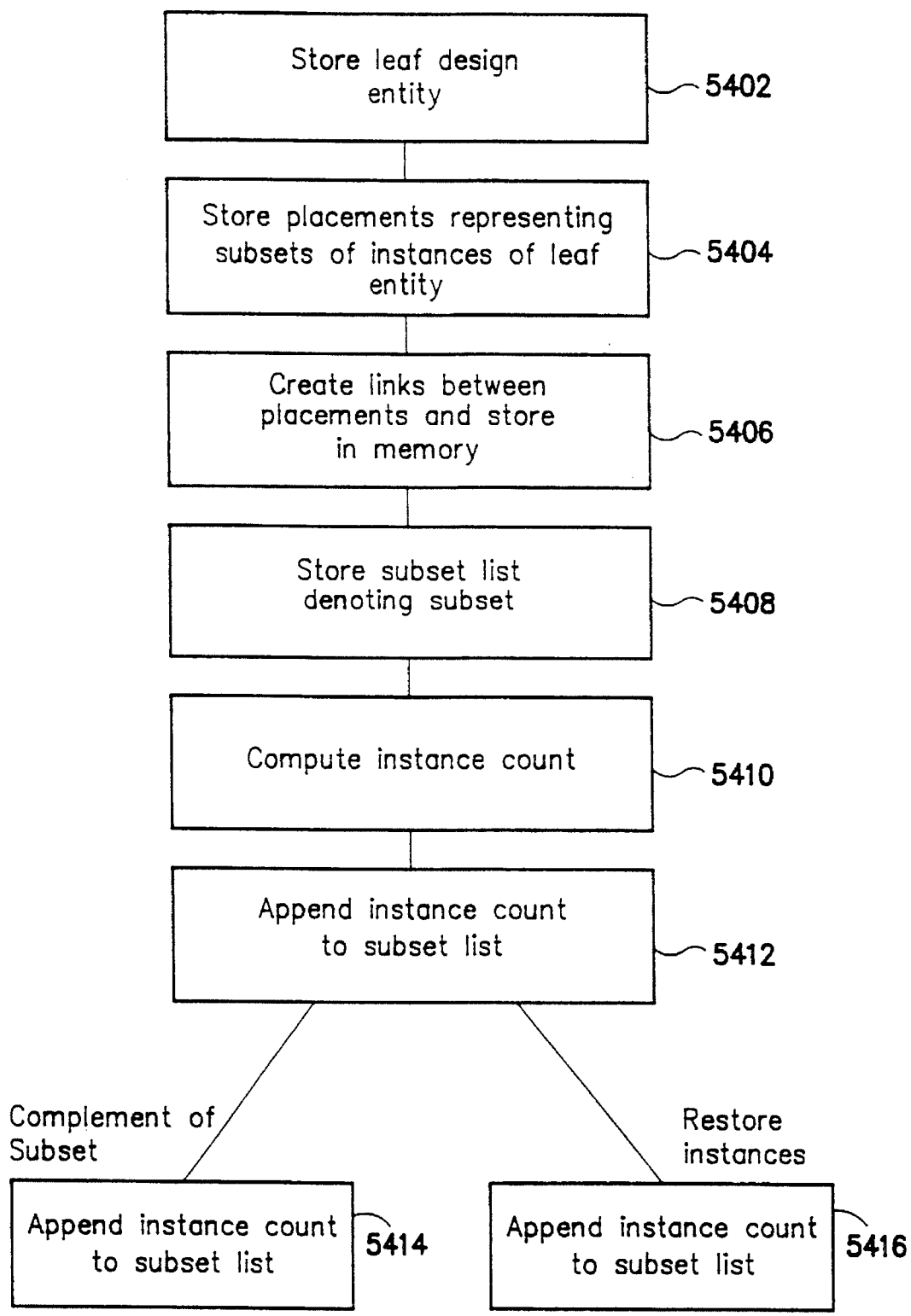
FIG. 54 is a flow chart of the VLSI Design Subsetting process.

Shown in FIG. 54 is a flowchart depicting details involved in the construction of a subset of a hierarehical circuit design in computer memory. At 5402 a VLSI circuit design component is stored in computer memory. The design component identifies a leaf design entity in the hierarehical circuit design. The design component itself may take the form of a circuit device, a net, a microprocessor, a capacitance value, or a resistance value. The placement of the design component within the hierarehical circuit design may include placement within a higher level component in a nested fashion. At 5404 a set of placements is determined representing positions in the hierarehical circuit design where the VLSI circuit design component appears. The placements form a subset of instances of the leaf design entity. The placements are stored in computer memory. At 5406 a set of links is created. The links are associated in memory with both the VLSI circuit design component and the placements, and connect various ones of the placements to one another to further denote placement of the VLSI circuit design component within the hierarehical circuit design. The links are stored in computer memory.

At 5408 a subset list is appended to the VLSI circuit design component in computer memory. The subset list denotes the previously-determined subset and includes placements where the VLSI circuit design component is identified in the hierarehical circuit design. In many practical applications the subset list identifies instances of the leaf design entity to be excluded from the hierarehical circuit design. Thus, the subset list may indicate a particular circuit element to be excluded from the design in a single location, while leaving numerous other instances of the circuit element unaltered. On the other hand, the subset list may also identify instances of the leaf design entity to be included in the circuit design, thereby achieving a similar advantage to that of the exclusion case. In either case, the list of exclusions or inclusions may include conditions defining criteria for their application, for example exclusion of a component such as a fuse when the application is performing net building to simulate the fuse being open-circuited. These exclusion/inclusion conditions themselves may be application-defined, or they may be enforced by a VLSI circuit design system.

In the preferred embodiment, the subset list itself is stored in the form of a pruned graph. The pruned graph includes leaf nodes and internal nodes. Each node has an instance count associated with it. Each instance count includes a pair of numbers. For leaf nodes, the first number equals the second number, indicating that the number of instances that are represented at that node is equal to the number that could be represented at that node. For internal nodes, the first number equals the sum of the second numbers from the instance counts of the instances included in the subgraph of the node, indicating the number of instances denoted in the sub-graph graph rooted at that node. For both leaf nodes and internal nodes, the second number indicates the total quantity of instances of the leaf design entity that could be represented at the node.

At 5410 an instance count is computed to denote the number of instances of the VLSI circuit design component represented in the subset list. At 5412 this instance count is appended to the subset list in computer memory.

In some cases it may be more efficient to store the complement of a subset, since the complement may be significantly smaller than the subset itself. In such cases, 5414 is performed. Here, the complement of the subset list is computed, thereby generating a second subset list which identifies instances not in the original subset list. If the original subset list was an inclusion list, the complement list is used as an exclusion list, and vice versa. Moreover, conditional inclusion/exclusion as described above is available, as is application control of the condition.

In some additional cases, it may be desirable to restore part or all of a subset list, that is to include excluded components or to exclude included components (for example, a subset of shapes that touch other shapes where it is desired to perform an operation on isolated shapes that do not touch other shapes). In such cases, 5416 is performed. Here, a second subset list is appended to the first subset list. The second subset list identifies instances of the leaf design entity to be restored (re-included or re-excluded).

Figure 55:
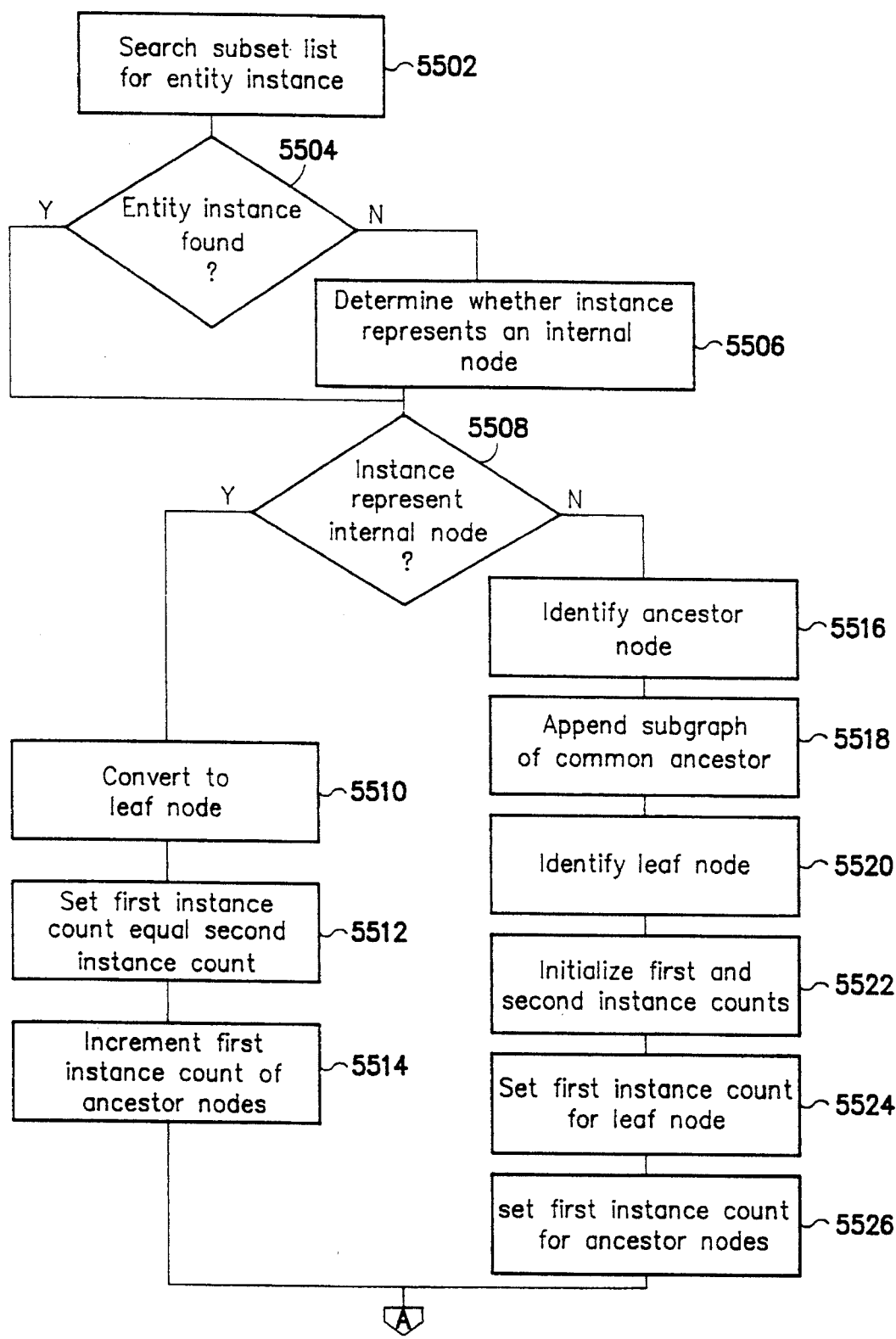
FIG. 55 is a flow chart showing addition of leaf design entities to the VLSI design subset.
Figure 56:
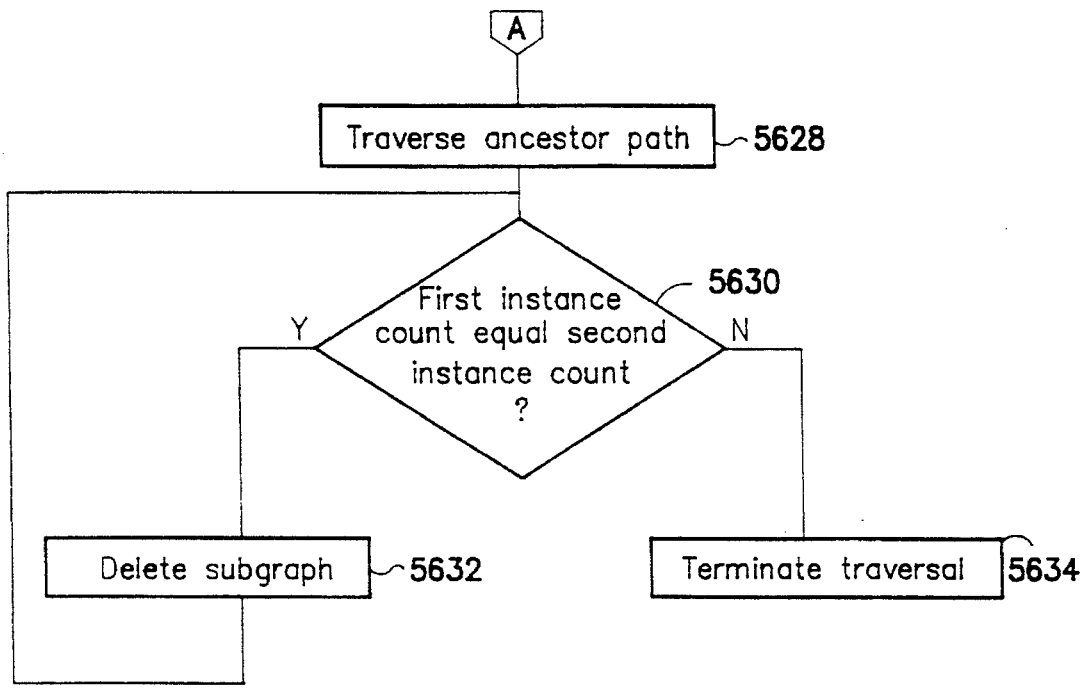
FIG. 56 is a flow chart showing addition of leaf design entity to a VLSI design subset.

Shown in FIG. 55 is a flowchart depicting addition in computer memory of a leaf design entity to a VLSI circuit design subset. The addition function is invoked in response to an externally initiated request. At 5502, a previously constructed subset list is searched to determine whether the instance is already in the list. If the instance is not in the list (per 5504), it is determined at 5506 whether the instance represents an internal node of the pruned graph. Next, at 5508 processing splits depending on whether the instance represents an internal node or not. If the instance does represent an internal node, elements 5510, 5512, and 5514 are executed. At 5510, the internal node is converted to a leaf node by deleting the subtree of the internal node. At 5512, the first instance count of the leaf node is set equal to the second instance count. At 5514, the first instance count of each ancestor node to the leaf node is incremented by the same amount as that applied to the first instance count of the leaf node.

Returning to 5508, if the instance does not represent an internal node, elements 5516–5526 are executed. At 5516, an ancestor node common to the instance and the pruned graph is identified. At 5518, the subgraph of the common ancestor is appended to the common ancestor of the pruned graph. At 5520, the leaf node of the appended subgraph is identified. At 5522, the first instance count of each node in the appended subgraph is initialized to zero, while the second instance count is initialized to the total quantity of instances of the leaf design entity that could be represented at the node associated with the instance count. This total quantity is determined with reference to the hierarehical circuit design. At 5524, the first instance count of the leaf node is set equal to the second instance count. At 5526, the second instance count of the leaf node is added to the first instance count of each ancestor node in the appended subgraph.

Next, processing re-joins at 5628, where the ancestor path is traversed from the leaf of the appended subgraph to determine for each node whether the first instance count equals the second instance count. If this is the case (per 5630), at 5632 the subgraph of the node under consideration is deleted, in recognition that all instances at that sub-graph have been deleted. Then the traversal continues with the next node. At 5634, based on the first and second instance counts not equaling one another, the traversal is terminated, in recognition that no further pruning of the graph can occur.

Four exemplary uses of the delete attribute are presented below. The first of these also serves as a detailed example to illustrate how delete attributes are used to add and delete data in hierarehical designs without having to flatten any part of the design structure.

1. Computing shape complements without unnesting the design

This example will illustrate use of the delete attribute to form the compliment of two regions of a design without having to unnest those regions. The layout example of FIG. 31A will be used to compute the region of level d minus the region of level p. This new level will be denoted as e. The notation d', d" etc, will be used to represent shapes on level d and similarly p', e'- e"'" to represent shapes on level p and level e.

Figure 57:
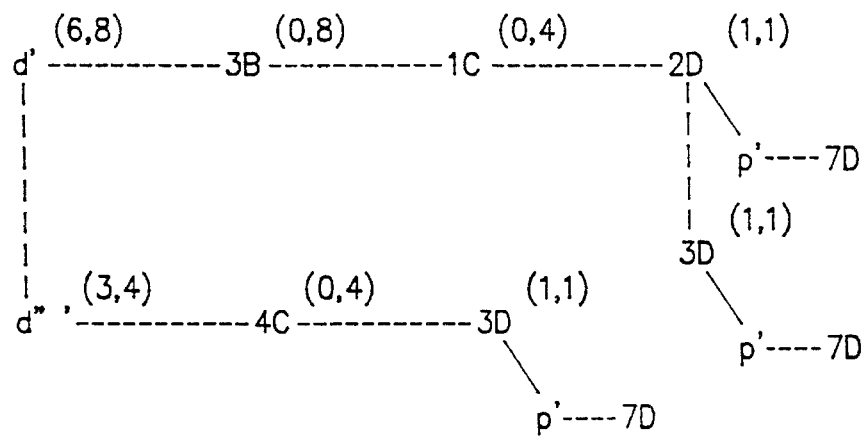
FIG. 57 is a representation of the LISA of level d intruding on level p.
Figure 58:
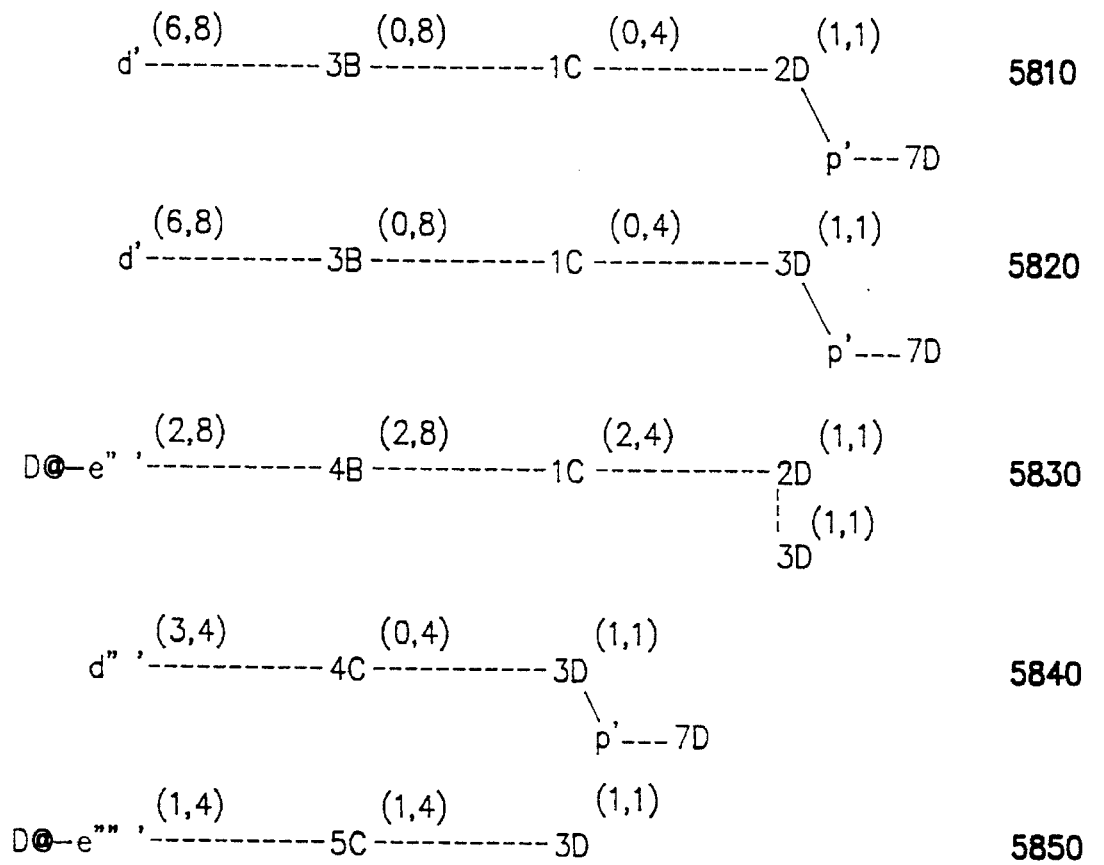
FIG. 58 is a process representation corresponding to the steps of subtracting the region of p from the region of d.
Figure 59:
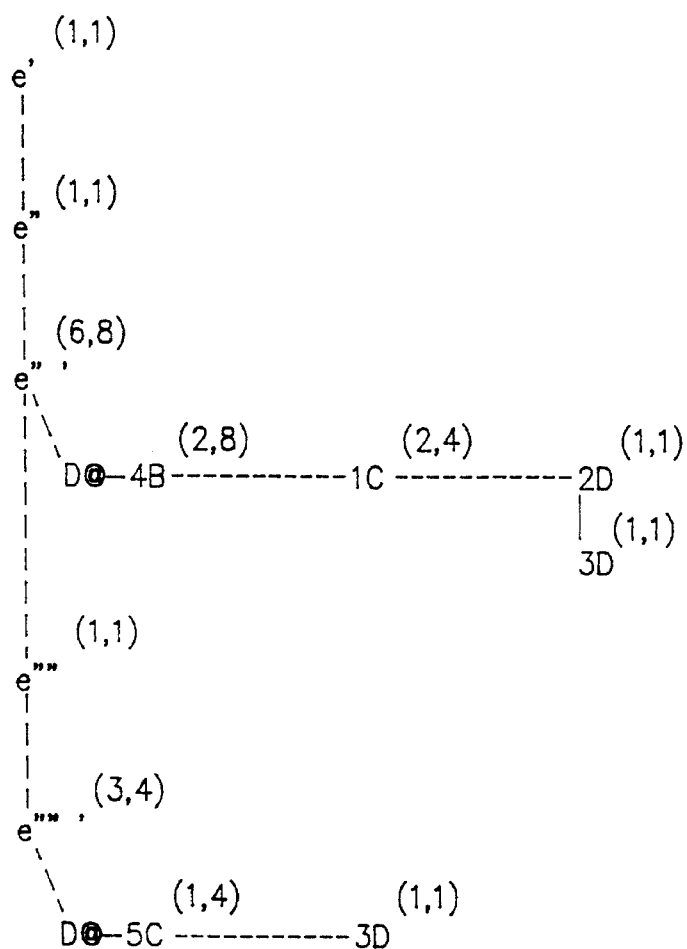
FIG. 59 is a representation of the LISA which results from complementing the region of level d with the region of level p.

A LISA is formed representing level p intruding onto level d, as shown in FIG. 57. Recalling that the LISA is a forest of pruned ILTs, it is apparent from FIG. 57 that a p' level shape intrudes onto two instances of d' shapes and an instance of a d''' shape. To find the complement (level d minus level p), the LISA is walked and the subtraction performed. The first node in the post-ordered walk is the d'---3B---1C---2D instance of d' intruded upon by the p'---7D instance of p' as shown at 5810 in FIG. 58. Upon subtracting the p' instance from the d' instance in the frame of cell D, there is formed a new shape, e', which is added to cell D as e'--8D, where 8 is the next available transform in D. The next instance of shape subtraction is shown at 5820; it results in the generation of the new shape e"---9D in cell D.

Continuing the LISA walk, the next instance of shape subtraction occurs at the root d' since there are no instances of d' represented at nodes 1C or 3B. At the d' node there are six instances of the d' shape which have not yet been processed. As these instances do not have any p' intrusions, the new shape, e'''---4B in cell B, will simply be a copy of the d' shape. But instances of a shape in cell B will appear eight times since cell B is used eight times. Therefore, the two instances of e''' that should not be used will be deleted as an economical means to express the new subset without flattening the design. These instances are shown at 5830; they are the instances for which the shape subtraction of p from d has already been performed. These two instances form a "delete attribute", which is appended to the e''' shape instance. Any subsequent reference to an instance of the e''' shape will be checked to determine whether the instance is registered in the delete attribute. If it is, the reference will be ignored. Also, any subsequent LISAs of this e''' shape will automatically have instance counts reflecting that only six of the eight instances actually exist in the design.

Note that the instance counts in delete attributes are assigned differently from those of a normal LISA. This is illustrated at 5930, where the 4B instance includes instance counts (2,8) instead of (0,8). The (2,8) notation indicates that of the eight possible instances at this node, two have been deleted. Note also the use of the prefix characters "D@" which identify a delete attribute.

Continuing the LISA walk, it is detected that the p'--7D shape intrudes on the d'"--4C--3D shape, as shown at 5940. The subtraction of the d'" minus p' shape is performed, and the resulting shape, e""--10D, stored in cell D. The next instance of shape subtraction occurs at the root d'", where the shape c"41 '---5C is formed. Once again, this new shape should only apply to 3 of the 4 possible instances, so a delete attribute is formed for the instance that should be deleted, as shown at 4959. Finally, FIG. 50 shows the result of the compliment computation, expressed as a LISA of the e shapes.

2. Including or Excluding shapes is a Design

Figure 60:
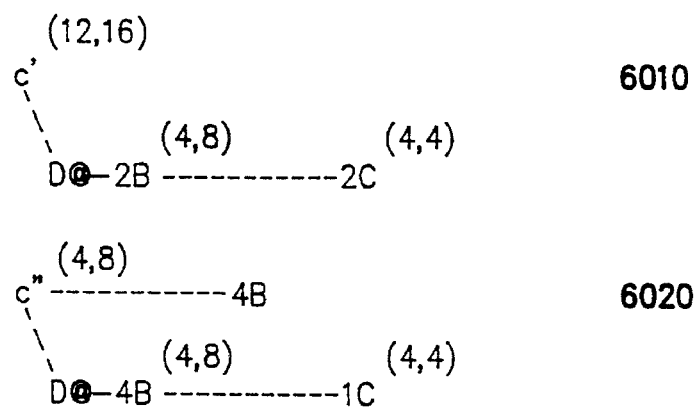
FIG. 60 is a representation of the LISAs which result when 4 instances of shape c' are replaced with 4 instances of new shape c''.

To reiterate the advantageous property of including or excluding shapes from a hierarehical design consider once more the design in FIG. 31A and consider the steps necessary to change the bottom four instances of c', i.e. c'---2B, to a different shape denoted as c". Using the delete attribute, this can be accomplished without selectively flattening c'--2B instances into the higher cell. First, a delete attribute is appended to c' to delete the 4 instances of c'--2B for which the change is desired, as shown in FIG. 60 at 6010. Then, the new shape c"--4B is inserted and a delete attribute is appended to it to selectively delete the instances being removed as shown at 6020. The result is a new set of shapes, c", taken from former instances of c'.

3. Dynamic modification of design cells

Dynamic modification of design cells involves the delete of a delete attribute. Consider a design cell which can have many different configurations depending on usage. An example is a design library macro which has different connection ports depending on its invocation. Another example is the conditional inclusion or exclusion of shapes denoting fuses during net building. Such a cell can be easily designed with the aid of delete attributes by creating all possible configurations of the cell, then using delete attributes on each of these configurations to "disable" them, and finally, at design time re-enabling them as required. One particularly preferred method of enabling a deleted instance is to build an additional delete attribute for the root entity. The root entity then has two associated delete attributes which can further be joined into a single delete attribute using an exclusive-OR operator. Thus, an instance denoted in one delete attribute indicates that the instance has been removed, while deleting it a second time in the other delete attribute effectively restores the existence of the instance.

4. Dynamic renesting of a design component in a design

Dynamic renesting enables a shape or a component to be moved from one place in a design hierarchy to another without affecting the design. This allows designs to be renested for purposes of efficiency or isomorphism with another design representation.

Figure 61:
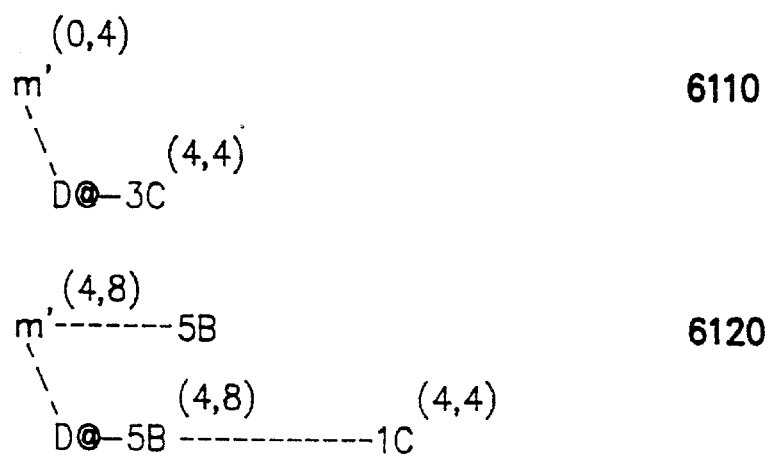
FIG. 61 is a representation of the LISAs which result from shape m' being moved from cell C to cell B.

With reference again to the design in FIG 31A, consider the operation of moving the m' shape from the C cell and placing it in the B cell. This is achieved by first deleting all instances of the m' shape in C by appending to m' the delete attribute, as shown in FIG. 61 at 6110. Then m' is inserted into cell B as m'---5B, and the delete attribute is appended to delete the four instances not required, as shown at 6120. Note that the value of the 5B transform is the inverse of the 2C transform if the delete attribute at 6120 deletes the IC set of instances; otherwise it is the inverse of the 1C transform, with the delete attribute acting on the 2C set of instances.

VIII. Synthesis of Nested Net Interconnections

A net is a collection of components of a design that are interconnected by some set of rules. Nets play an important role in describing a chip's electrical structure, as they define how other components, such as semiconductor devices, are interconnected. The subject of the present discussion, nested net synthesis, is a technique for identifying and storing interconnections of components of a nested design, while maintaining the data in its most nested form. More particularly, nested net synthesis involves identifying components that are electrically or otherwise (magnetically, optically, etc) connected and storing their interconnections in a data structure within the nested framework. Each net is stored in a graph structure similar to a LISA, with instance counts at each node. Each net's graph is a sub-graph of the hierarehical design graph. The root of a net is a node in the graph representing the highest cell in the design which contains the net. The instance count of the root is the instance count of that cell in the design. The leaf nodes of the net graph are nested shapes, or any other entity identified by the design verification tool.

Two data structures are maintained in the net graph. One is a list denoting instances of the sub-graph that are elements of higher level nets. The other is a list denoting the inverse of the "elements-of" list, i.e., a list denoting which instances of lower nested nets are contained in the graph of the net. Thus, given a net, a program may walk the net from the root node and identify all of its nested components. Conversely, given a nested component, a program may identify the root of the net(s) connected to an instance of the component. Instance counts are stored at each node in the graph of the net, similarly to the manner in which they are stored in a LISA; that is, as a pair of numbers. of numbers. The second number denotes the number of instances (of nets) that could appear at that node in the graph. The first number denotes how many nets are rooted at that node in the graph. An instance count of zero indicates that all instances of that net are elements of higher level nets. When a property concerning a net has been derived it is stored at the root node of the net.

The net building techniques described are deterministic, in that they produce identical graphs for each net, independent of the order in which intrusions are performed, and independent of the order in which intrusion pairs are entered into the net tables.

Figure 62:
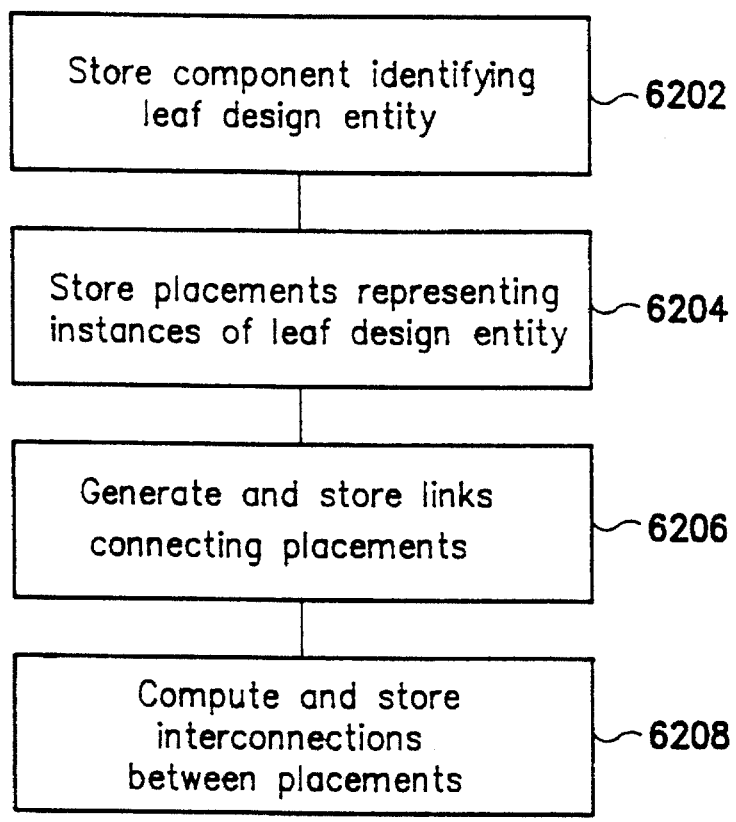
FIG. 62 is a flow chart showing the representation structure of design component interconnections.

Shown in FIG. 62 is a flowchart illustrating the creation in computer memory of a representation of interconnections (nested nets) among VLSI design components. At 6202, a VLSI design component identifying a leaf design entity is stored in memory. The design component may be a device, a net, a microprocessor, a capacitance value, or a resistance value. At 6204, placements in the design where the design component appears are stored in memory. These placements represent a subset of instances of the leaf design entity, and may include placement of the VLSI design component in a higher level component in the hierarehical circuit design. At 6206, a set of links is formed to connect placements to one another. The links further specify placement of the design component in the circuit design. They are stored in computer memory.

At 6208 the interconnections are computed and stored in memory. They specify where placements of the VLSI design component instances are interconnected. The interconnections may be application-defined, and may specify any meaningful coupling, such as electrical conductivity, magnetic, or optical. The interconnections are represented by a nested net graph which includes a list of nets, and instance counts associated with the nets. Each instance count includes two numbers. The second denotes the quantity of instances of the net that could be represented at the associated node. The first denotes the quantity of instances actually represented at the node. The nested net graph may also include a second list, which specifies instances of nested nets contained in the nested net graph. Using both lists, the nested net graph may be used to "look up", that is determine net membership of a shape instance, or "look down", that is determine nested shape components of a subject net. Finally, a third item may be added to the nested net graph in the form of a shape-to-net table attached at the root of the nested net graph. The shape-to-net table defines a mapping from the VLSI design component to a corresponding net, permitting a shape to be denoted as a net, hence allowing an instance of a shape to be mapped to its equivalent instance of a net. Thus, the nested net can be considered a homogeneous graph containing instances of nets.

Figure 63A:
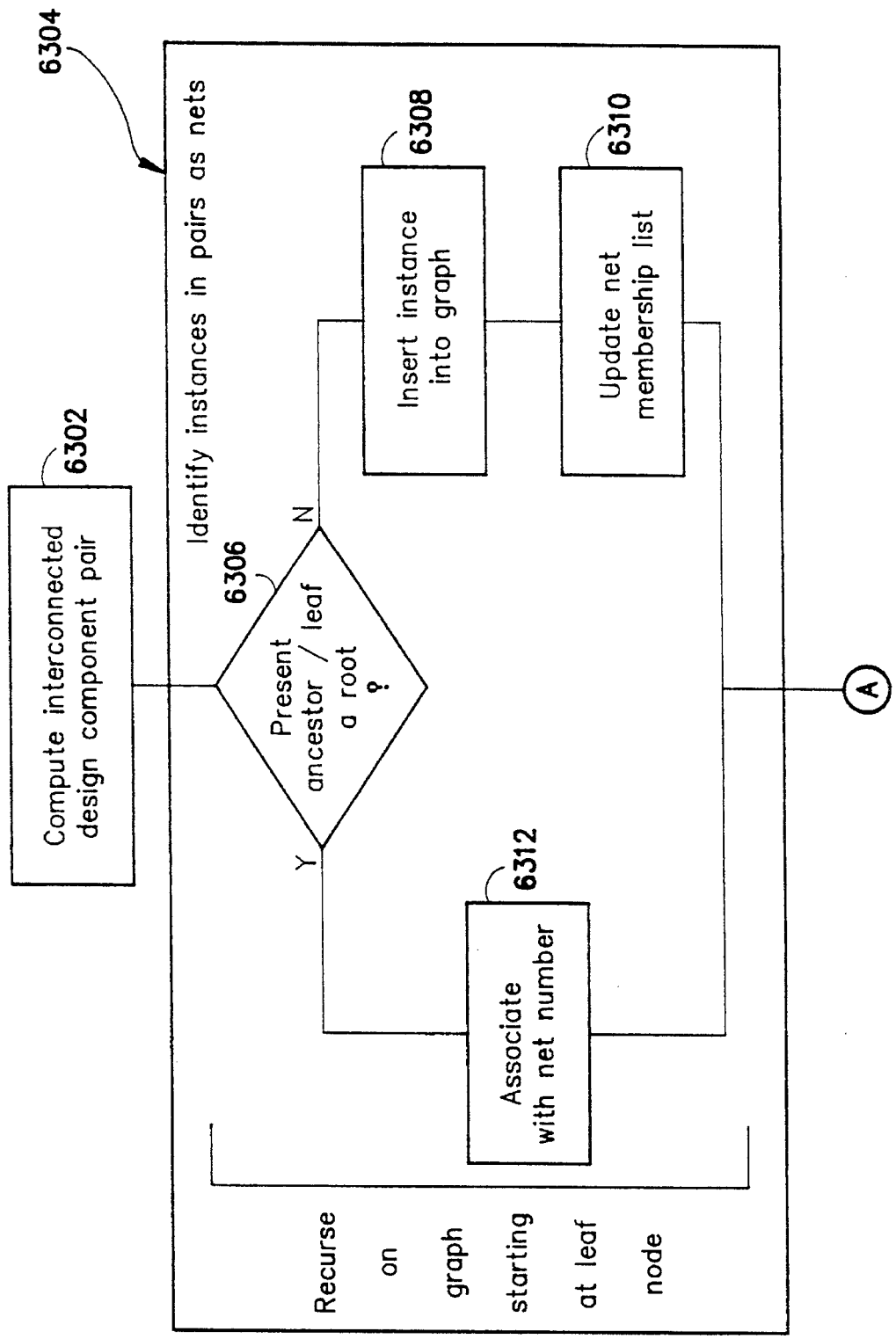
FIGS. 63A and 63B, taken together, are a flow chart showing building interconnections between design components.
Figure 63B:
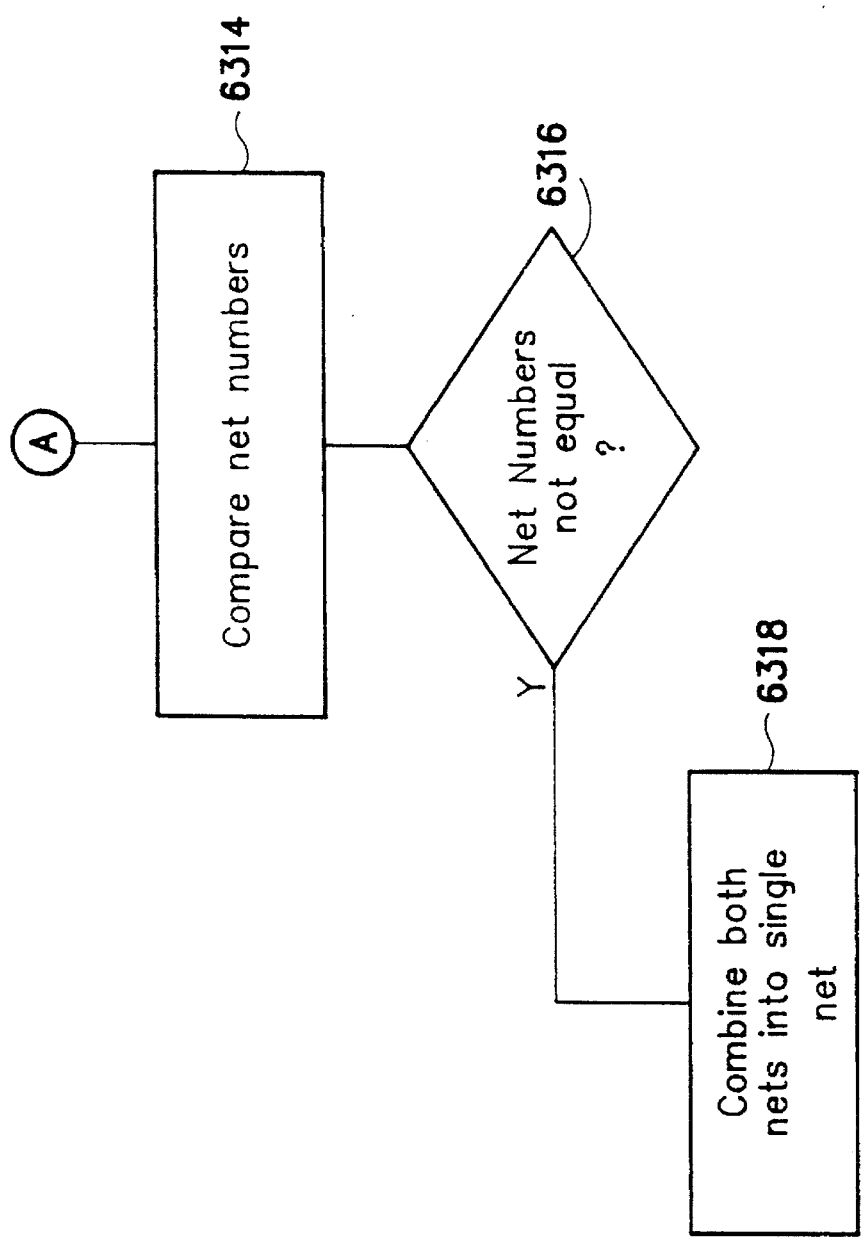

Shown in FIGS. 63A and 63B is a flowchart illustrating the process of building a representation of interconnections (nested net building) among VLSI design component instances. At 6302, a pair of VLSI design component instances where an interconnection occurs is computed. The pair is denoted in an inverse layout graph which has a common leaf node, also known as an interconnecting node, where the instances are interconnected. This common leaf node is also cross-referenced to an "interconnect node" in a nested net graph. At 6304 each instance of the pair is identified as a net with a net number. Each net is also in the interconnect node established by the common leaf node. In the preferred embodiment, step 6304 can be further subdivided as shown at 6306–6312. These steps are performed recursively to effectively walk the ancestor graph of the VLSI design component instance starting at the leaf node of the inverse graph. At 6306 it is determined whether the present ancestor node (or the leaf node, if there are no ancestors) is the root of the ancestor graph. If this is not the case, at 6308 the instance of the net of the ancestor node is inserted into the nested net graph, and (in the preferred embodiment) at 6310 the net membership list is updated to indicate that the leaf instance of the ancestor node is contained in the net at the leaf node. If the ancestor/leaf node is the root of the inverse placement graph, at 6312 a net number is associated with the root. Following completion of the recursive process in 6304, the building of interconnections continues at 6314, where the two net numbers obtained from the recursion are compared with one another. If the net numbers are not equal (6316), they are joined together into a single net (6318).

Figure 64:
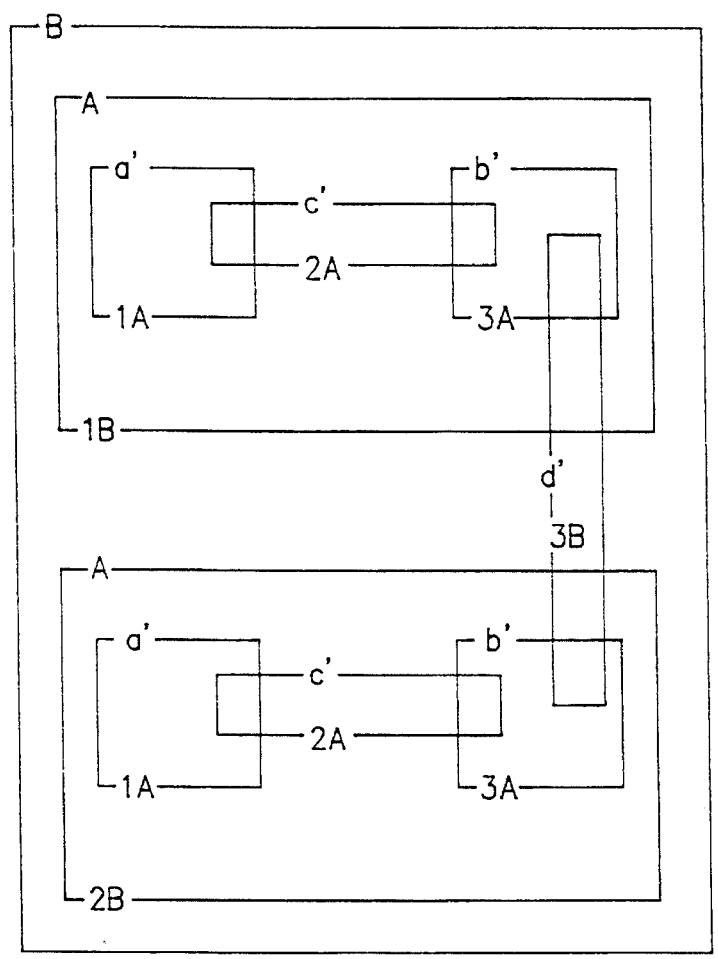
FIG. 64 is a schematic diagram of a hierarchical layout used to illustrate nested net synthesis.
Figure 64:
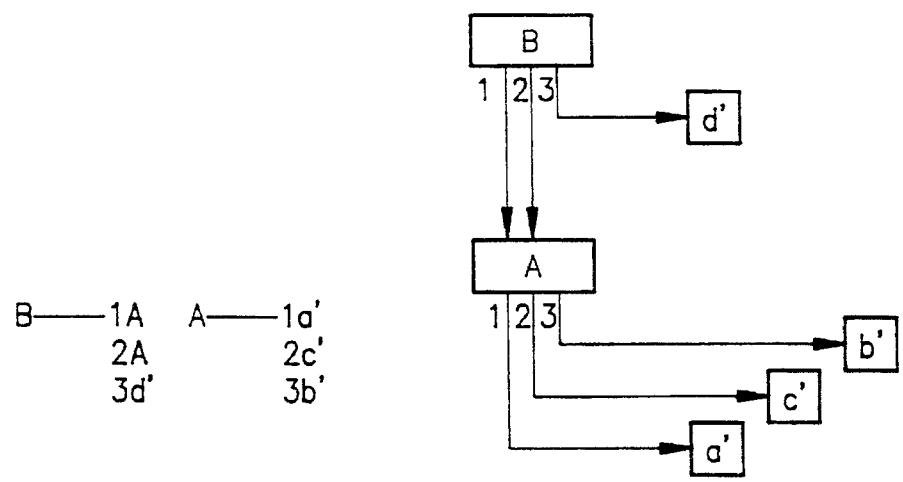

Shown in FIG. 64 at 6410 is an exemplary hierarehical design layout which will be used to demonstrate nested net synthesis where there are no deleted instances of shapes present. The cell transform list for the design layout is shown at 6420, and the layout tree is shown at 6430. The list of intrusion pairs representing interactions between the 4 shapes is shown in FIG. 65. Two tables are used in nested net synthesis. The first is a shape-to-net table which correlates leaf shapes with their associated nets. The second is a net table which enumerates the elements of each net in terms of instances of leaf shapes and instances of nested nets. FIGS. 66 to 69 illustrate the use of these tables to perform nested net synthesis for each intrusion pair listed in FIG. 65.

Initially, there are no shape instances in the shape-to-net table. Processing begins in FIG. 66 with the first intrusion pair. A new net is formed in cell A and entries made in the shape-to-net table to indicate that shape a'--1A belongs to net1 in A and shape c'--2A belongs to net1 in A. The net table is updated to indicate that net1 in cell A contains two shapes, a'--1A and c'--2A. The resulting nested representation of nets indicates that there are a total of 2 instances of net1, and neither instance is an element of any other net.

Processing continues in FIG. 67 with the second intrusion pair. Shape c'---2A is already in the shape-to-net table, but shape b'---3A is not. Accordingly, b'---3A is added to net1.A. The resulting net table reflects that net1 in cell A contains three shapes. The nested representation of nets remains unchanged because, although each instance of net1.A now contains three shapes, no new instances have been added.

Processing continues in FIG. 68 with the third intrusion pair. Shape b'---3A is already in the shape-to-net table. However, the 1B instance of net1.A with shape d'---3B is not. Accordingly, d'---3B is added to the shape-to-net table as net2 in cell B. The resulting net table reflects that net2 in cell B contains the d'---3B shape and the 1B instance of net1. The nested representation of nets shows that one instance of net1 does not have interactions with a higher level net, that the 1B instance of net1 is an element of net2 in cell B, and that the total number of instances of net2 is one.

Processing completes in FIG. 69 with the fourth intrusion pair. Shape d'---3B is already in net2.B, so no new shapes are added to the shape-to-net list. The 2B instance of net1.A is added to net2.B in the net table; the net list now indicates that net2 in cell B contains the d'--3B shape, the 1B instance of net1.A, and the 2B instance of net2.A. The nested representation of nets shows that the 1B instance of net1 and the 2B instance of net1 are elements of net2, that both these instances are part of other nets, and that the total number of instances of net2 is one.

Finally, FIG. 70 depicts the expanded, or flattened, structure for the net that has been traced. As shown, walking and expanding net 2.B yields d'--3B, nect1.A--1B, and net 2.A--2B. The nets themselves may also be expanded by reading the "→" symbol as "composed of".

Instances of shapes may be subsetted and stored with the leaf element shapes, as discussed previously in section VII. Sometimes it is desirable to consider a net structure without a specific subset of shape instances, as when it is observed by the application program that a set of shapes is considered to have been deleted. Thus, net topology is dependent on the instances of shapes that are actually included in the net. In general, it is possible to optionally include or exclude a set of leaf shapes in a net dependent on the application. A "bridge" method has been developed to accommodate a dynamic inclusion or exclusion of subsets of leaf entities within nets. When a shape that could be part of a subset of interest is encountered during net building it is stored in a list of bridge shapes instead of normal elements of inclusions. The information in the net table which denotes the instances of nested nets contained in the net is insufficient to indicate that some instances of that net interconnection do not connect the nets. To solve this problem, the inclusion of an instance of a nested net is modified using a bridge interconnection. When traversing a nested net, if a bridge interconnection is encountered, the traversal must examine the list of instances of the root entity of that net to determine if the present instance exists at that interconnect node. If the instance exists, the connection across the bridge is established and the nested net is included in the net structure. However, if the instance of the root entity does not exist at the interconnect node, the net across the bridge is ignored. When interconnections appear between instances of root entities in different interconnecting nodes, more than one bridge connection will be created between the two nets. This may cause the graph of a particular net to become cyclic because each bridge connection has to be examined with respect to included or excluded instances of the root entity. Therefore, the graph traversal technique previously described is modified to track whether or not the traversal has descended into each bridge net. This prevents a nested net from being traversed more than once.

Figure 71:
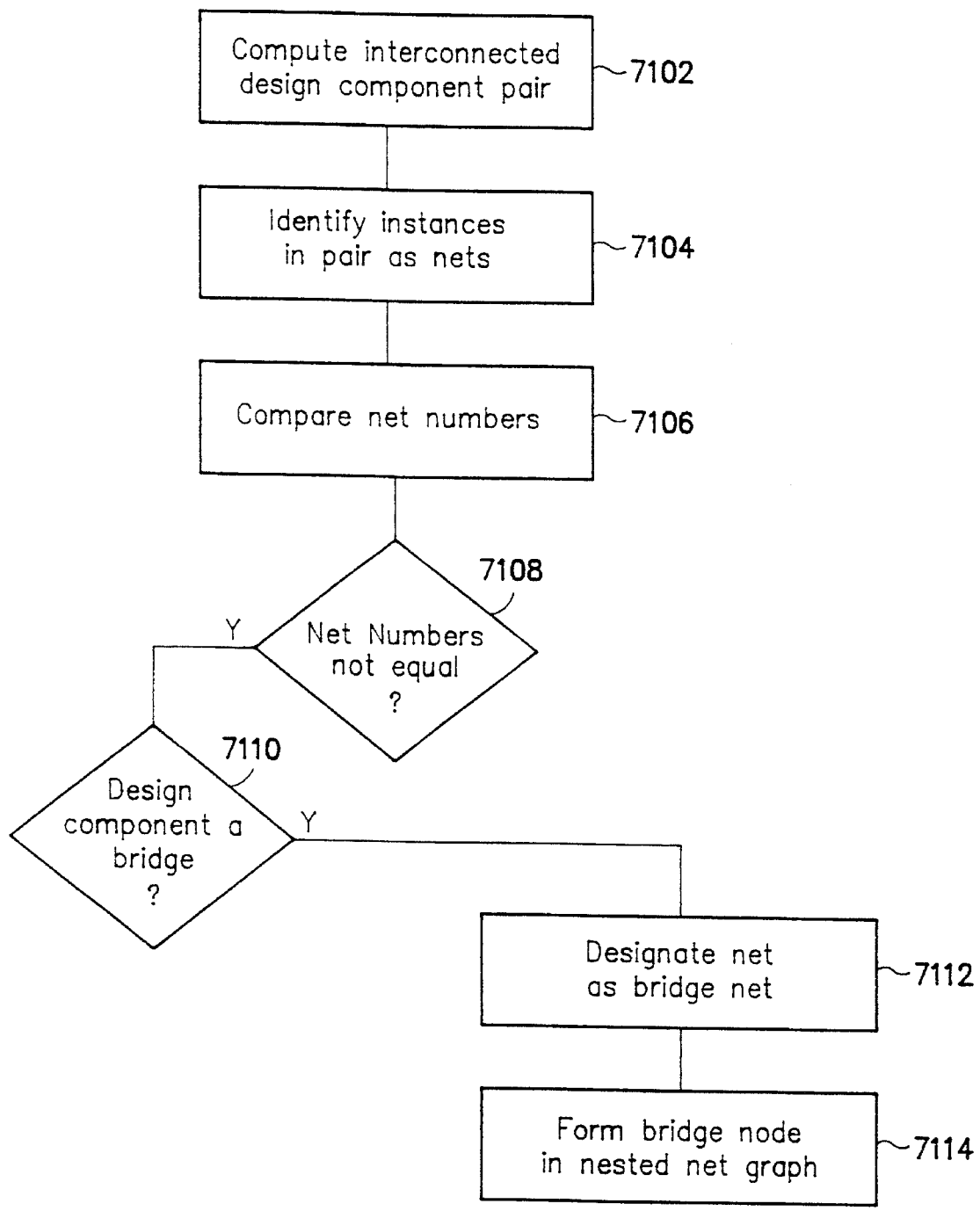
FIG. 71 is a representation of the result of walking and flattening net2 in cell B.

Shown in FIG. 71 is a flowchart illustrating the process for building interconnections using a bridge component, or bridge net. Steps 7102–7108 are equivalent to steps 6302–6316 in FIG. 63, and accordingly will not be explained in detail here. At 7110 it is determined for each VLSI circuit design component in the component-pair whether the component is a bridge component. If so, steps 7112–7114 are executed. At 7112 the net to which the VLSI circuit design component maps is designated as a bridge net and at 7114 a bridge node is formed in the nested graph. The bridge node denotes the interconnection between the two nets derived from the pair of VLSI circuit design component instances when the instances belong to a specified subset. Instances not in a specified subset are not interconnected.

Figure 72:
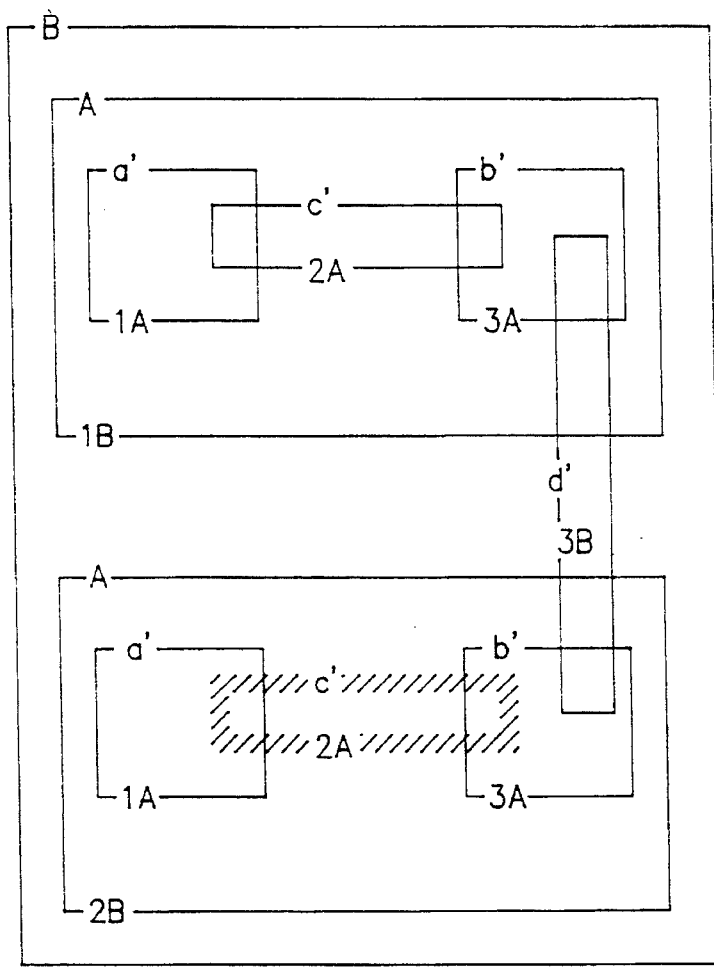
FIG. 72 is a schematic diagram of a hierarehical layout used to illustrate nested net synthesis with a deleted shape present.
Figure 72:
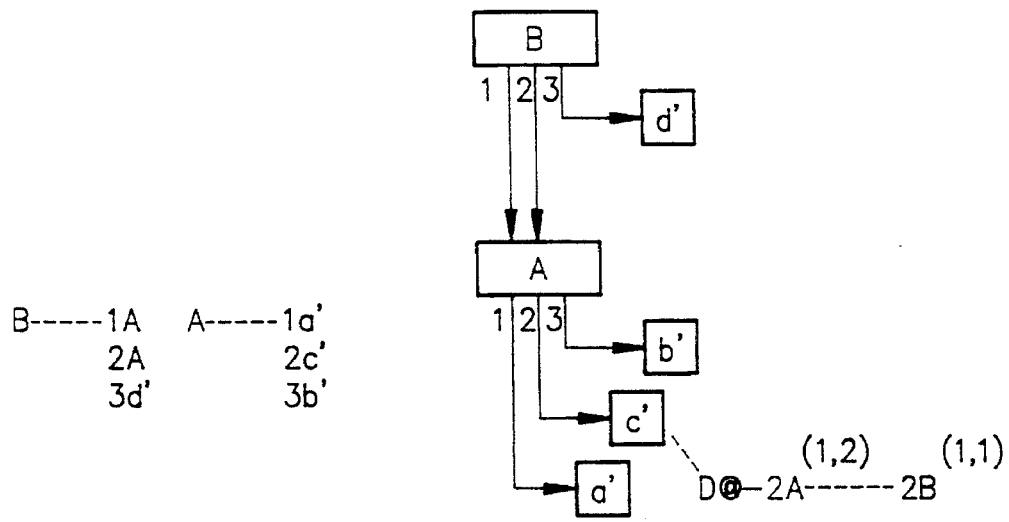

Turning now to FIG. 72, there is shown at 7210 an exemplary hierarchical design layout which will be used to demonstrate nested net synthesis in the presence of a deleted shape. The cell transform list is shown at 7220 and the layout tree is shown at 7230. FIG. 73 contains the list of intrusion pairs generated for interactions between the 4 shapes. The list is the same as that shown in FIG. 65 except, as will be determined below, the c'--2A--2B shape has been deleted. Using the notation neti.C(Br) to indicate that neti is a bridge net in cell C, a "bridge-net-table" is added to the previous net tables and is used to track net information when an instance of a shape is deleted. Nets in this table serve as connecting bridges between nets in the original hierarchy. Each net has an elements-of list, a contains list, an instance count, and a connects list. "Elements-of" entries denote higher-level bridge nets and/or regular nets. "Contains" entries denote deleted instances of a shape at the associated node. "Instance count" entries denote the number of instances at the associated node. "Connects" entries denote the connecting nets through the associated bridge net.

FIGS. 74 to 78 illustrate the nested net synthesis process for the intrusion pairs listed in FIG. 73. Initially there are no shape instances in the shape-to-net table. Processing begins in FIG. 74 with the first intrusion pair. A new net is formed in cell A and entries made in the shape-to-net table as shown. The shape c'---2A belongs to the bridge-net table as shown. The shape c'---2A belongs to the bridge-net table because its 2B instance has been deleted. The net-table is updated to indicate that net one in cell A contains an a'--1A shape and a bridge net2 in cell A. Note that net one A includes shape a'---1A in every instance and shape c'---2A in some instances; that is, one instance of c'---2A is non-existent. The bridge-net table is initiated to indicate that net2 contains shape c'---2A, while the 2B instance of net2 in cell A does not exist. The resulting nested representation of nets indicates that there are a total of 2 instances of net1, and neither instance is an element of any other net.

Processing continues in FIG. 65 with the second intrusion pair. Shape c'---2A is already in the shape-to-net table, but shape b'---3A is not. Thus, b'---3A forms a new net in cell A. The resulting net table reflects that net1 in cell A contains an a'--1A shape and a bridge net2, which itself is in cell A, while net2 in cell A contains a b'--3A shape and a bridge net2, which itself is in cell A. The bridge-net table is updated to show that the bridge net, net2.A( ) now connects to net1.A and net3.A. The nested representation of nets shows a total of 2 instances each of net1 and net3, none of which are elements of any other net.

Processing continues in FIG. 76 with the third intrusion pair. Shape b'---3A is already in net3.A; the 1B instance of net3 with shape d'---3B forms a new net in cell B, as indicated in the shape-to-net table. The net table now shows that net4 in cell B contains a d'--3B shape and the 1B instance of net3. The bridge-net table remains unchanged. The nested representation of nets indicates that 1 instance of net3 does not interact with a higher level net, and the total number of instances of net4 is 1.

Processing completes in FIG. 77 with the fourth intrusion pair. Shape d'---3B is already in net 4.B in the shape-to-net table, so it remains unchanged. The net table is updated to show that Net4 in cell B now contains the d'--3B shape, the 1B instance of net3, and the 2B instance of net3. The bridge-net table still remains unchanged. The nested representation of nets now indicates that both the 1B instance of net3 and he 2B instance of net3 are elements of net4, and that both instances are part of other nets. Also, there is still one instance of net4.

Finally, FIG. 78 describes the expanded, or flattened, structure for the main net that has been traced. As shown, net4 in cell B contains a d.3B shape, a 1B instance of net3, and a 2B instance of net3. Walking and expanding net4.B yields d'--3B, net3.A--1B, and net3.A--2B. The nets themselves may also be expanded by reading the "→" symbol as "composed of". Note that net2.A(Br) contains shape c'--2A which connects net1.A and net3.A.

IX. Additional Applications for the Shape Instance Method

It should be noted that applicability of the present invention is not limited to physical design data, but includes the manipulation of any hierarehical data which is described by an acyclic graph of transform paths to objects at the leaves of the graph. In particular, the present invention is applicable to manipulating any net and device instance paths in physical and logical designs. This may be generalized to the manipulation of any entity computed at a node in a design space. Examples include parasitic capacitance, parasitic resistance, cross-talk coupling, numeric control mask making software support and application programs to derive process related optimization mask. Additional applicability of the invention extends to direct mapping between the design model of VLSI and those of 2–3 dimensional computer aided design programs or computer aided manufacturing programs.

X. Conclusion

Using the foregoing specification, the invention may be implemented via standard programming and/or engineering techniques. The resulting program(s) may be stored on disk, diskettes, memory cards, ROM or any other memory device. For execution, the program(s) may be copied into the system memory (RAM) associated with the CPU. One skilled in the art of computer science will readily be able to combine the software created as described with appropriate general purpose or special purpose computer hardware to create a computer system embodying the invention. While the invention has been particularly described and illustrated with reference to a preferred embodiment, it will be understood by those skilled in the art that changes in the description or illustrations may be made with respect to form or detail without departing from the spirit and scope of the invention.

What is claimed is:

1. A computer-implemented method for building in computer memory a subset of hierarehical circuit design data representing a physical design of a very large scale integrated (VLSI) circuit comprising the steps of:

storing in the computer memory a VLSI design component identifying a leaf design entity in the hierarehical circuit design data;

storing in the computer memory a set of placements in the hierarehical circuit design where the VLSI design component appears, the set of placements forming a subset of instances of the leaf design entity;

associating with the VLSI design component and the placements a set of links, the links connecting various ones of the placements to one another to further denote placement of the VLSI design component within the hierarehical circuit design data;

storing the set of links in the computer memory;

storing in the computer memory a subset list in the form of a pruned graph appended to the VLSI design component, the subset list denoting the subset and including placements where the VLSI design component is identified in the hierarehical circuit design data, the pruned graph including leaf nodes and internal nodes, the leaf nodes and the internal nodes having associated instance counts, each instance count including first and second numbers, the second number being indicative of a total quantity of instances of a leaf design entity that could be represented at a node associated with the instance count;

computing an instance count denoting a number of instances of the VLSI design component represented in the subset list; and appending the instance count to the subset list in the computer memory.

2. The method as recited in claim 1, further comprising the steps of:

determining when new data is created, applicable only to some instances of a nested cell, whether the resulting subset will disturb the nesting structure of the represented circuit design; and associating with the subset list a subset attribute of instances of the leaf design entity conditionally excluded from the hierarehical circuit design data to avoid flattening the data.

3. The method as recited in claim 2, wherein the exclusion condition is defined by a user-written VLSI shape manipulation program.

4. The method as recited in claim 2, wherein the exclusion condition is enforced by a VLSI design verification system.

5. The method as recited in claim 2, further comprising the step of computing the complement of the subset list to generate a second subset list which identifies instances of the leaf design entity conditionally included in the hierarehical circuit design.

6. The method as recited in claim 2, further comprising the step of appending to the subset list a second subset list of exclusions to restore the excluded instances of the leaf design entity.

7. The method as recited in claim 1, further comprising the steps of:

determining when new data is created, applicable only to some instances of a nested cell, whether the resulting subset will disturb the nesting structure of the represented circuit design; and associating with the subset list a subset attribute of instances of the leaf design entity conditionally included in the hierarehical circuit design.

8. The method as recited in claim 7, wherein the inclusion condition is defined by a user-written VLSI shape manipulation program.

9. The method as recited in claim 1, wherein for each internal node the first number in the instance count is set equal to the sum of the second numbers from the instance counts of the instances of the leaf design entity included in the subgraph of that internal node.

10. The method as recited in claim 1, wherein the highest node of the hierarehical tree structure is the root of the design tree and the placement of the VLSI design component within the hierarehical circuit design data includes placement in a higher level component in the hierarehical circuit design.

11. In a computer-based system for building a subset of hierarehical circuit design data of a physical design of a very large scale integrated (VLSI) circuit, comprising:

computer memory means for storing a VLSI design component identifying a leaf design entity in the hierarehical circuit design and a set of placements in the hierarehical circuit design data where the VLSI design component appears, the set of placements forming a subset of instances of the leaf design entity; and processor means for associating with the VLSI design component and the placements stored in said memory means a set of links, the links connecting various ones of the placements to one another to further denote placement of the VLSI design component within the hierarehical circuit design, said processor means storing the set of links in said computer memory means and a subset list in the form of a pruned graph appended to the VLSI design component, the subset list denoting the subset and including placements where the VLSI design component is identified in the hierarehical circuit design data, the pruned graph including leaf nodes and internal nodes, the leaf nodes and the internal nodes having associated instance counts, each instance count including first and second numbers, the second number being indicative of a total quantity of instances of a leaf design entity that could be represented at a node associated with the instance count;

said processor means computing an instance count denoting the number of instances of the VLSI design component represented in the subset list and appending the instance count to the subset list in said computer memory means.

12. The system as recited in claim 11, wherein the subset list identifies instances of the leaf design entity conditionally excluded from the hierarehical circuit design, said processor means computing a complement of the subset list to generate a second subset list which identifies instances of the leaf design entity conditionally included in the hierarehical circuit design data.

13. The system as recited in claim 11, wherein the subset list identifies instances of the leaf design entity conditionally excluded from the hierarehical circuit design, said processor means appending to the subset list a second subset list of exclusions to restore the excluded instances of the leaf design entity.

14. The system as recited in claim 11, wherein for each leaf node, said processor means sets the first number in the instance count equal to the second number in the instance count.

15. The system as recited in claim 11, wherein for each internal node, said processor means sets the first number in the instance count equal to a sum of the second numbers from the instance counts of the instances of the leaf design entity included in a subgraph of that internal node.

16. The method recited in claim 1, further comprising the steps of:

receiving a request to add an instance of a leaf design entity to the subset list;

searching the subset list to determine whether the instance is already in the list;

if the instance is not in the subset list, determining whether the instance represents an internal node of the pruned graph;

if the instance represents an internal node,
 (a) converting the internal node by deleting a subtree of the internal node,
 (b) incrementing the first instance count of the leaf node to equal the second instance count of the leaf node,
 (c) incrementing the first instance count of each ancestor node to the leaf node by an increment amount applied to the first instance count of the leaf node;

if the instance represents a non-internal node,
 (a) identifying an ancestor node common to the instance and the pruned graph,
 (b) appending the subgraph of the common ancestor of the instance to the common ancestor of the pruned graph,
 (c) identifying the leaf node of the appended subgraph,
 (d) initializing the first instance count of each node in the appended subgraph to zero and the second instance count to the total quantity of instances of the leaf design entity that could be represented at the node associated with the instance count, as determined from the hierarehical circuit design data,
 (e) setting the first instance count of the leaf node equal to the second instance count of the leaf node,
 (f) adding the second instance count of the leaf node to the first instance count of each ancestor node to the leaf node in the appended subgraph; and traversing the ancestor path from the leaf of the appended subgraph to determine for each node whether the first instance count equals the second instance count and
 (a) if the first instance count equals the second instance count, deleting the subgraph of that node,
 (b) if the first instance count does not equal the second instance count, terminating the traversal.

17. A computer-implemented method for adding to a subset of hierarehical circuit design data representing a physical design of a very large scale integrated (VLSI) circuit stored in computer memory, a subset list in the form of a pruned graph including leaf nodes and internal nodes being appended to a VLSI component in the hierarehical circuit design data and including placements where the VLSI component is identified in the hierarehical design data, the leaf nodes and the internal nodes having associated instance counts, each instance count including first and second numbers, the second number being indicative of a total quantity of instances of a leaf design entity that could be represented at a node with the instance count, said method comprising the steps of:

receiving a request to add an instance of a leaf design entity to the subset list;

searching the subset list to determine whether the instance is already in the list;

if the instance is not in the subset list, determining whether the instance represents an internal node of the pruned graph;

if the instance represents an internal node,
 (a) converting the internal node to a leaf node by deleting a subtree of the internal node,
 (b) incrementing the first instance count of the leaf node to equal the second instance count of the leaf node;
 (c) incrementing the first instance count of each ancestor node to the leaf node by the increment amount applied to the first instance count of the leaf node;

if the instance represents a non-internal node,
 (a) identifying an ancestor node common to the instance and the pruned graph,
 (b) appending the subgraph of the common ancestor of the instance to the common ancestor of the pruned graph,
 (c) identifying the leaf node of the appended subgraph,
 (d) initializing the first instance count of each node in the appended subgraph to zero and the second instance count to the total quantity of instances of the leaf design entity that could be represented at the node associated with the instance count, as determined from the hierarehical circuit design,
 (e) setting the first instance count of the leaf node equal to the second instance count of the leaf node,
 (f) adding the second instance count of the leaf node to the first count of each ancestor node to the leaf node in the appended subgraph; and traversing the ancestor path from the leaf of the appended subgraph to determine for each node whether the first instance count equals the second instance count and
 (a) if the first instance count equals the second instance count, deleting the subgraph of that node,
 (b) if the first instance count does not equal the second instance count, terminating the traversal.

* * * * *